US009455280B2

(12) United States Patent
Yamazaki et al.

(10) Patent No.: US 9,455,280 B2
(45) Date of Patent: Sep. 27, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hiroyuki Miyake, Kanagawa (JP); Hideaki Shishido, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 23 days.

(21) Appl. No.: 14/023,295

(22) Filed: Sep. 10, 2013

(65) Prior Publication Data
US 2014/0070209 A1 Mar. 13, 2014

(30) Foreign Application Priority Data

Sep. 13, 2012 (JP) ................................ 2012-202125
Mar. 15, 2013 (JP) ................................ 2013-053988

(51) Int. Cl.
*H01L 29/12* (2006.01)
*H01L 27/12* (2006.01)

(52) U.S. Cl.
CPC ....... *H01L 27/1255* (2013.01); *H01L 27/1225* (2013.01)

(58) Field of Classification Search
CPC ........... H01L 29/7869; H01L 27/1225; H01L 27/1255; H01L 21/02565
USPC ............................................. 257/43, 59, 72
See application file for complete search history.

(56) References Cited

U.S. PATENT DOCUMENTS 5,299,041 A 3/1994 Morin et al.
5,724,107 A 3/1998 Nishikawa et al.
(Continued)

FOREIGN PATENT DOCUMENTS

CN 101897031 A 11/2010
CN 101997007 A 3/2011
(Continued)

OTHER PUBLICATIONS

International Search Report (PCT Patent Application No. PCT/JP2013/074167) dated Oct. 8, 2013, 4 pages.
(Continued)

*Primary Examiner* — Thien F Tran
(74) *Attorney, Agent, or Firm* — Fish & Richardson P.C.

(57) ABSTRACT

A semiconductor device including a capacitor whose charge capacity is increased while improving the aperture ratio is provided. Further, a semiconductor device which consumes less power is provided. A transistor which includes a light-transmitting semiconductor film, a capacitor in which a dielectric film is provided between a pair of electrodes, an insulating film which is provided over the light-transmitting semiconductor film, and a first light-transmitting conductive film which is provided over the insulating film are included. The capacitor includes the first light-transmitting conductive film which serves as one electrode, the insulating film which functions as a dielectric, and a second light-transmitting conductive film which faces the first light-transmitting conductive film with the insulating film positioned therebetween and functions as the other electrode. The second light-transmitting conductive film is formed over the same surface as the light-transmitting semiconductor film of the transistor and is a metal oxide film containing a dopant.

24 Claims, 37 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,421,101 B1 | 7/2002 | Zhang et al. |
| 6,545,305 B1 | 4/2003 | Randazzo |
| 6,559,477 B2 | 5/2003 | Tada et al. |
| 6,563,174 B2 | 5/2003 | Kawasaki et al. |
| 6,727,522 B1 | 4/2004 | Kawasaki et al. |
| 6,784,949 B1 | 8/2004 | Nagata et al. |
| 6,955,953 B2 | 10/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,847,904 B2 | 12/2010 | Kimura |
| 7,872,261 B2 | 1/2011 | Ikeda |
| 8,039,842 B2 | 10/2011 | Jinbo |
| 8,102,476 B2 | 1/2012 | Son et al. |
| 8,368,066 B2 | 2/2013 | Yamazaki et al. |
| 8,384,077 B2 | 2/2013 | Yano |
| 8,441,011 B2 | 5/2013 | Yamazaki et al. |
| 8,481,373 B2 | 7/2013 | Okabe |
| 8,537,318 B2 | 9/2013 | Kimura |
| 8,610,862 B2 | 12/2013 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189210 A1 | 10/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0169991 A1 | 9/2004 | Nagata et al. |
| 2004/0183978 A1 | 9/2004 | Jeoung |
| 2004/0246424 A1 | 12/2004 | Sawasaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091399 A1 | 5/2006 | Lee |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1* | 6/2009 | Son et al. .............. 349/39 |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0242888 A1 | 10/2009 | Hosoya |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0289256 A1 | 11/2009 | Jinbo |
| 2010/0044711 A1 | 2/2010 | Imai |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2010/0289020 A1 | 11/2010 | Yano |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0032435 A1 | 2/2011 | Kimura |
| 2011/0037068 A1 | 2/2011 | Yamazaki et al. |
| 2011/0084271 A1 | 4/2011 | Yamazaki et al. |
| 2011/0284848 A1 | 11/2011 | Yamazaki |
| 2011/0297930 A1 | 12/2011 | Choi et al. |
| 2012/0062811 A1 | 3/2012 | Miyake |
| 2012/0108018 A1 | 5/2012 | Okabe |
| 2012/0161820 A1 | 6/2012 | Koo et al. |
| 2012/0211745 A1 | 8/2012 | Ueda et al. |
| 2012/0273780 A1 | 11/2012 | Yamazaki et al. |
| 2012/0280230 A1 | 11/2012 | Akimoto et al. |
| 2013/0134424 A1 | 5/2013 | Kim et al. |
| 2013/0146452 A1 | 6/2013 | Yano |
| 2013/0328044 A1 | 12/2013 | Yamazaki et al. |
| 2014/0014948 A1 | 1/2014 | Matsukura |

(56) References Cited

U.S. PATENT DOCUMENTS

| | | |
|---|---|---|
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2014/0061636 A1 | 3/2014 | Miyake et al. |
| 2014/0061654 A1 | 3/2014 | Yamazaki et al. |
| 2014/0098334 A1 | 4/2014 | Kimura |

FOREIGN PATENT DOCUMENTS

| | | |
|---|---|---|
| CN | 102473362 A | 5/2012 |
| CN | 102906804 A | 1/2013 |
| EP | 1 037 095 A2 | 9/2000 |
| EP | 1737044 A | 12/2006 |
| EP | 1843194 A | 10/2007 |
| EP | 2 192 441 A2 | 6/2010 |
| EP | 2226847 A | 9/2010 |
| EP | 2 458 577 A1 | 5/2012 |
| EP | 2 579 237 A1 | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-129234 A | 5/1989 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-323698 A | 11/2000 |
| JP | 2001-051300 A | 2/2001 |
| JP | 2002-050761 A | 2/2002 |
| JP | 2002-076356 A | 3/2002 |
| JP | 2002-289859 A | 10/2002 |
| JP | 2002-359252 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2007-298976 A | 11/2007 |
| JP | 2008-009425 A | 1/2008 |
| JP | 2010-004027 A | 1/2010 |
| JP | 2010-171394 A | 8/2010 |
| JP | 2010-243741 A | 10/2010 |
| JP | 2011-054949 A | 3/2011 |
| JP | 2012-018970 A | 1/2012 |
| JP | 2012-083738 A | 4/2012 |
| JP | 5074625 B2 | 11/2012 |
| JP | 5133468 B2 | 1/2013 |
| KR | 2004-0012208 A | 2/2004 |
| KR | 2010-0094509 A | 8/2010 |
| KR | 2012-0136426 A | 12/2012 |
| TW | 200937638 A | 9/2009 |
| WO | WO-01/33292 | 5/2001 |
| WO | WO-2004/114391 | 12/2004 |
| WO | 2009/075281 A1 | 6/2009 |
| WO | 2011/010415 A1 | 1/2011 |
| WO | 2011/148537 A1 | 12/2011 |

OTHER PUBLICATIONS

Written Opinion (PCT Patent Application No. PCT/JP2013/074167) dated Oct. 8, 2013, 5 pages.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 29, pp. 181-184.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2: Al and Sn-Doped Zinc Indium Oxide Thin Film Transistors for Amoled Back Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion: "The Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9: Numerical Analysis on Temperature Dependence of Characteristics of Amorphous In-Ga-Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crysalline Solids), 1996, vol. 198-200, pp. 165-169.

Hosono.H, "68.3: Invited Paper: Transparent Amorphous Oxide Semiconductors for High Performance TFT", SID Digest '07: SID International Symposium Digest of Technical Papers, 2007, vol. 38, pp. 1830-1833.

Hsieh.H et al., "P-29: Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Jin.D et al., "65.2: Distinguished Paper: World-Largest (6.5") Flexible Full Color Top Emission Amoled Display on Plastic Film and Its Bending Properties", SID Digest '09: SID International Symposium Digest of Technical Papers, May 31, 2009, pp. 983-985.

(56) References Cited

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1: Invited Paper: Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2: Invited Paper: Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N.et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4: Excellent Performance of Indium—Oxide—Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09: SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4): a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09: SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2013/070677) Dated Sep. 17, 2013.

Written Opinion (Application No. PCT/JP2013/070677) Dated Sep. 17, 2013.

Allowed Claims (U.S. Appl. No. 13/957,819) Submitted Sep. 8, 2015.

Allowed Claims (U.S. Appl. No. 14/011,899) Submitted Jul. 30, 2015.

* cited by examiner

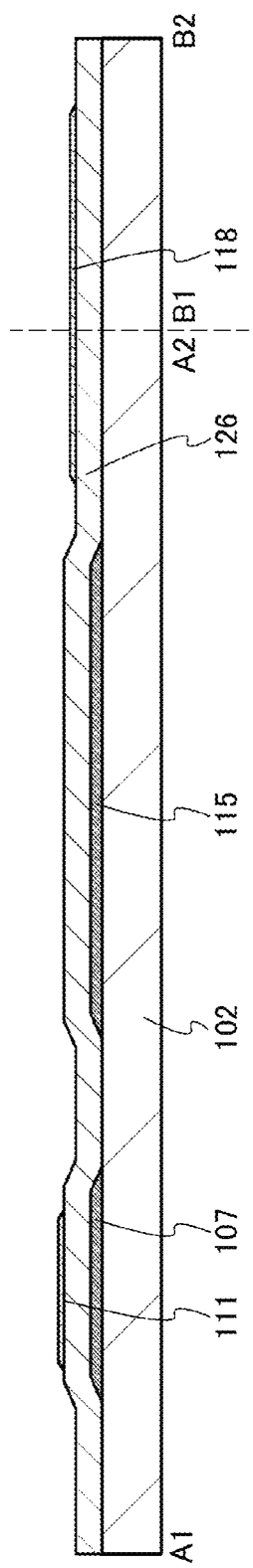
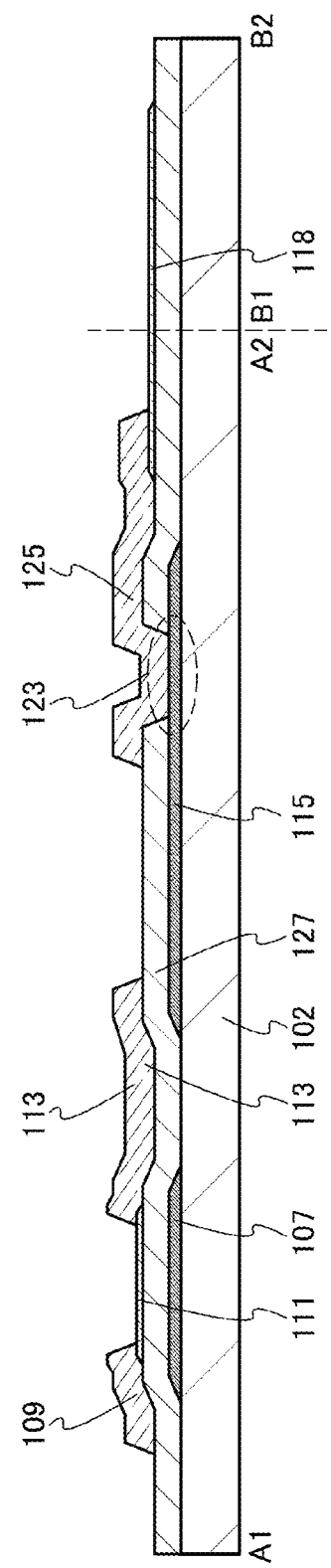
FIG. 6A
FIG. 6B

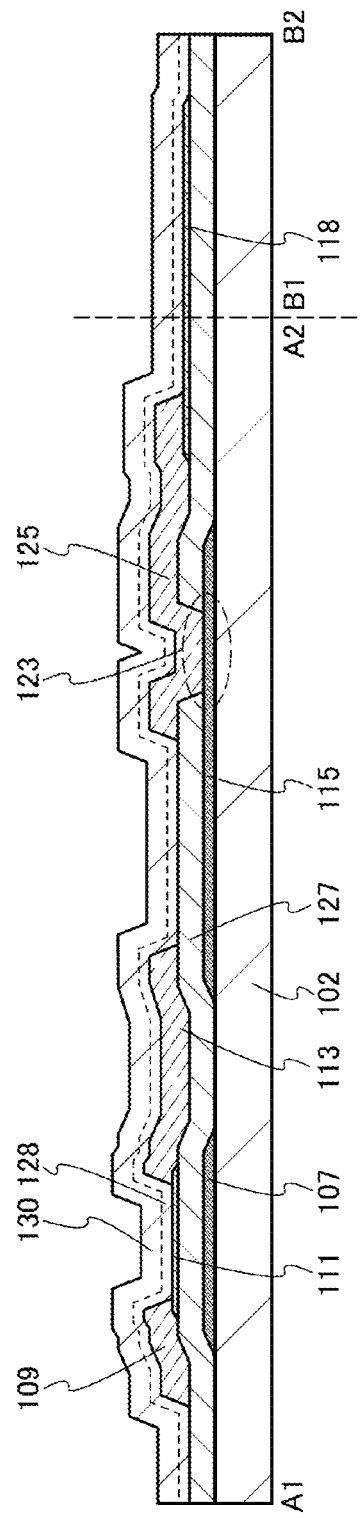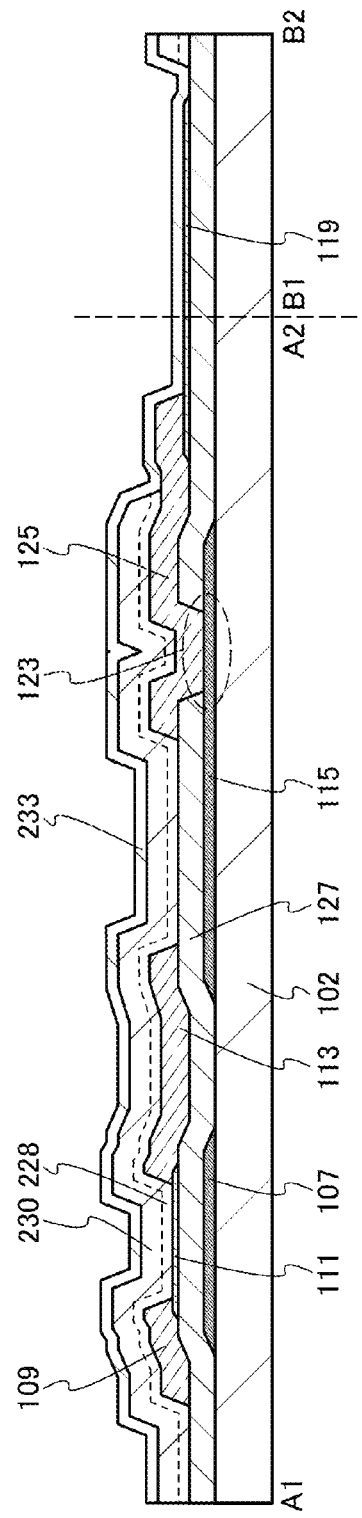

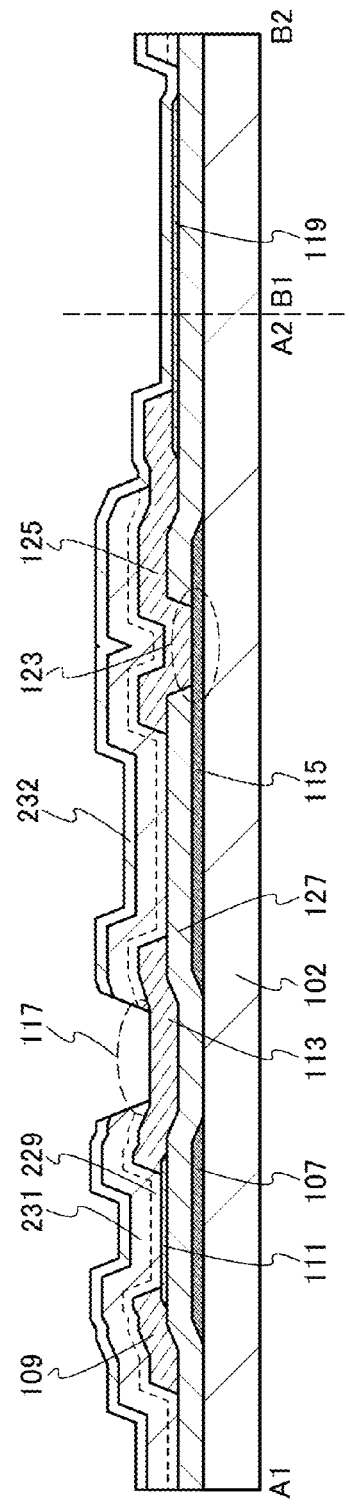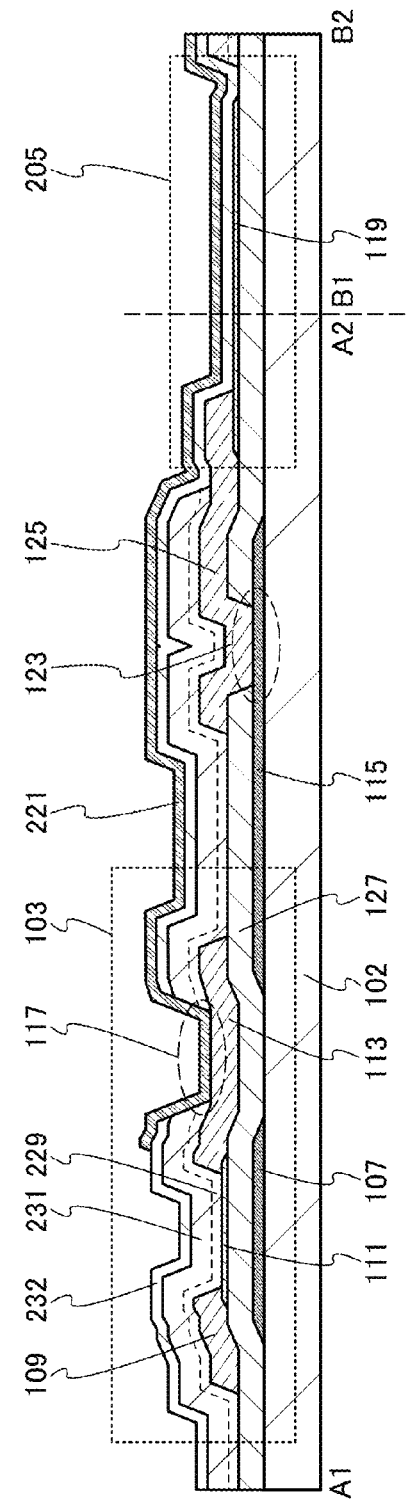

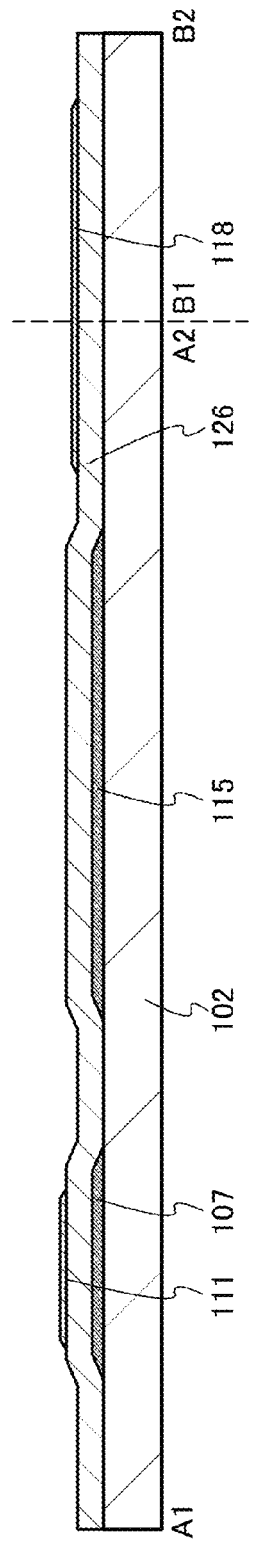
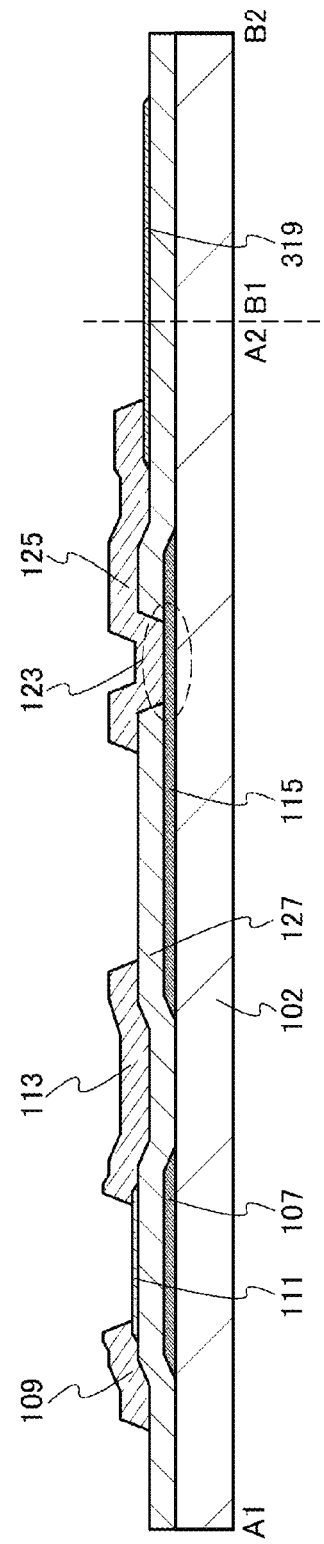
FIG. 16A
FIG. 16B

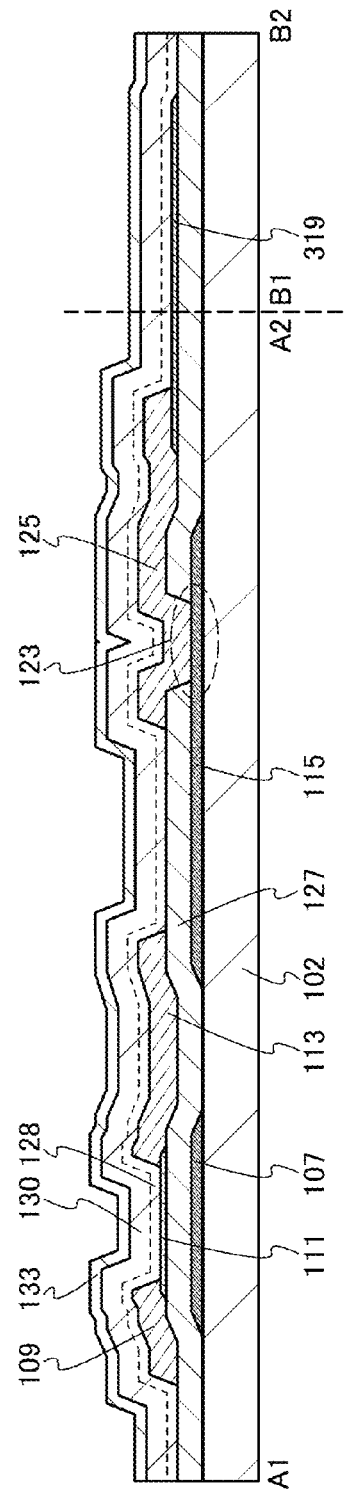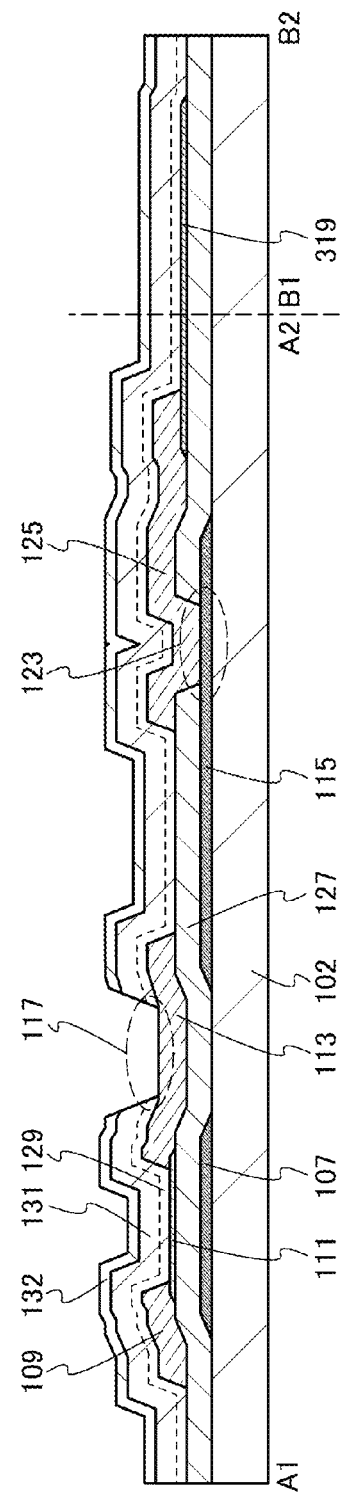

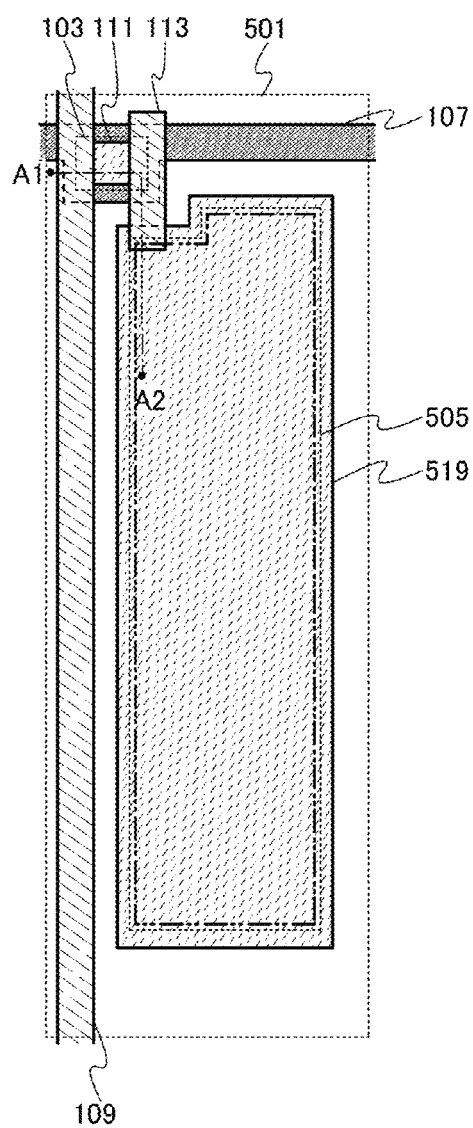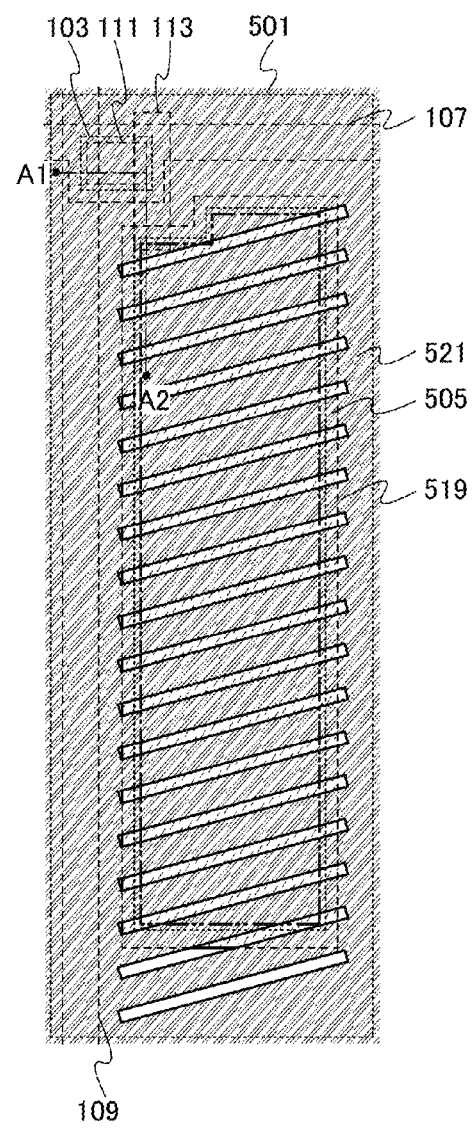

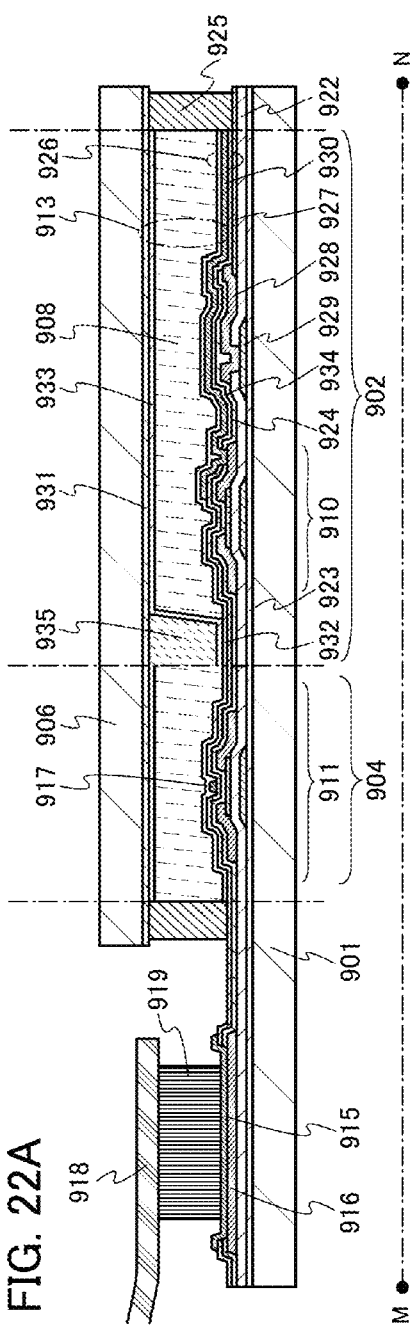
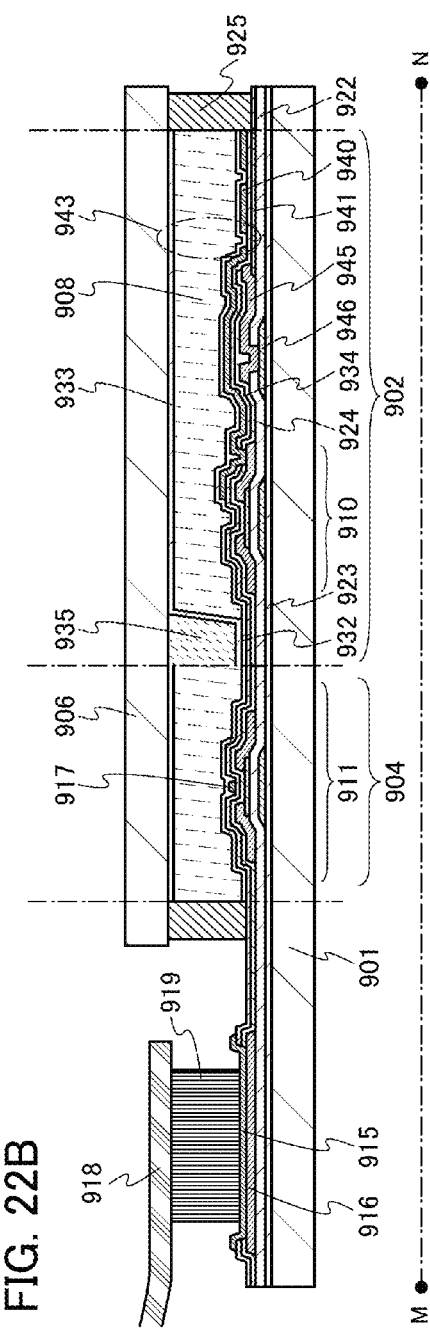
FIG. 22A
FIG. 22B

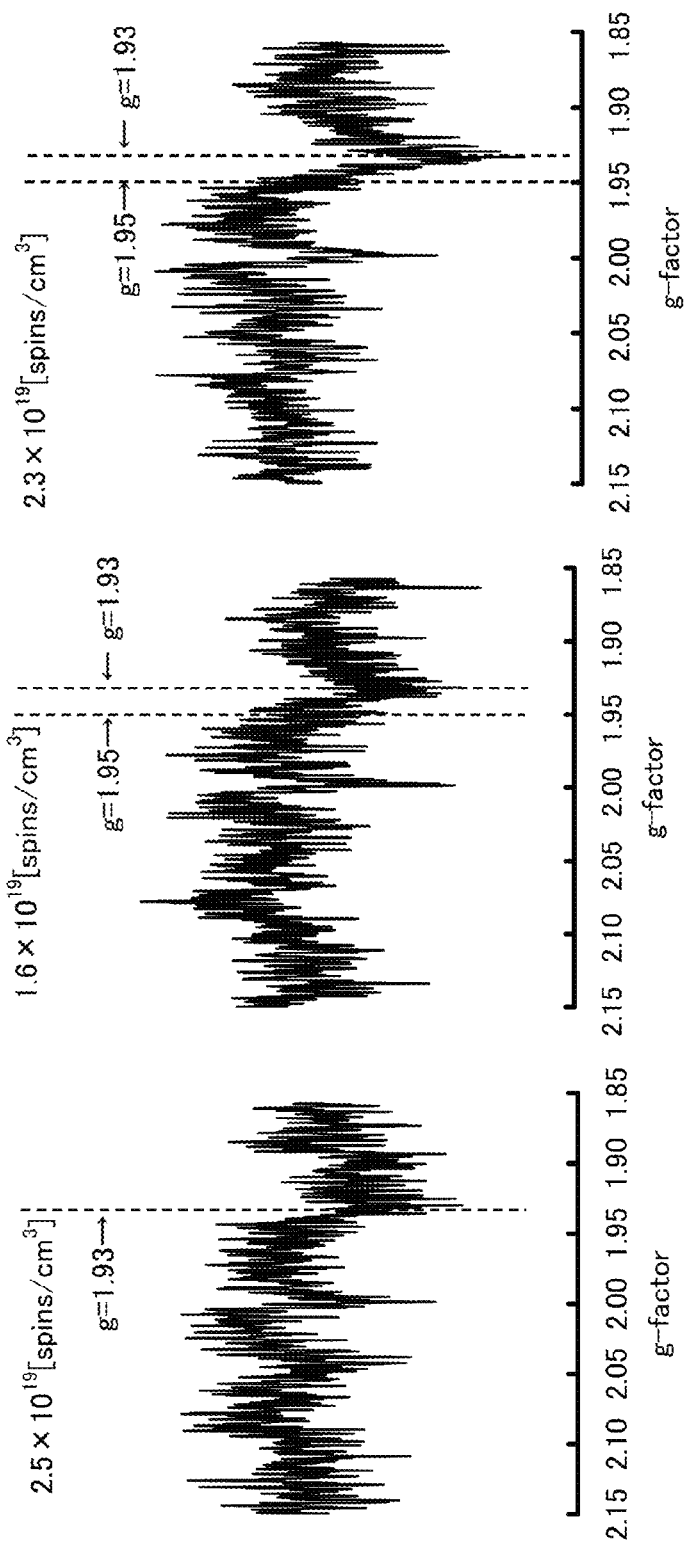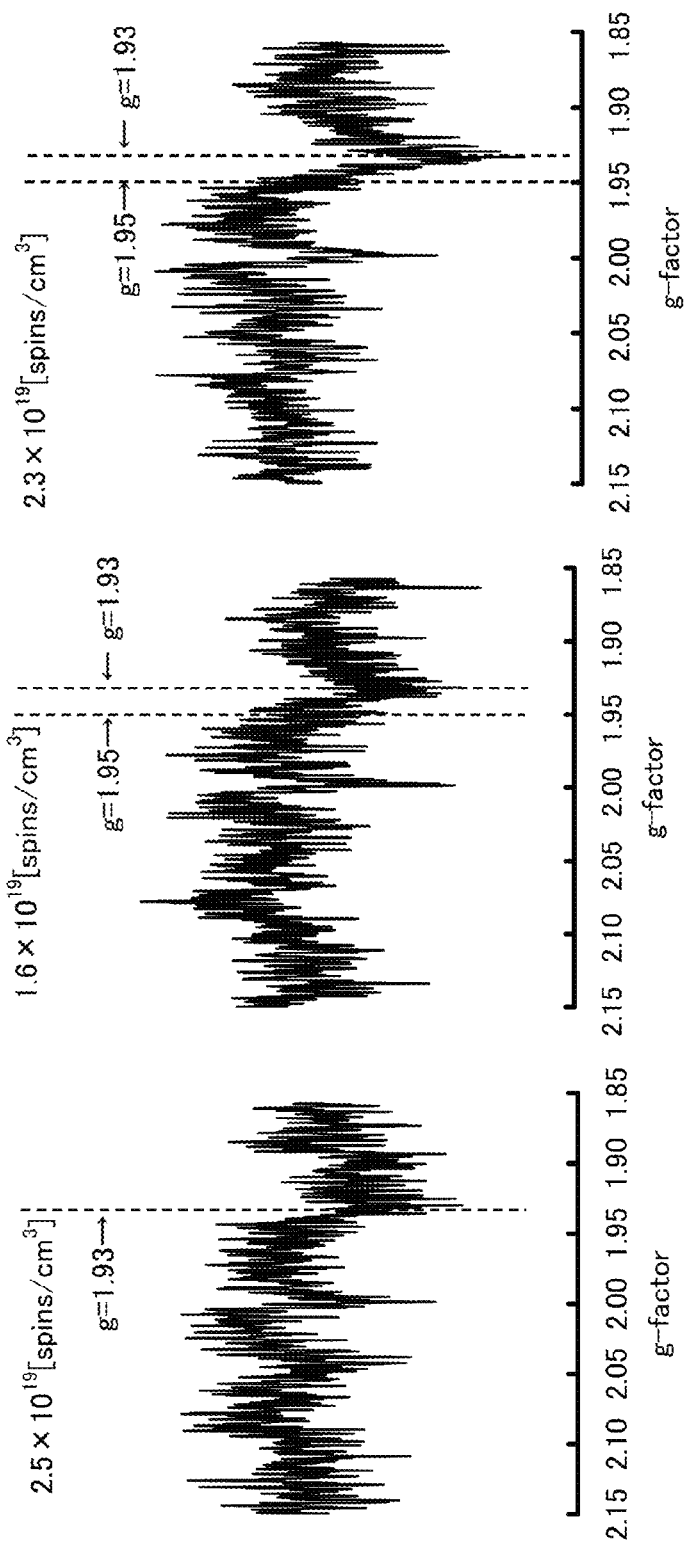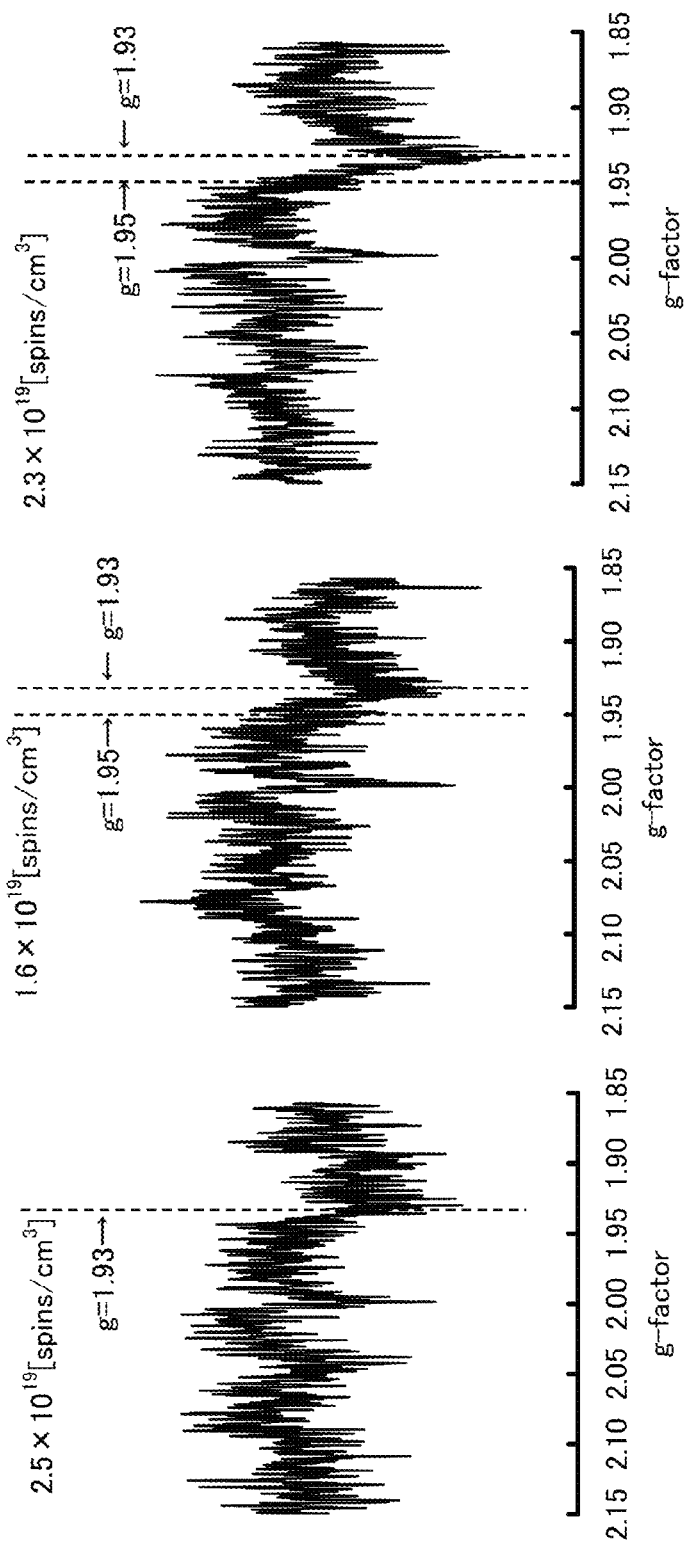

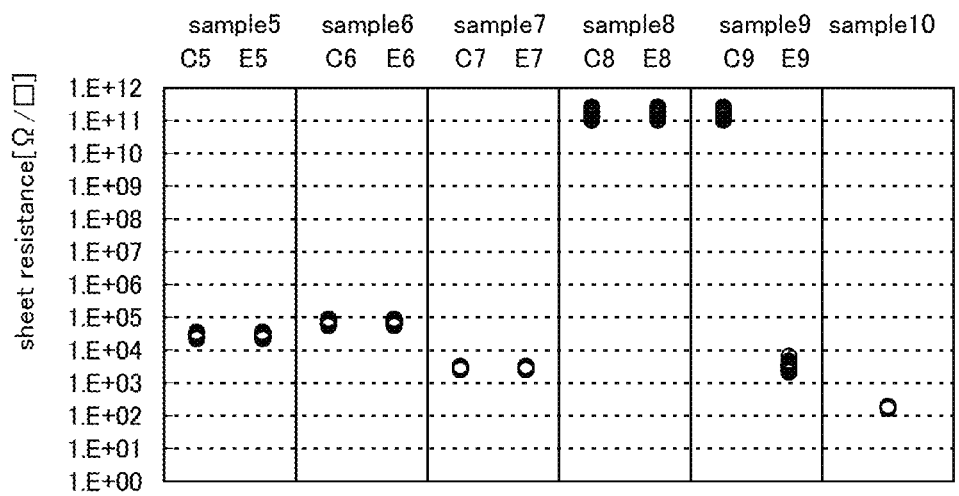

sample 5, sample 6 FIG. 36A
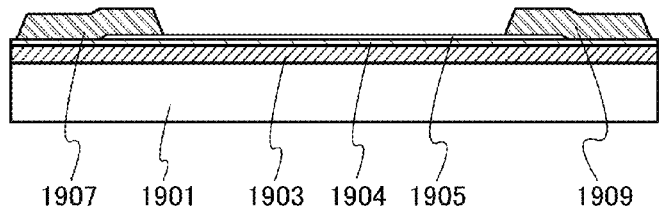
FIG. 36B
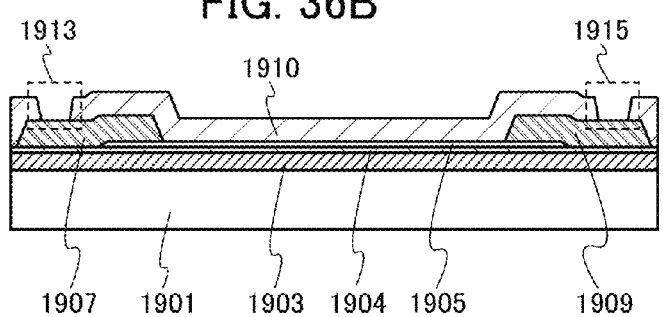
FIG. 36C
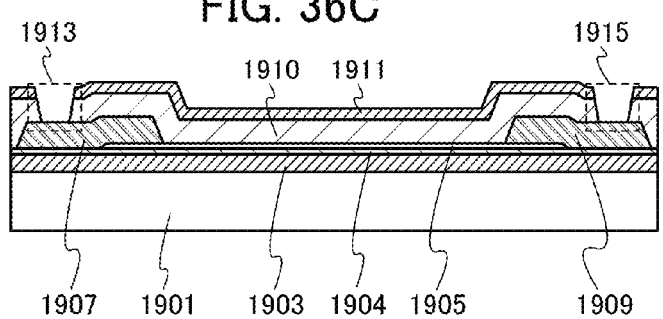
FIG. 36D
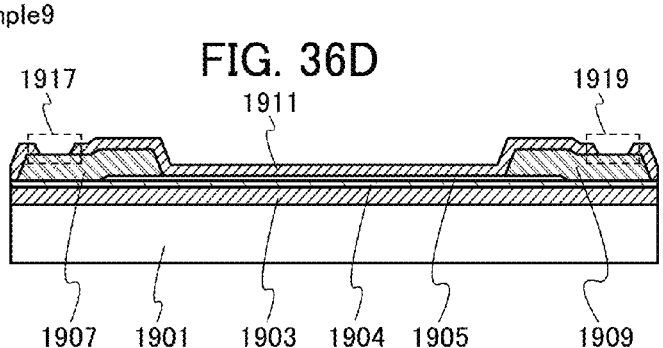

SEMICONDUCTOR DEVICE

TECHNICAL FIELD

The invention disclosed in this specification and the like relates to semiconductor devices.

BACKGROUND ART

In recent years, flat panel displays such as liquid crystal displays (LCDs) are becoming widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material of a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors using zinc oxide or an In—Ga—Zn-based oxide semiconductor are disclosed (see Patent Documents 1 and 2).

A display device which includes a capacitor in which an oxide semiconductor film provided over the same surface as an oxide semiconductor film of a transistor and a pixel electrode connected to the transistor are provided to be separated from each other with a given interval in order to increase the aperture ratio is disclosed (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] U.S. Pat. No. 8,102,476.

DISCLOSURE OF INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

However, in the case where one electrode of the capacitor is formed using a semiconductor film, the value of capacitance charged in the capacitor can be lower than a predetermined value depending on a potential which is applied to the semiconductor film, so that a period during which alignment of liquid crystal molecules of a liquid crystal element is kept continuously is shortened. As a result, the number of times of rewriting image data is increased, so that power consumption is increased.

One of methods for increasing the charge capacity of a capacitor is to increase the area occupied by the capacitor, specifically, to increase the area of a portion where two electrodes of the capacitor overlap with each other. However, when the area of a light-blocking conductive film is increased to increase the area of a portion where the two electrode overlap with each other, the aperture ratio of a pixel is lowered and thus display quality of an image is degraded.

In view of the above problems, an object of one embodiment of the present invention is to provide a semiconductor device including a capacitor whose charge capacity is increased while improving the aperture ratio. Further, an object of one embodiment of the present invention is to provide a semiconductor device which consumes less power.

One embodiment of the present invention includes a transistor which includes a light-transmitting semiconductor film, a capacitor in which a dielectric film is provided between a pair of electrodes, an insulating film which is provided over the light-transmitting semiconductor film, and a first light-transmitting conductive film which is provided over the insulating film. The capacitor includes the first light-transmitting conductive film which serves as one electrode, the insulating film which functions as a dielectric, and a second light-transmitting conductive film which faces the first light-transmitting conductive film with the insulating film positioned therebetween and functions as the other electrode. The second light-transmitting conductive film is formed over the same surface as the light-transmitting semiconductor film of the transistor and is a metal oxide film containing a dopant.

Further, the light-transmitting semiconductor film included in the transistor can be formed using an oxide semiconductor. This is because an oxide semiconductor has an energy gap as wide as 3.0 eV or more and high visible-light transmittance. Note that a metal oxide exhibiting semiconductor characteristics, such as the light-transmitting semiconductor film included in the transistor, is referred to as an oxide semiconductor in this specification. Further, the second light-transmitting conductive film included in the capacitor exhibits conductive characteristics and thus is referred to as a metal oxide.

A semiconductor film which is formed in a step of forming the semiconductor film in the transistor is used as the second light-transmitting conductive film functioning as the other electrode of the capacitor, and a dopant is added to the semiconductor film to increase the conductivity of the semiconductor film, whereby the semiconductor film can be a metal oxide film having electrical characteristics of a conductor. For example, one or more kinds of dopants selected from hydrogen, boron, nitrogen, fluorine, aluminum, phosphorus, arsenic, indium, tin, antimony, and rare gas elements can be added to the semiconductor film by an ion implantation method, an ion doping method, or the like. Alternatively, it is possible to add the dopant(s) by exposing the semiconductor film to plasma containing the element(s). In that case, the conductivity of the second light-transmitting conductive film serving as the other electrode of the capacitor is greater than or equal to 10 S/cm and less than or equal to 1000 S/cm, preferably greater than or equal to 100 S/cm and less than or equal to 1000 S/cm.

In the capacitor, the insulating film provided over the light-transmitting semiconductor film included in the transistor is used as the dielectric film; therefore, the dielectric film can have the same stacked-layer structure as the insulating film. For example, in the case where the insulating film provided over the semiconductor film included in the transistor has a stacked-layer structure of an oxide insulating film and a nitride insulating film, the dielectric film of the capacitor can have a stacked-layer structure of the oxide insulating film and the nitride insulating film.

In the case where in the capacitor, the insulating film provided over the semiconductor film included in the transistor is an oxide insulating film and a nitride insulating film, only a portion of the oxide insulating film in a region where the capacitor is to be formed is removed after the oxide insulating film is formed, whereby the dielectric film of the capacitor can have a single-layer structure of the nitride insulating film. In other words, the nitride insulating film is in contact with the second light-transmitting conductive film functioning as the other electrode of the capacitor. The second light-transmitting conductive film is formed using the semiconductor film which is formed at the same time as formation of the light-transmitting semiconductor film included in the transistor, and the semiconductor film is in contact with the nitride insulating film, whereby a defect state (interface state) is formed at an interface between the nitride insulating film and the semiconductor film. Further or alternatively, when the nitride insulating film is formed by a plasma CVD method or a sputtering method, the semiconductor film is exposed to plasma and oxygen vacancies are generated. Furthermore, nitrogen and/or hydrogen contained in the nitride insulating film are/is transferred to the semiconductor film. Due to entry of hydrogen contained in the nitride insulating film into the defect state or an oxygen vacancy, an electron serving as a carrier is generated. Accordingly, the semiconductor film becomes an n-type semiconductor film with increased conductivity; thus, a film having conductivity is obtained. That is, a metal oxide film having characteristics of a conductor can be formed. Further, the thickness of the dielectric film can be reduced; therefore, an increase in the charge capacity of the capacitor can be achieved.

When the nitride insulating film is in contact with the semiconductor film in the capacitor as described above, a step of adding a dopant which increases the conductivity to the semiconductor film by an ion implantation method, an ion doping method, or the like can be skipped; therefore, the yield of the semiconductor device can be increased and the manufacturing cost thereof can be reduced.

In the case where the semiconductor film included in the transistor is an oxide semiconductor film and the insulating film over the semiconductor film has a stacked-layer structure of an oxide insulating film and a nitride insulating film, the oxide insulating film is preferably not likely to transmit nitrogen, that is, the oxide insulating film preferably has a barrier property against nitrogen.

With the above structure, one of or both nitrogen and hydrogen can be prevented from diffusing into the oxide semiconductor film as the semiconductor film included in the transistor, so that variations in the electrical characteristics of the transistor can be suppressed.

In the case where the first light-transmitting conductive film is connected to the transistor, the first light-transmitting conductive film serves as a pixel electrode.

In the case where the first light-transmitting conductive film serves as a pixel electrode, a capacitor line extends in the direction parallel to a scan line, on the same surface as the scan line. The other electrode (the second light-transmitting conductive film) of the capacitor is electrically connected to the capacitor line through a conductive film formed at the same time as formation of source and drain electrodes of the transistor.

The capacitor line does not necessarily extend in the direction parallel to a scan line, on the same surface as the scan line. The capacitor line may extend in the direction parallel to a signal line including the source electrode or the drain electrode of the transistor, on the same surface as the signal line, and may be electrically connected to the other electrode (second light-transmitting conductive film) of the capacitor.

The capacitor line may be formed using the second light-transmitting conductive film included in the capacitor.

The capacitor line may be connected to each of capacitors included in a plurality of adjacent pixels. In this case, the capacitor line may be provided between the adjacent pixels.

The second light-transmitting conductive film may be connected to the transistor. In this case, the second light-transmitting conductive film functions as a pixel electrode, and the first light-transmitting conductive film functions as a common electrode and the capacitor line.

With the above structure, the capacitor has a light-transmitting property and thus can be formed large (covers a large area) in a pixel region except a portion where the transistor is not formed. For this reason, the semiconductor device can have charge capacity increased while improving the aperture ratio. Accordingly, the semiconductor device can have excellent display quality.

The light-transmitting capacitor can be formed using a formation process of the transistor. One electrode of the capacitor can be formed utilizing the step of forming the light-transmitting conductive film functioning as a pixel electrode or a common electrode. The other electrode of the capacitor can be formed utilizing the step of forming the semiconductor film included in the transistor. Thus, the semiconductor film included in the transistor and the other electrode of the capacitor contain the same metal elements. The dielectric film of the capacitor can be formed utilizing the step of forming the insulating film provided over the semiconductor film included in the transistor.

A method for forming a semiconductor device of one embodiment of the present invention is one embodiment of the present invention.

According to one embodiment of the present invention, a semiconductor device including a capacitor whose charge capacity is increased while improving the aperture ratio can be provided. A semiconductor device with low power consumption can be provided.

BRIEF DESCRIPTION OF DRAWINGS

FIGS. 6A and 6B are cross-sectional views illustrating a method for manufacturing a semiconductor device that is one embodiment of the present invention.

FIGS. 7A and 7B are cross-sectional views illustrating a method for manufacturing a semiconductor device that is one embodiment of the present invention.

FIGS. 8A and 8B are cross-sectional views illustrating a method for manufacturing a semiconductor device that is one embodiment of the present invention.

FIGS. 16A and 16B are cross-sectional views illustrating a method for manufacturing a semiconductor device that is one embodiment of the present invention.

FIGS. 17A and 17B are cross-sectional views illustrating a method for manufacturing a semiconductor device that is one embodiment of the present invention.

FIGS. 18A and 18B are top views illustrating a semiconductor device that is one embodiment of the present invention.

FIGS. 22A and 22B are each a cross-sectional view illustrating a semiconductor device that is one embodiment of the present invention.

FIGS. 29A to 29 C are graphs showing results of ESR measurement.

FIG. 35A shows methods for forming samples and FIG. 35B shows sheet resistances of the samples.

FIGS. 36A to 36D illustrate formation processes of samples and the structures of the samples.

BEST MODE FOR CARRYING OUT THE INVENTION

Figure 1A:
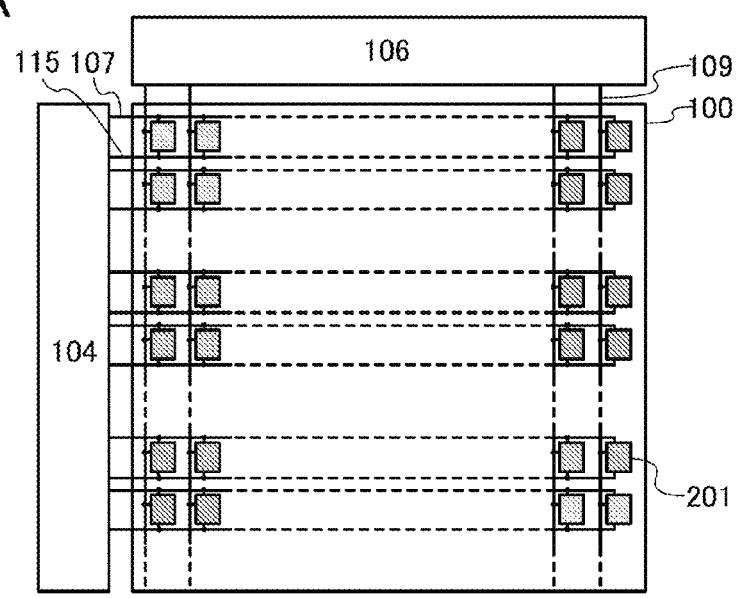
FIG. 1A illustrates a semiconductor device that is one embodiment of the present invention and FIG. 1B is a circuit diagram illustrating a pixel.

Hereinafter, embodiments and examples of the present invention will be described in detail with reference to the accompanying drawings. However, the present invention is not limited to the description below, and it is easily understood by those skilled in the art that modes and details disclosed herein can be modified in various ways. In addition, the present invention is not construed as being limited to the following descriptions of the embodiments and examples.

Note that in structures of the present invention described below, the same portions or portions having similar functions are denoted by common reference numerals in different drawings, and descriptions thereof are not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, the embodiments and example of the present invention are not limited to such scales in the drawings.

Note that the ordinal numbers such as "first" and "second" in this specification are used for convenience and do not denote the order of steps or the stacking order of layers. In addition, the ordinal numbers in this specification do not denote particular names which specify the present invention.

Functions of a "source" and a "drain" in the present invention are sometimes replaced with each other when the direction of current flow is changed in circuit operation, for example. Therefore, the terms "source" and "drain" can be interchanged with each other in this specification.

Note that a voltage refers to a difference between potentials of two points, and a potential refers to electrostatic energy (electric potential energy) of unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where etching treatment is performed after photolithography process, a mask formed in the photolithography process is removed after the etching treatment.

Embodiment 1

In this embodiment, a semiconductor device of one embodiment of the present invention will be described with reference to drawings. Note that in this embodiment, a semiconductor device that is one embodiment of the present invention will be described taking a liquid crystal display device as an example.

<Structure of Semiconductor Device>

FIG. 1A illustrates an example of a semiconductor device. The semiconductor device in FIG. 1A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 201 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109.

Each scan line 107 is electrically connected to the n pixels 201 in the corresponding row among the pixels 201 arranged in m rows and n columns in the pixel portion 100. Each signal line 109 is electrically connected to the m pixels 201 in the corresponding column among the pixels 201 arranged in m rows and n columns. Note that m and n are each an integer of 1 or more. Each capacitor line 115 is electrically connected to the n pixels 201 in the corresponding row among the pixels 201 arranged in m rows and n columns. Note that in the case where the capacitor lines 115 are arranged in parallel or substantially in parallel along the signal lines 109, each capacitor line 115 is electrically connected to the m pixels 201 in the corresponding column among the pixels 201 arranged in m rows and n columns.

Figure 1B:
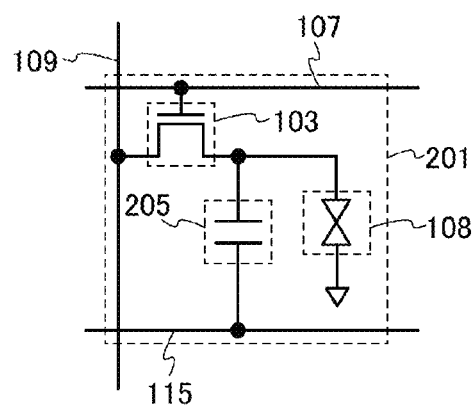

FIG. 1B is an example of a circuit diagram of the pixel 201 included in the semiconductor device illustrated in FIG. 1A. The pixel 201 in FIG. 1B includes a transistor 103 which is electrically connected to the scan line 107 and the signal line 109, a capacitor 205 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 205, and an electrode (counter electrode) facing the pixel electrode is electrically connected to a wiring which supplies a counter potential.

The liquid crystal element 108 is an element which controls transmission of light by an optical modulation action of liquid crystal which is sandwiched between a substrate provided with the transistor 103 and the pixel electrode and a substrate provided with the counter electrode. The optical modulation action of liquid crystal is controlled by an electric field applied to the liquid crystal (including a vertical electric field and a diagonal electric field). Note that in the case where a counter electrode (also referred to as a common electrode) is provided over the substrate where the pixel electrode is provided, an electric field applied to liquid crystal is a transverse electric field.

Figure 2:
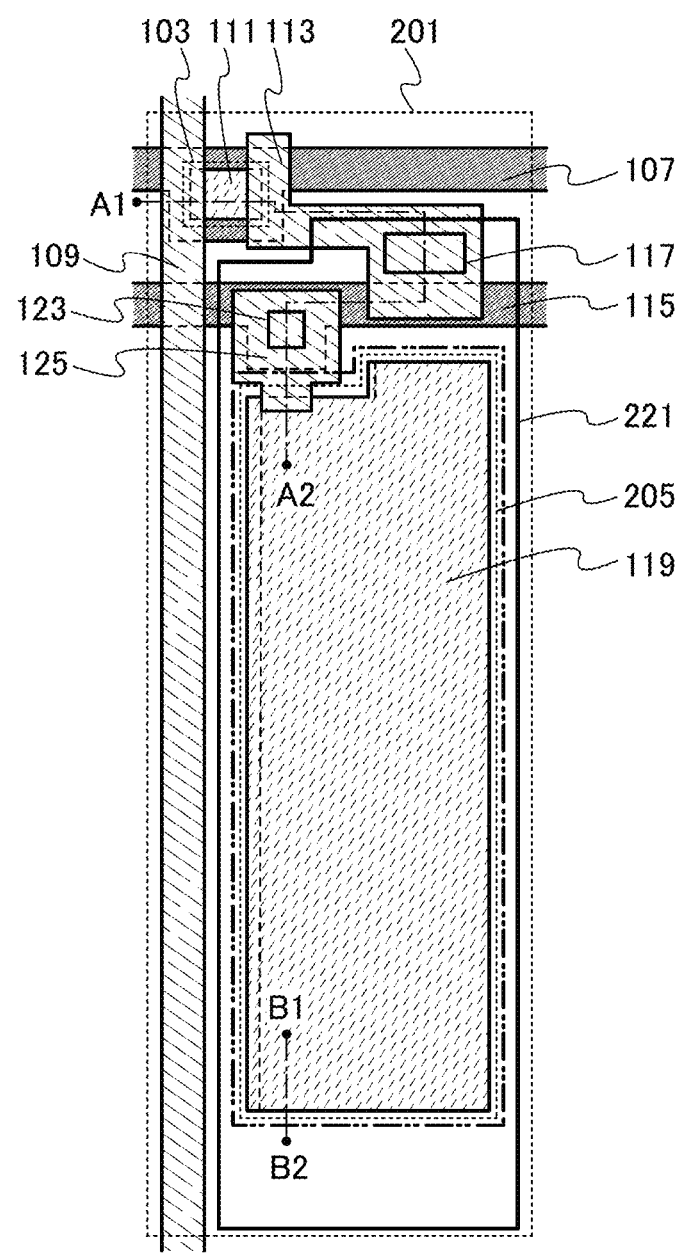
FIG. 2 is a top view illustrating a semiconductor device that is one embodiment of the present invention.

Next, a specific example of the pixel 201 of the liquid crystal display device is described. FIG. 2 is a top view of the pixel 201. Note that in FIG. 2, the counter electrode and the liquid crystal element are omitted.

In FIG. 2, the scan line 107 is provided so as to extend in the direction perpendicular or substantially perpendicular to the signal line 109 (in the horizontal direction in the drawing). The signal line 109 is provided so as to extend in the direction perpendicular or substantially perpendicular to the scan line 107 (in the vertical direction in the drawing). The capacitor line 115 is provided so as to extend in the direction parallel with the scan line 107. The scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes at least a semiconductor film 111 including a channel formation region, a gate electrode, a gate insulating film (not illustrated in FIG. 2), a source electrode, and a drain electrode. A portion of the scan line 107 which overlaps with the semiconductor film 111 functions as the gate electrode of the transistor 103. A portion of the signal line 109 which overlaps with the semiconductor film 111 functions as the source electrode of the transistor 103. A portion of a conductive film 113 which overlaps with the semiconductor film 111 functions as the drain electrode of the transistor 103. Thus, the gate electrode, the source electrode, and the drain electrode may be referred to as the scan line 107, the signal line 109, and the conductive film 113, respectively. Further, in FIG. 2, an edge of the scan line 107 is on the outer side of an edge of the semiconductor film when seen from above. Thus, the scan line 107 functions as a light-blocking film for blocking light from a light source such as a backlight. For this reason, the semiconductor film 111 included in the transistor is not irradiated with light, so that variations in the electrical characteristics of the transistor can be reduced.

Further, an oxide semiconductor processed under appropriate conditions can significantly reduce the off-state current of a transistor; therefore, such an oxide semiconductor is used for the semiconductor film 111 in one embodiment of the present invention. Thus, power consumption of a semiconductor device can be reduced.

The conductive film 113 is electrically connected to a pixel electrode 221 formed using a light-transmitting conductive film, through an opening 117. In FIG. 2, the hatch pattern of the pixel electrode 221 is not shown.

The capacitor 205 is provided in a region of the pixel 201 and located in a region surrounded by capacitor lines 115 and signal lines 109. The capacitor 205 is electrically connected to the capacitor line 115 through a conductive film 125 provided in and over an opening 123. The capacitor 205 includes a light-transmitting conductive film 119, the light-transmitting pixel electrode 221, and a light-transmitting insulating film (not illustrated in FIG. 2) which is formed as a dielectric film over the transistor 103. In short, the capacitor 205 transmits light.

Thanks to the light-transmitting property of the capacitor 205, the capacitor 205 can be formed large (covers a large area) in the pixel 201. Thus, a semiconductor device having charge capacity increased while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 205 of this embodiment has a light-transmitting property, when it is provided in a pixel, enough charge capacity can be obtained in the pixel and the aperture ratio can be improved. Typically, the capacitor 205 can be favorably used in a high-resolution semiconductor device with a pixel density of 200 ppi or more, or furthermore, 300 ppi or more. Further, according to one embodiment of the present invention, the aperture ratio can be improved even in a display device with a high resolution, which makes it possible to use light from a light source such as a backlight efficiently, so that power consumption of the display device can be reduced.

Here, the characteristics of a transistor including an oxide semiconductor are described. The transistor including an oxide semiconductor is an n-channel transistor. Further, carriers might be generated due to oxygen vacancies in the oxide semiconductor, which might degrade the electrical characteristics and reliability of the transistor. For example, in some cases, the threshold voltage of the transistor is shifted in the negative direction, and drain current flows when the gate voltage is 0 V. A transistor in which drain current flows when the gate voltage is 0 V are referred to as a normally-on transistor, and a transistor having such characteristics is referred to as a depletion-type transistor. The characteristics of a transistor in which substantially no drain current flows when the gate voltage is 0 V are referred to as normally-off characteristics, and a transistor having such characteristics is referred to as an enhancement-type transistor.

In view of the above, it is preferable that defects in an oxide semiconductor film as the semiconductor film 111, typically, oxygen vacancies be reduced as much as possible when an oxide semiconductor is used for the semiconductor film 111. For example, it is preferable that the spin density of the oxide semiconductor film (the density of defects in the oxide semiconductor film) at a g-value of 1.93 in electron spin resonance spectroscopy in which a magnetic field is applied in parallel with the film surface be reduced to lower than or equal to the lower detection limit of measurement equipment. When the defects typified by oxygen vacancies in the oxide semiconductor film are reduced as much as possible, the transistor 103 can be prevented from being normally on, leading to improvements in the electrical characteristics and reliability of a semiconductor device. Further, power consumption of the semiconductor device can be reduced.

The shift of the threshold voltage of a transistor in the negative direction is caused by hydrogen (including a hydrogen compound such as water) contained in an oxide semiconductor in some cases as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, the reaction of part of hydrogen and oxygen causes generation of electrons serving as carriers. Thus, a transistor including an oxide semiconductor which contains hydrogen is likely to have normally-on characteristics.

In view of the above, when an oxide semiconductor is used for the semiconductor film 111, it is preferable that hydrogen in the oxide semiconductor film as the semiconductor film 111 be reduced as much as possible. Specifically, the concentration of hydrogen in the semiconductor film 111, which is measured by secondary ion mass spectrometry (SIMS), is set to lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

The concentration of alkali metals or alkaline earth metals in the semiconductor film 111, which is measured by secondary ion mass spectrometry (SIMS), is set to lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in an oxide semiconductor film as the semiconductor film 111, electrons serving as carriers are generated and the carrier density increases, so that the oxide semiconductor film easily becomes n-type. Thus, a transistor including an oxide semiconductor which contains nitrogen is likely to have normally-on characteristics. For this reason, nitrogen in the oxide semiconductor film is preferably reduced as much as possible; the concentration of nitrogen is preferably set to, for example, lower than or equal to $5\times10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor 103 becomes an enhancement-type transistor and can be prevented from having normally-on characteristics, so that the off-state current of the transistor 103 can be significantly reduced. Therefore, a semiconductor device having favorable electrical characteristics can be fabricated. Further, a highly reliable semiconductor device can be fabricated.

Various experiments can prove the low off-state current of a transistor including a highly-purified oxide semiconductor film. For example, even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. In this case, it can be seen that the off-state current corresponding to a value obtained by dividing the off-state current by the channel width of the transistor is 100 zA/μm or lower. Further, the off-state current was measured with the use of a circuit in which a capacitor and a transistor are connected to each other and charge that flows in or out from the capacitor is controlled by the transistor. In the measurement, a purified oxide semiconductor film is used for a channel formation region of the transistor, and the off-state current of the transistor is measured from a change in the amount of charge of the capacitor per unit time. As a result, in the case where the voltage between a source electrode and a drain electrode of the transistor is 3 V, a lower off-state current of several tens of yoctoamperes per micrometer (yA/μm) can be achieved. Thus, the transistor including the highly purified oxide semiconductor film has a significantly low off-state current.

Figure 3:
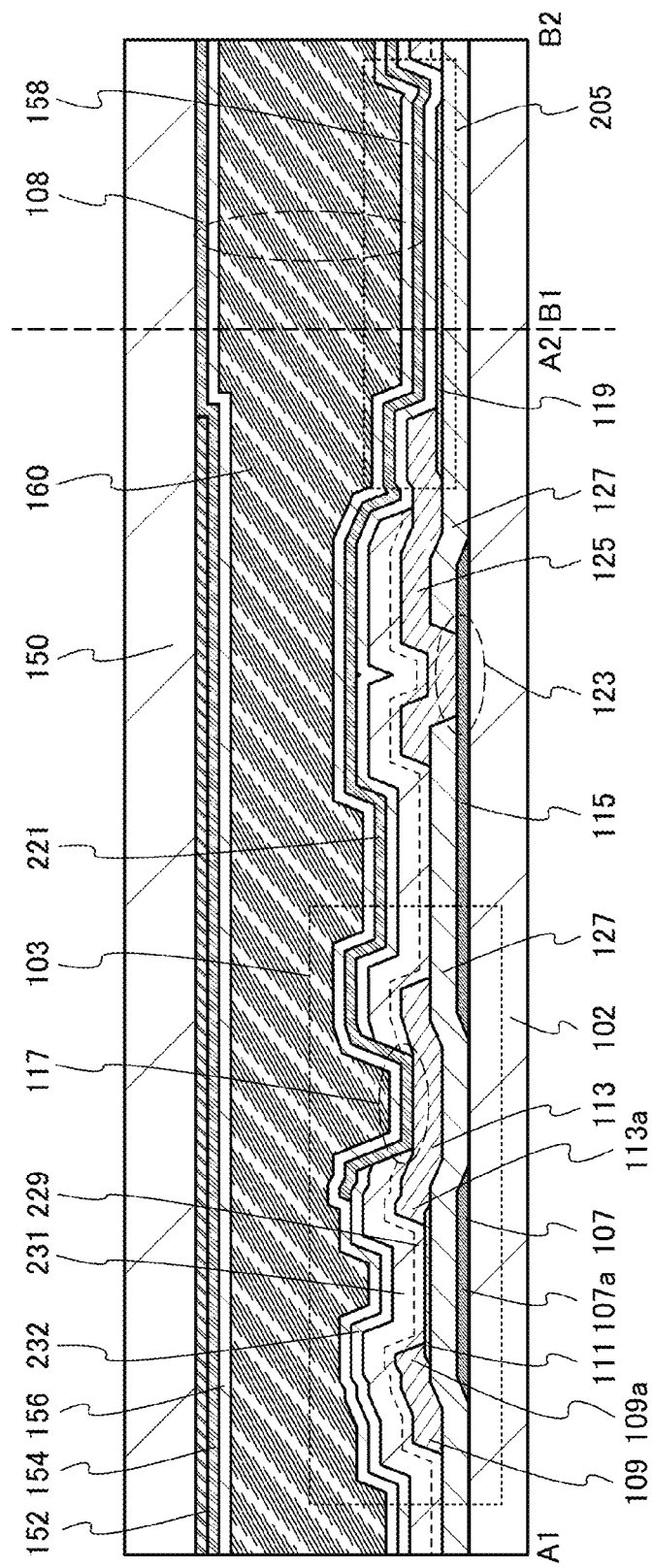
FIG. 3 is a cross-sectional view illustrating a semiconductor device that is one embodiment of the present invention.

Next, FIG. 3 is a cross-sectional view taken along dashed-dotted lines A1-A2 and B1-B2 in FIG. 2.

A cross-sectional structure of the pixel 201 of the liquid crystal display device is as follows. The liquid crystal display device includes an element portion over a substrate 102, an element portion on a substrate 150, and a liquid crystal layer positioned between the two element portions.

First, the structure of the element portion over the substrate 102 is described. The scan line 107 including a gate electrode 107a of the transistor 103 and the capacitor line 115 over the same surface as the scan line 107 are provided over the substrate 102. A gate insulating film 127 is provided over the scan line 107 and the capacitor line 115. The semiconductor film 111 is provided over a portion of the gate insulating film 127 which overlaps with the scan line 107, and the light-transmitting conductive film 119 is provided over the gate insulating film 127. The signal line 109 including a source electrode 109a of the transistor 103 and the conductive film 113 including a drain electrode 113a of the transistor 103 are provided over the semiconductor film 111 and the gate insulating film 127. The opening 123 reaching the capacitor line 115 is formed in the gate insulating film 127, and the conductive film 125 is provided in and over the opening 123 and over the gate insulating film 127 and the light-transmitting conductive film 119. An insulating film 229, an insulating film 231, and an insulating film 232 functioning as protective insulating films of the transistor 103 are provided over the gate insulating film 127, the signal line 109, the semiconductor film 111, the conductive film 113, and the conductive film 125. Further, the insulating film 232 is provided in contact with the light-transmitting conductive film 119 at least in a region which is to be the capacitor 205. The opening 117 reaching the conductive film 113 is formed in the insulating film 229, the insulating film 231, and the insulating film 232, and the pixel electrode 221 is provided in the opening 117 and over the insulating film 232. An insulating film 158 functioning as an alignment film is provided over the pixel electrode 221 and the insulating film 232. Note that a base insulating film may be provided between the substrate 102 and each of the scan line 107, the capacitor line 115, and the gate insulating film 127.

In the capacitor 205 illustrated in this embodiment, one of a pair of electrodes is a pixel electrode 221, the other of the pair of electrodes is the light-transmitting conductive film 119 that is a metal oxide film having electrical characteristics of a conductor and which is obtained using the semiconductor film formed in the same process as the semiconductor film 111, and a dielectric film between the pair of electrodes is the insulating film 232, whereby the thickness of the dielectric film can be small. Therefore, the charge capacity of the capacitor 205 can be increased.

The insulating film 232 is preferably a nitride insulating film.

Figure 4:
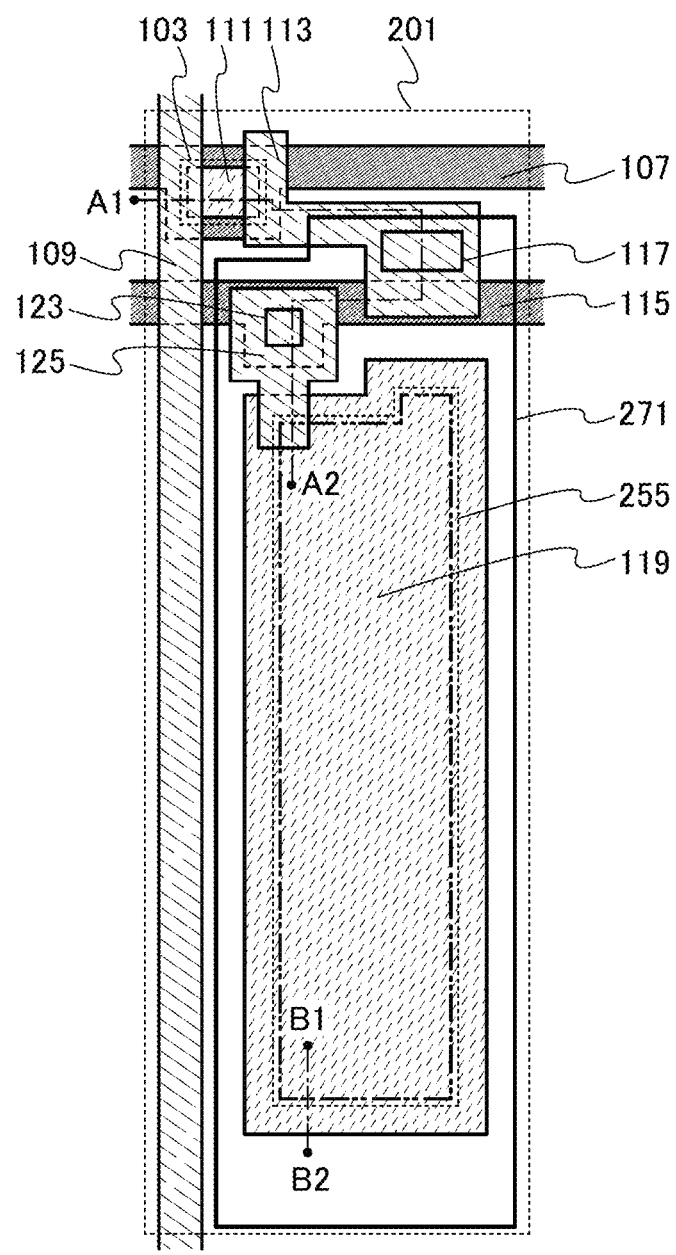
FIG. 4 is a top view illustrating a semiconductor device that is one embodiment of the present invention.

Note that in FIG. 2, an edge of a region (indicated by dashed-two dotted lines) where the insulating film 229 (not illustrated) and the insulating film 231 (not illustrated) are not provided is on the outer side of the light-transmitting conductive film 119; however, an edge of a region (indicated by dashed-two dotted lines) where an insulating film 279 (not illustrated) and the insulating film 281 (not illustrated) are not provided may be over the light-transmitting conductive film 119 as illustrated in FIG. 4.

Figure 5:
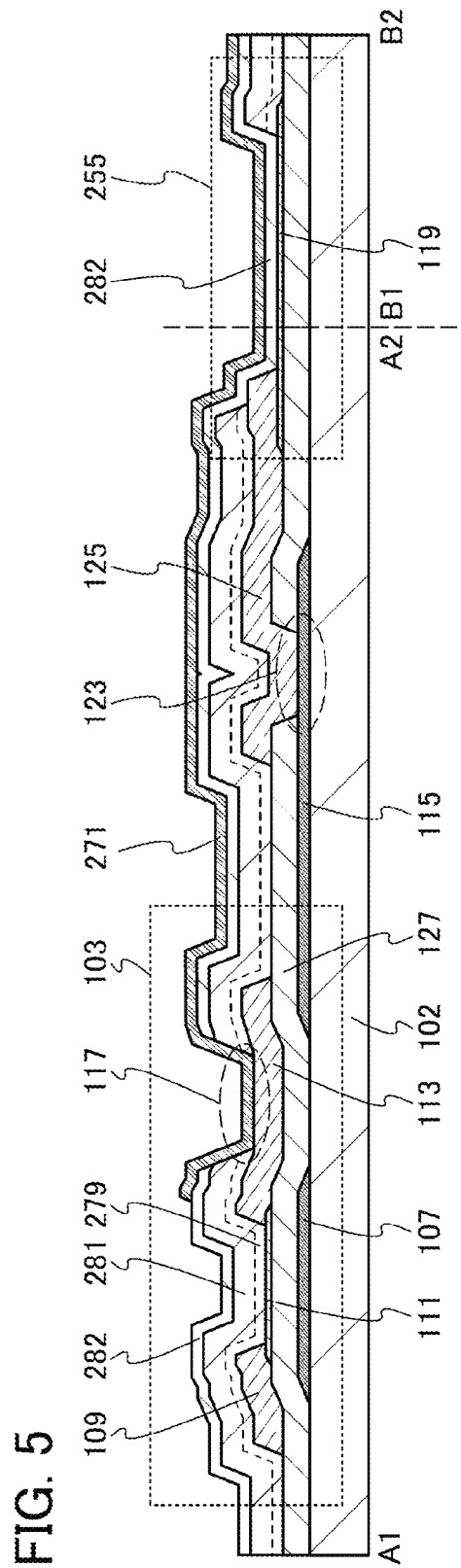
FIG. 5 is a cross-sectional view illustrating a semiconductor device that is one embodiment of the present invention.

FIG. 5 is a cross-sectional view taken along dashed-dotted lines A1-A2 and B1-B2 in FIG. 4.

In FIG. 5, the insulating film 279, the insulating film 281, and an insulating film 282 functioning as protective insulating films of the transistor 103 are provided over the gate insulating film 127, the signal line 109, the semiconductor film 111, the conductive film 113, the conductive film 125, and the light-transmitting conductive film 119. Edge portions of the insulating film 279 and the insulating film 281 are located over the light-transmitting conductive film 119. The insulating film 282 is provided over the light-transmitting conductive film 119. A capacitor 255 includes the light-transmitting conductive film 119, the insulating film 282, and a pixel electrode 271. Note that the insulating film 279, the insulating film 281, and the insulating film 282 can be formed using materials similar to those of the insulating film 229, the insulating film 231, and the insulating film 232, respectively. In addition, the pixel electrode 271 can be formed using a material similar to that of the pixel electrode 221. As illustrated in FIG. 5, since the edge portions of the insulating film 279 and the insulating film 281 are located over the light-transmitting conductive film 119, the gate insulating film 127 can be prevented from being excessively etched in etching of the insulating film 279 and the insulating film 281.

The details of the components of the above structure are described below.

Although there is no particular limitation on a material and the like of the substrate 102, it is necessary that the substrate have heat resistance high enough to withstand at least heat treatment performed in a fabrication process of a semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate.

The scan line 107 and the capacitor line 115, through which a large amount of current flows, are preferably formed using a metal film; typically, they are formed to have a single-layer structure or a layered structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over Cu—Mg—Al alloy, and a three-layer structure in which titanium nitride, copper, and tungsten are stacked in this order.

As a material of the scan line 107 and the capacitor line 115, a light-transmitting conductive material which can be used for the pixel electrode 221 can be used.

Alternatively, as a material of the scan line 107 and the capacitor line 115, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) can be used. These materials each have a work function higher than or equal to 5 eV (electron volts). When such an oxide semiconductor is used for the semiconductor film 111 in the transistor 103, the use of a metal oxide containing nitrogen for the scan line 107 (the gate electrode of the transistor 103) allows the threshold voltage of the transistor 103 to be shifted in the positive direction, i.e., the transistor can be normally off. For example, in the case of using an In—Ga—Zn-based oxide containing nitrogen, an In—Ga—Zn-based oxide having at least a higher nitrogen concentration than the semiconductor film 111, specifically, an In—Ga—Zn-based oxide having a nitrogen concentration of 7 at. % or higher can be used.

The scan line 107 and the capacitor line 115 are preferably formed using aluminum or copper, which are materials of low electrical resistance. With the use of aluminum or copper, signal delay is reduced, so that higher image quality can be achieved. Note that aluminum has low heat resistance, and thus a defect due to hillocks, whiskers, or migration is easily generated. To prevent migration of aluminum, a layer of a metal material having a higher melting point than aluminum, such as molybdenum, titanium, or tungsten, is preferably stacked over an aluminum layer. Also in the case where copper is used, in order to prevent a defect due to migration and diffusion of copper element, a layer of a metal material having a higher melting point than copper, such as molybdenum, titanium, or tungsten, is preferably stacked over a copper layer.

The gate insulating film 127 is formed to have a single-layer structure or a layered structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the oxide semiconductor film as the semiconductor film 111, a region in the gate insulating film 127 which is in contact with at least the semiconductor film 111 is preferably formed using an oxide insulating film.

Further, it is possible to prevent outward diffusion of oxygen from the oxide semiconductor film as the semiconductor film 111 and entry of hydrogen, water, or the like into the oxide semiconductor film from the outside by providing an insulating film having a barrier property against oxygen, hydrogen, water, and the like under the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

The gate insulating film 127 may be formed using a high-k material such as hafnium silicate ($HfSiO_x$), hafnium silicate containing nitrogen ($HfSi_xO_yN_z$), hafnium aluminate containing nitrogen ($HfAl_xO_yN_z$), hafnium oxide, or yttrium oxide, in which case gate leakage current of the transistor 103 can be reduced.

The gate insulating film 127 preferably has the following layered structure. It is preferable that a silicon nitride film having few defects be provided as a first silicon nitride film, a silicon nitride film from which little hydrogen and ammonia are released be provided as a second silicon nitride film over the first silicon nitride film, and any of the oxide insulating films listed as those used for the gate insulating film 127 be provided over the second silicon nitride film.

As the second silicon nitride film, a nitride insulating film which releases less hydrogen molecules than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and less ammonia molecules than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$ by thermal desorption spectroscopy is preferably used. The first silicon nitride film and the second silicon nitride film are used as part of the gate insulating film 127, whereby a gate insulating film which has few defects and from which little hydrogen and ammonia are released can be formed as the gate insulating film 127. Thus, the amount of hydrogen and nitrogen contained in the gate insulating film 127 which enter the semiconductor film 111 can be reduced.

In the case where the trap levels (also referred to as interface states) are present at the interface between an oxide semiconductor film and a gate insulating film or in the gate insulating film in a transistor including an oxide semiconductor, a shift of the threshold voltage of the transistor, typically, a shift of the threshold voltage in the negative direction, and an increase in the subthreshold swing (S value) showing a gate voltage needed for changing the drain current by an order of magnitude when the transistor is turned on are caused. As a result, there is a problem in that electrical characteristics vary among transistors. Therefore, the use of a silicon nitride film having few defects as a gate insulating film and provision of an oxide insulating film in contact with the semiconductor film 111 can reduce a shift of the threshold voltage in the negative direction and minimize an increase in S value.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor film 111 is an oxide semiconductor film which can be amorphous, single-crystalline, or polycrystalline. The thickness of the semiconductor film 111 is greater than or equal to 1 nm and less than or equal to 100 nm, preferably greater than or equal to 1 nm and less than or equal to 50 nm, further preferably greater than or equal to 1 nm and less than or equal to 30 nm, still further preferably greater than or equal to 3 nm and less than or equal to 20 nm.

An oxide semiconductor which can be used for the semiconductor film 111 has an energy gap of greater than or equal to 2 eV, preferably greater than or equal to 2.5 eV, more preferably greater than or equal to 3 eV. The use of such an oxide semiconductor having a wide energy gap can reduce the off-state current of the transistor 103.

An oxide semiconductor used for the semiconductor film 111 preferably contains at least indium (In) or zinc (Zn). Alternatively, the oxide semiconductor preferably contains both In and Zn. In order to reduce variations in electrical characteristics of the transistors including the oxide semiconductor, the oxide semiconductor preferably contains one or more stabilizers in addition to one of or both In and Zn.

Examples of stabilizers are gallium (Ga), tin (Sn), hafnium (Hf), aluminum (Al), and zirconium (Zr). Other examples of stabilizers are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For an oxide semiconductor which can be used for the semiconductor film 111, for example, the following can be used: an indium oxide; a tin oxide; a zinc oxide; an oxide containing two kinds of metals, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0) may be used as an oxide semiconductor. Note that M represents one or more metal elements selected from Ga, Fe, Mn, and Co, or the above element as a stabilizer.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3). Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) may be used. Note that the proportion of each atom in the atomic ratio of the metal oxide varies within a range of ±20% as an error.

Note that without limitation to the materials given above, a material with an appropriate atomic ratio depending on semiconductor characteristics and electrical characteristics (field-effect mobility, threshold voltage, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics. For example, high field-effect mobility can be achieved relatively easily in the case of using an In—Sn—Zn oxide. Also in the case of using an In—Ga—Zn-based oxide, field-effect mobility can be increased by reducing the defect density in a bulk.

The light-transmitting conductive film 119 contains, as a main component, a material similar to that of the semiconductor film 111, and is formed of a metal oxide having characteristics of a conductor, which is obtained by making the metal oxide contain nitrogen and/or hydrogen to increase its conductivity.

Both the semiconductor film 111 and the light-transmitting conductive film 119 are formed over a gate insulating film and are formed of metal oxide films containing the same metal elements, but differ in impurity concentration. Specifically, the light-transmitting conductive film 119 has a higher impurity concentration than the semiconductor film 111. For example, the concentration of hydrogen contained in the semiconductor film 111 is lower than $5\times10^{19}$ atoms/cm$^3$, preferably lower than $5\times10^{18}$ atoms/cm$^3$, more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$. The concentration of hydrogen contained in the light-transmitting conductive film 119 is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the light-transmitting conductive film 119 is greater than or equal to 2 times, preferably greater than or equal to 10 times that in the semiconductor film 111.

The light-transmitting conductive film 119 has lower resistivity than the semiconductor film 111. The resistivity of the light-transmitting conductive film 119 is preferably greater than or equal to $1\times10^{-8}$ times and less than or equal to $1\times10^{-1}$ times the resistivity of the semiconductor film 111. The resistivity of the light-transmitting conductive film 119 is typically greater than or equal to $1\times10^{-3}$ Ωcm and less than $1\times10^4$ Ωcm, preferably greater than or equal to $1\times10^{-3}$ Ωcm and less than $1\times10^{-1}$ Ωcm.

The signal line 109 including the source electrode 109a of the transistor 103, the conductive film 113 including the drain electrode of the transistor 103, and the conductive film 125 electrically connecting the light-transmitting conductive film 119 and the capacitor line 115 in the capacitor 205 can be formed to have a single-layer structure or a layered structure using a material which can be used for the scan line 107 and the capacitor line 115.

The insulating films 229, 231, and 232 functioning as the protective insulating films of the transistor 103 and the dielectric film in the capacitor 205 are insulating films each formed using a material which can be used for the gate insulating film 127. It is particularly preferable that the insulating films 229 and 231 be oxide insulating films and the insulating film 232 be a nitride insulating film. Further, the use of a nitride insulating film as the insulating film 232 can suppress entry of impurities such as hydrogen and water into the transistor 103 (in particular in the semiconductor film 111) from the outside. Note that the insulating film 229 is not necessarily provided.

Further, an oxide insulating film in which the oxygen content is higher than that in the stoichiometric composition is preferably used as one of or both the insulating film 229 and the insulating film 231. In that case, oxygen can be prevented from being released from the oxide semiconductor film, and the oxygen contained in an oxygen-excess oxide insulating film can enter the oxide semiconductor film to reduce oxygen vacancies. For example, when an oxide insulating film having the following feature is used, oxygen vacancies in the oxide semiconductor film can be reduced. The feature of the oxide insulating film is that the number of oxygen molecules released from the oxide insulating film is greater than or equal to $1.0\times10^{18}$/cm$^3$ when measured by thermal desorption spectroscopy (hereinafter referred to as TDS spectroscopy). Note that an oxide insulating film partly including a region in which the oxygen content is higher than that in the stoichiometric composition (oxygen excess region) may be used as one of or both the insulating film 229 and the insulating film 231. When such an oxygen excess region is present in a region overlapping with at least the semiconductor film 111, oxygen is prevented from being released from the oxide semiconductor film and the oxygen contained in the oxygen-excess oxide insulating film can enter the oxide semiconductor film to reduce oxygen vacancies.

In the case where the insulating film 231 is an oxide insulating film in which the oxygen content is higher than that in the stoichiometric composition, the insulating film 229 is preferably an oxide insulating film that oxygen can permeate. Oxygen which enters the insulating film 229 from the outside does not completely go through the insulating film 229 to be released into the semiconductor film 111 and part thereof remains in the insulating film 229. Further, there is oxygen which is contained in the insulating film 229 from the start and is released from the insulating film 229 to the outside. Thus, the insulating film 229 preferably has a high coefficient of diffusion of oxygen.

Since the insulating film 229 is in contact with the oxide semiconductor film as the semiconductor film 111, the insulating film 229 is preferably an oxide insulating film that oxygen can permeate and which has a low density of interface states with the semiconductor film 111. For example, the insulating film 229 is preferably an oxide insulating film having a lower defect density than the insulating film 231. Specifically, the spin density of the oxide insulating film at a g-value of 2.001 (E'-center) measured by electron spin resonance spectroscopy is lower than or equal to $3.0\times10^{17}$ spins/cm$^3$, preferably lower than or equal to $5.0\times10^{16}$ spins/cm$^3$. The spin density at a g-value of 2.001 measured by electron spin resonance spectroscopy corresponds to the number of dangling bonds in the insulating film 229.

The insulating film 229 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 231 can have a thickness of greater than or equal to 30 nm and less than or equal to 500 nm, preferably greater than or equal to 150 nm and less than or equal to 400 nm.

In the case where a nitride insulating film is used as the insulating film 232, an insulating film having a barrier property against nitrogen is preferably used as one of or both the insulating film 229 and the insulating film 231. For example, a dense oxide insulating film can have a barrier property against nitrogen. Specifically, an oxide insulating film which can be etched by 0.5 wt % of fluoric acid at a rate of less than or equal to 10 nm per minute when the temperature is 25° C. is preferably used.

In the case where an oxide insulating film containing nitrogen, such as a silicon oxynitride film or a silicon nitride oxide film, is used as one of or both the insulating film 229 and the insulating film 231, the nitrogen concentration measured by SIMS is greater than or equal to the lower limit of measurement by SIMS and less than $3\times10^{20}$ atoms/cm$^3$, preferably greater than or equal to $1\times10^{18}$ atoms/cm$^3$ and less than or equal to $1\times10^{20}$ atoms/cm$^3$. In that case, the amount of nitrogen which enters the semiconductor film 111 included in the transistor 103 can be reduced and the number of defects in the nitrogen-containing oxide insulating film itself can be reduced.

As the insulating film 232, a nitride insulating film where the hydrogen content is low may be provided. The nitride insulating film is as follows, for example: the number of hydrogen molecules released from the nitride insulating film is less than $5.0\times10^{21}$/cm$^3$, preferably less than $3.0\times10^{21}$/cm$^3$, more preferably less than $1.0\times10^{21}$/cm$^3$ when measured by TDS spectroscopy.

The insulating film 232 has a thickness large enough to prevent entry of impurities such as hydrogen and water from the outside. For example, the thickness can be greater than or equal to 50 nm and less than or equal to 200 nm, preferably greater than or equal to 50 nm and less than or equal to 150 nm, more preferably greater than or equal to 50 nm and less than or equal to 100 nm.

Further, a silicon oxide film formed by a CVD method using an organosilane gas may be provided between the insulating film 231 and the insulating film 232 or over the insulating film 232. The silicon oxide film has excellent step coverage and thus can be advantageously used as a protective insulating film of the transistor 103. The silicon oxide film can be formed to a thickness greater than or equal to 300 nm and less than or equal to 600 nm. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like.

When the silicon oxide film is provided between the insulating film 231 and the insulating film 232 or over the insulating film 232, the planarity of a surface of an element portion where the transistor and the capacitor are to be provided can be increased. When the silicon oxide film is provided between the insulating film 231 and the insulating film 232 and the nitride insulating film is used as the insulating film 232, entry of impurities such as hydrogen and water into the semiconductor film 111 and the light-transmitting conductive film 119 from the outside can be further suppressed.

Further, when the silicon oxide film is provided over the insulating film 232, the insulating film 232 and the silicon oxide film function as a dielectric film of the capacitor 205. The insulating film 232 is formed of a nitride insulating film, and a nitride insulating film tends to have a higher dielectric constant and a larger internal stress than an oxide insulating film such as a silicon oxide film. Therefore, in the case where only the insulating film 232 is used as the dielectric film of the capacitor 205 without using the silicon oxide film, when the thickness of the insulating film 232 is small, the capacitance value of the capacitor 205 is too large and it is difficult to increase the speed of writing an image signal to a pixel with low power consumption. In reverse, when the thickness of the insulating film 232 is large, internal stress is too large and degradation of electrical characteristics, such as a change in threshold voltage of a transistor, might occur. Further, when the internal stress of the insulating film 232 is too large, the insulating film 232 tends to be peeled off from the substrate 102, so that the yield is reduced. However, together with the insulating film 232, the silicon oxide film which has a lower dielectric constant than the insulating film 232 is used as the dielectric film of the capacitor of the pixel, whereby the dielectric constant of the dielectric film can be controlled to a desired value without increasing the thickness of the insulating film 232.

The pixel electrode 221 is formed using a light-transmitting conductive film. The light-transmitting conductive film is formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added.

Next, the structure of the element portion on the substrate 150 is described. The element portion includes a light-blocking film 152 which is in contact with the substrate 150, an electrode (a counter electrode 154) which is in contact with the light-blocking film 152 and is provided so as to face the pixel electrode 221, and an insulating film 156 which is in contact with the counter electrode 154 and functions as an alignment film.

The light-blocking film 152 prevents the transistor 103 from being irradiated with light from a light source such as a backlight or the outside. The light-blocking film 152 can be formed using a material such as a metal or an organic resin including a pigment and may be provided in a region outside the pixel portion 100, such as over the scan line driver circuit 104 and over the signal line driver circuit 106 (see FIG. 1), as well as over the transistor 103 in the pixel 201.

Note that a coloring film which transmits light with a predetermined wavelength may be provided between light-blocking films 152 adjacent to each other. Further, an overcoat film may be provided between the counter electrode 154, and the light-blocking films 152 and the coloring film.

The counter electrode 154 is formed using any of the light-transmitting conductive materials given as those used for the pixel electrode 221 as appropriate.

The liquid crystal element 108 includes the pixel electrode 221, the counter electrode 154, and a liquid crystal layer 160. The liquid crystal layer 160 is positioned between the insulating film 158 which is provided in the element portion over the substrate 102 and functions as an alignment film and the insulating film 156 which is provided in the element portion on the substrate 150 and functions as an alignment film. Further, the pixel electrode 221 overlaps with the counter electrode 154 with the liquid crystal layer 160 positioned therebetween.

The insulating films 156 and 158 functioning as alignment films can be formed using a general-purpose material such as polyamide.

When an oxide insulating film that oxygen permeates and which has a low interface state density at the interface with the semiconductor film 111 and the oxide insulating film is used as the insulating film 229 over the semiconductor film 111 and an oxide insulating film which includes an oxygen excess region or an oxide insulating film in which the oxygen content is higher than that in the stoichiometric composition is used as the insulating film 231, oxygen can be easily supplied to the oxide semiconductor film as the semiconductor film 111, the release of oxygen from the oxide semiconductor film can be prevented, and the oxygen contained in the insulating film 231 can enter the oxide semiconductor film to reduce oxygen vacancies in the oxide semiconductor film. As a result, the transistor 103 becomes an enhancement-type transistor and is prevented from having normally-on characteristics, so that the electrical characteristics and reliability of the semiconductor device can be improved and power consumption of the semiconductor device can be reduced.

The use of a nitride insulating film as the insulating film 232 over the insulating film 231 can suppress entry of impurities such as hydrogen and water into the semiconductor film 111 and the light-transmitting conductive film 119 from the outside. Moreover, the use of a nitride insulating film with a low hydrogen content as the insulating film 232 can minimize variations in electrical characteristics of the transistor.

Further, the capacitor 205 can be formed large (in a large area) in the pixel 201. Thus, the semiconductor device can have charge capacity increased while improving the aperture ratio. As a result, the semiconductor device can have an excellent display quality.

In addition, the two electrodes of the capacitor 205 have conductivity, and thus sufficient charge capacity can be obtained even when the capacitor 205 has a small plane area. Note that an oxide semiconductor film transmits 80% to 90% of light; thus, when the area of the light-transmitting conductive film 119 is reduced and a region where the light-transmitting conductive film 119 is not formed is provided in the pixel 201, the transmittance with respect to light emitted from a light source such as a backlight can be increased. That is, it is possible to turn down the brightness of a light source such as a backlight, so that power consumption of the semiconductor device can be reduced.

<Manufacturing Method of Semiconductor Device>

Next, a formation method of the element portion over the substrate 102 in the semiconductor device described above is described with reference to FIGS. 6A and 6B, FIGS. 7A and 7B, and FIGS. 8A and 8B.

First, the scan line 107 and the capacitor line 115 are formed over the substrate 102. An insulating film 126 which is to be processed into the gate insulating film 127 later is formed so as to cover the scan line 107 and the capacitor line 115. The semiconductor film 111 is formed over a portion of the insulating film 126 which overlaps with the scan line 107. A semiconductor film 118 is formed so as to overlap a region where the pixel electrode 221 is to be formed later (see FIG. 6A).

The scan line 107 and the capacitor line 115 can be formed in such a manner that a conductive film is formed using any of the materials listed above, a mask is formed over the conductive film, and processing is performed using the mask. The conductive film can be formed by any of a variety of deposition methods such as an evaporation method, a CVD method, a sputtering method, and a spin coating method. Note that the thickness of the conductive film is not particularly limited and can be determined in consideration of formation time, desired resistivity, and the like. As the mask, a resist mask formed through a first photolithography process can be used. The conductive film can be processed by one of or both dry etching and wet etching.

The insulating film 126 can be formed using a material which can be used for the gate insulating film 127, by any of a variety of deposition methods such as a CVD method and a sputtering method.

In the case where a gallium oxide is used for the gate insulating film 127, the insulating film 126 can be formed by a metal organic chemical vapor deposition (MOCVD) method.

The semiconductor film 111 and the semiconductor film 118 can be formed in such a manner that an oxide semiconductor film is formed using any of the oxide semiconductors given above, a mask is formed over the oxide semiconductor film, and processing is performed using the mask. Thus, the semiconductor film 111 and the semiconductor film 118 are formed using the same metal element. The oxide semiconductor film can be formed by a sputtering method, a coating method, a pulsed laser deposition method, a laser ablation method, or the like. Alternatively, when a printing method is employed, the semiconductor films 111 and 118 which are separate from each other can be formed directly on the insulating film 126. In the case where the oxide semiconductor film is formed by a sputtering method, an RF power supply device, an AC power supply device, a DC power supply device, or the like can be used as appropriate as a power supply device for generating plasma. As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of the rare gas. Further, a target may be appropriately selected in accordance with the composition of an oxide semiconductor film which is to be formed. As the mask, a resist mask formed through a second photolithography process can be used. The oxide semiconductor film can be processed by one of or both of dry etching and wet etching. Etching conditions (an etching gas, an etchant, etching time, temperature, and the like) are appropriately set in accordance with a material so that etching can be performed to form a desired shape.

Heat treatment is preferably performed after formation of the semiconductor films 111 and 118 to dehydrate or dehydrogenate the oxide semiconductor films. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. Note that the heat treatment may be performed on the oxide semiconductor film which has not been processed into the semiconductor films 111 and 118.

A heat treatment apparatus used in the heat treatment is not limited to an electric furnace; as the heat treatment apparatus, an apparatus which heats an object using thermal conduction or thermal radiation given by a medium such as a heated gas may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, heating may be performed in an inert gas atmosphere first, and then in an oxygen atmosphere. The treatment time is 3 minutes to 24 hours.

In the case where a base insulating film is provided between the substrate 102, and the scan line 107, the capacitor line 115, and the gate insulating film 127, the base insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the base insulating film leads to suppression of diffusion of impurities typified by an alkali metal, water, and hydrogen into the semiconductor film 111 from the substrate 102. The base insulating film can be formed by a sputtering method or a CVD method.

After an opening 123 reaching the capacitor line 115 is formed in the insulating film 126 to form the gate insulating film 127, the signal line 109 including the source electrode of the transistor 103, the conductive film 113 including the drain electrode of the transistor 103, and the conductive film 125 which electrically connects the semiconductor film 118 and the capacitor line 115 are formed (see FIG. 6B).

The opening 123 can be formed so as to expose part of a portion of the insulating film 126 which overlaps with the capacitor line 115 in such a manner that a mask is formed through a third photolithography process and processing is performed using the mask. The formation of the mask and the processing can be performed in manners similar to those of the scan line 107 and the capacitor line 115.

The signal line 109, the conductive film 113, and the conductive film 125 can be formed in such a manner that a conductive film is formed using a material which can be used for the signal line 109, the conductive film 113, and the conductive film 125, a mask is formed over the conductive film through a fourth photolithography process, and processing is performed using the mask. The formation of the mask and the processing can be performed in a manner similar to that of the scan line 107 and the capacitor line 115.

Then, an insulating film 128 is formed over the semiconductor film 111, the semiconductor film 118, the signal line 109, the conductive film 113, the conductive film 125, and the gate insulating film 127, and an insulating film 130 is formed over the insulating film 128 (see FIG. 7A). The insulating film 128 and the insulating film 130 are preferably formed successively, in which case entry of impurities into each interface can be suppressed.

The insulating film 128 can be formed using a material which can be used for the insulating film 229, by any of a variety of deposition methods such as a CVD method and a sputtering method. The insulating film 130 can be formed using a material which can be used for the insulating film 231.

In the case where an oxide insulating film which has a low interface state density at the interface with the semiconductor film 111 and the oxide insulating film is used as the insulating film 229, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon are silane, disilane, trisilane, and silane fluoride. Examples of the oxidizing gas are oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (the insulating film 229) can be reduced and dangling bonds in the insulating film 128 (the insulating film 229) can be reduced. Oxygen released from the insulating film 130 (the insulating film 231) is captured by the dangling bonds in the insulating film 128 (the insulating film 229) in some cases; thus, in the case where the dangling bonds in the insulating film 128 (the insulating film 229) are reduced, oxygen in the insulating film 130 (the insulating film 231) can enter the semiconductor film 111 efficiently to reduce the oxygen vacancies in the oxide semiconductor film as the semiconductor film 111. As a result, the amount of hydrogen which enters the oxide semiconductor film can be reduced and oxygen vacancies in the oxide semiconductor film can be reduced.

In the case where the above oxide insulating film which includes an oxygen excess region or the above oxide insulating film in which the oxygen content is higher than that in the stoichiometric composition is used as the insulating film 231, the insulating film 130 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm² is supplied to an electrode provided in the treatment chamber.

As the source gas of the insulating film 130, a source gas which can be used for the insulating film 128 can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film in which the oxygen content is higher than that in the stoichiometric composition and from which part of oxygen is released by heating. The insulating film 128 is provided over the semiconductor film 111. Accordingly, in the process for forming the insulating film 130, the insulating film 128 serves as a protective film of the semiconductor film 111. Thus, even when the insulating film 130 is formed using the high-frequency power having a high power density, damage to the semiconductor film 111 is not significant.

By increasing the thickness of the insulating film 130, a larger amount of oxygen is released by heating; thus, the insulating film 130 is preferably formed thicker than the insulating film 128. Since the insulating film 128 is provided, favorable coverage can be achieved even when the insulating film 130 is formed thick.

It is preferable that heat treatment be performed at least after formation of the insulating film 130 so that excess oxygen contained in the insulating film 128 or the insulating film 130 enters the oxide semiconductor film 111 to reduce oxygen vacancies in the oxide semiconductor film. Note that the heat treatment can be appropriately performed according to the details of heat treatment for dehydration or dehydrogenation of the semiconductor film 111 and the light-transmitting conductive film 119.

Next, a mask is formed over a region of the insulating film 130 which overlaps with at least the light-transmitting conductive film 119 and processing is performed using the mask, so that insulating films 228 and 230 having an opening portion are formed. As the mask having the opening portion where the light-transmitting conductive film 119 is exposed, a resist mask formed through a fifth photolithography process can be used, and the processing can be performed by one of or both dry etching and wet etching. In the case where the opening portion is formed by dry etching, the oxide semiconductor film is exposed to plasma and is damaged, so that defects, typically, oxygen vacancies are formed in the oxide semiconductor film. Accordingly, the light-transmitting conductive film 119 having low resistance is formed. Then, an insulating film 233 is formed over the insulating film 228, the insulating film 230, the conductive film 125, and the light-transmitting conductive film 119 (see FIG. 7B).

The insulating film 233 can be formed using a material which can be used for the insulating film 232. The insulating film 233 can be formed by a sputtering method, a CVD method, or the like.

In the case where a nitride insulating film with a low hydrogen content is used as the insulating film 233, the insulating film 233 can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 80° C. and lower than or equal to 400° C., preferably higher than or equal to 200° C. and lower than or equal to 370° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power is supplied to an electrode provided in the treatment chamber.

As the source gas of the insulating film 233, a deposition gas containing silicon, a nitrogen gas, and an ammonia gas are preferably used. Typical examples of the deposition gas containing silicon are silane, disilane, trisilane, and silane fluoride. Further, the flow ratio of nitrogen to ammonia is preferably higher than or equal to 5 and lower than or equal to 50, more preferably higher than or equal to 10 and lower than or equal to 50. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

When the insulating film 233 is formed using a nitride insulating film by a plasma CVD method or a sputtering method, the semiconductor film 118 is exposed to plasma and oxygen vacancies are generated in the semiconductor film 118. Moreover, when the semiconductor film 118 is in contact with the insulating film 233 formed using a nitride insulating film, nitrogen and/or hydrogen move/moves from the insulating film 233 to the semiconductor film 118. Due to entry of hydrogen contained in the insulating film 233 into an oxygen vacancy, an electron serving as a carrier is generated. Accordingly, the conductivity of the semiconductor film 118 is increased, so that the light-transmitting conductive film 119 which is formed of a metal oxide film having electrical conductivity characteristic of a conductor is obtained.

In addition, heat treatment may be performed in the state where the insulating film 233 is in contact with the light-transmitting conductive film 119 at the time after the formation of the insulating film 233, for example. As a result, the conductivity of the light-transmitting conductive film 119 can be further increased.

Note that depending on a travel distance of nitrogen and/or hydrogen from the insulating film 233, part of a region of the semiconductor film 118 which overlaps with the conductive film 125 remains as an oxide semiconductor in some cases.

A silicon oxide film may be formed between the insulating film 130 and the insulating film 233 by a CVD method using an organosilane gas.

In the case where a silicon oxide film is formed between the insulating film 130 and the insulating film 233 by a CVD method using an organosilane gas, an oxide insulating film in which the oxygen content is higher than that in the stoichiometric composition and from which part of oxygen is released by heating is formed as the insulating film 130 and then heat treatment is performed at 350° C. so that excess oxygen contained in the insulating film 130 enters the semiconductor film 111. After the silicon oxide film is formed by a CVD method using any of the organosilane gases given above at a substrate temperature of 350° C., a nitride insulating film with a low hydrogen content is formed as the insulating film 233 at a substrate temperature of 350° C.

Then, after a mask is formed over portions of the insulating films 228, 230, and 233 which overlap the conductive film 113 through a sixth photolithography process, the insulating films 228, 230, and 233 are etched to form the insulating films 229, 231, and 232 having the opening 117 reaching the conductive film 113 (see FIG. 8A). The opening 117 can be formed in a manner similar to that of the opening 123.

Finally, the pixel electrode 221 is formed, so that the element portion over the substrate 102 can be formed (see FIG. 8B). The pixel electrode 221 is formed in such a manner that a conductive film is formed using any of the materials listed above in contact with the conductive film 113 through the opening 117, a mask is formed over the conductive film through a seventh photolithography process, and processing is performed using the mask. The formation of the mask and the processing can be performed in manners similar to those of the scan line 107 and the capacitor line 115.

Modification Example 1

In the semiconductor device of one embodiment of the present invention, the structure of the capacitor can be changed as appropriate. A specific example of the structure is described with reference to FIG. 9. Here, only a capacitor 245 which is different from the capacitor 205 described with reference to FIG. 2 and FIG. 3 is described.

A gate insulating film 227 has a stacked-layer structure of an insulating film 225 formed using a nitride insulating film and an insulating film 226 formed using an oxide insulating film and only the insulating film 225 is provided in a region where at least the light-transmitting conductive film 119 is provided. With such a structure, the nitride insulating film that is the insulating film 225 is in contact with a bottom surface of the light-transmitting conductive film 119; therefore, the semiconductor film which is formed over the insulating film 225 at the same time as the semiconductor film 111 can be the light-transmitting conductive film 119 that is formed of a metal oxide film having electrical conductivity characteristic of a conductor (see FIG. 9). In this case, a dielectric film of the capacitor 245 is the insulating films 229, 231, and 232. As the insulating films 225 and 226, insulating films which can be used as the gate insulating film 127 can be used as appropriate, and the insulating film 225 may be formed using an insulating film similar to the insulating film 232. The structure illustrated in FIG. 9 can prevent a reduction in the thickness of the light-transmitting conductive film 119 due to etching of the insulating films 129 and 131, so that the yield is increased as compared with the semiconductor device illustrated in FIG. 3.

Figure 9:
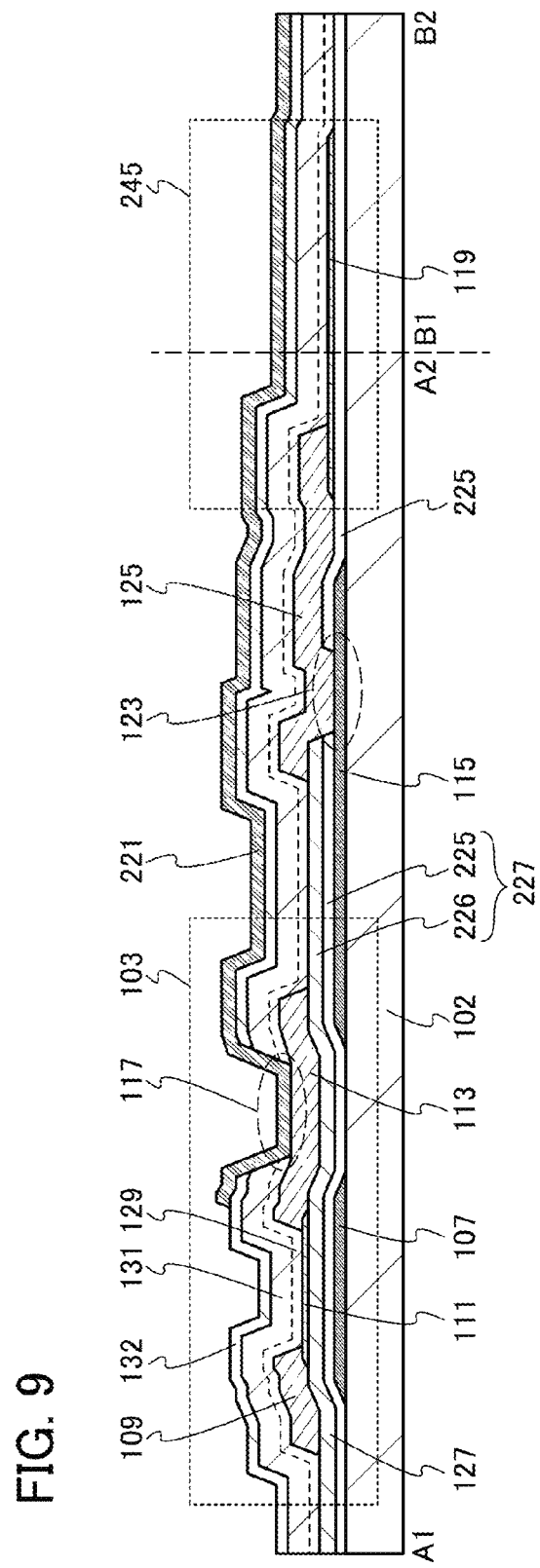
FIG. 9 is a cross-sectional view illustrating a semiconductor device that is one embodiment of the present invention.

Note that in the structure illustrated in FIG. 9, the top surface of the light-transmitting conductive film 119 may be in contact with the insulating film 132. That is, portions of the insulating films 129 and 131 in FIG. 9 which are in contact with the light-transmitting conductive film 119 may be removed. In that case, a dielectric film of the capacitor 245 is the insulating film 132. When the top and bottom surfaces of the light-transmitting conductive film 119 are in contact with nitride insulating films, the light-transmitting conductive film 119 can have a higher conductivity than in the case where only one of the top and bottom surfaces is in contact with a nitride insulating film.

Modification Example 2

Figure 10:
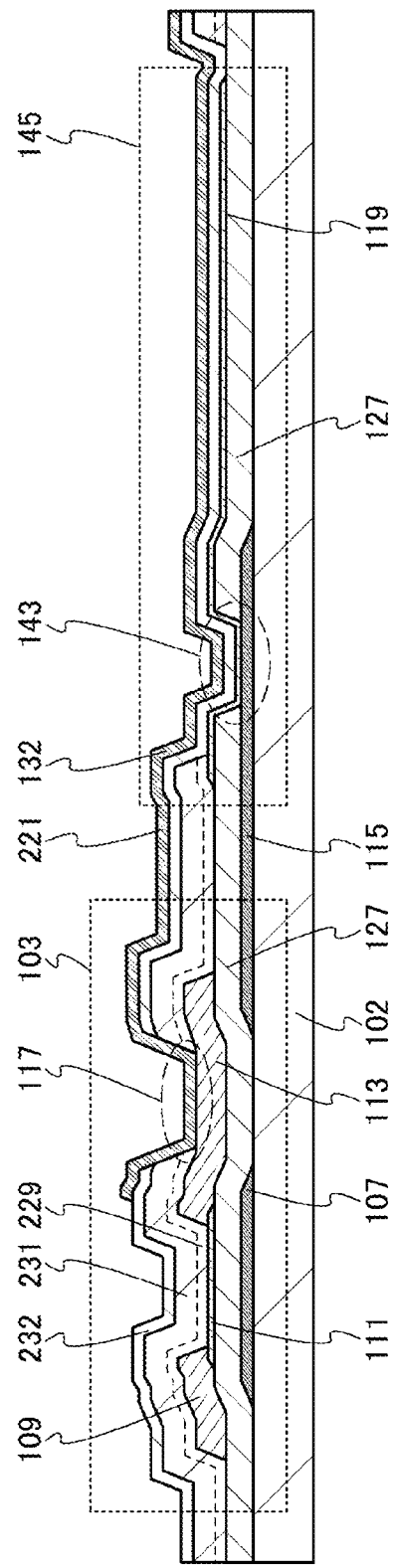
FIG. 10 is a cross-sectional view illustrating a semiconductor device that is one embodiment of the present invention.

In the semiconductor device of one embodiment of the present invention, connection of the capacitor line and the light-transmitting conductive film serving as an electrode of the capacitor can be changed as appropriate. For example, to improve the aperture ratio, a structure where the light-transmitting conductive film is in direct contact with the capacitor line without the conductive film positioned therebetween can be employed. A specific example of the structure is described with reference to FIG. 10. Here, only a capacitor 145 which is different from the capacitor 205 described with reference to FIG. 2 and FIG. 3 is described. FIG. 10 is a cross-sectional view of the semiconductor device.

In the pixel, the light-transmitting conductive film 119 functioning as the other electrode of the capacitor 145 is in direct contact with the capacitor line 115 through an opening 143. Unlike in the capacitor 205 in FIG. 3, the light-transmitting conductive film 119 is in direct contact with the capacitor line 115 without the conductive film 125 positioned therebetween and the conductive film 125 that is a light-blocking film is not formed, so that a higher aperture ratio of a pixel 141 can be achieved.

Modification Example 3

In the semiconductor device of one embodiment of the present invention, the structures of the light-transmitting conductive film included in the capacitor and the capacitor line can be changed as appropriate. A specific example of the structure is described with reference to FIG. 11. Note that only a light-transmitting conductive film 178 and a capacitor line 176, which are different from the light-transmitting conductive film 119 and the capacitor line 115 described in FIG. 2 and FIG. 3, are described here.

Figure 11:
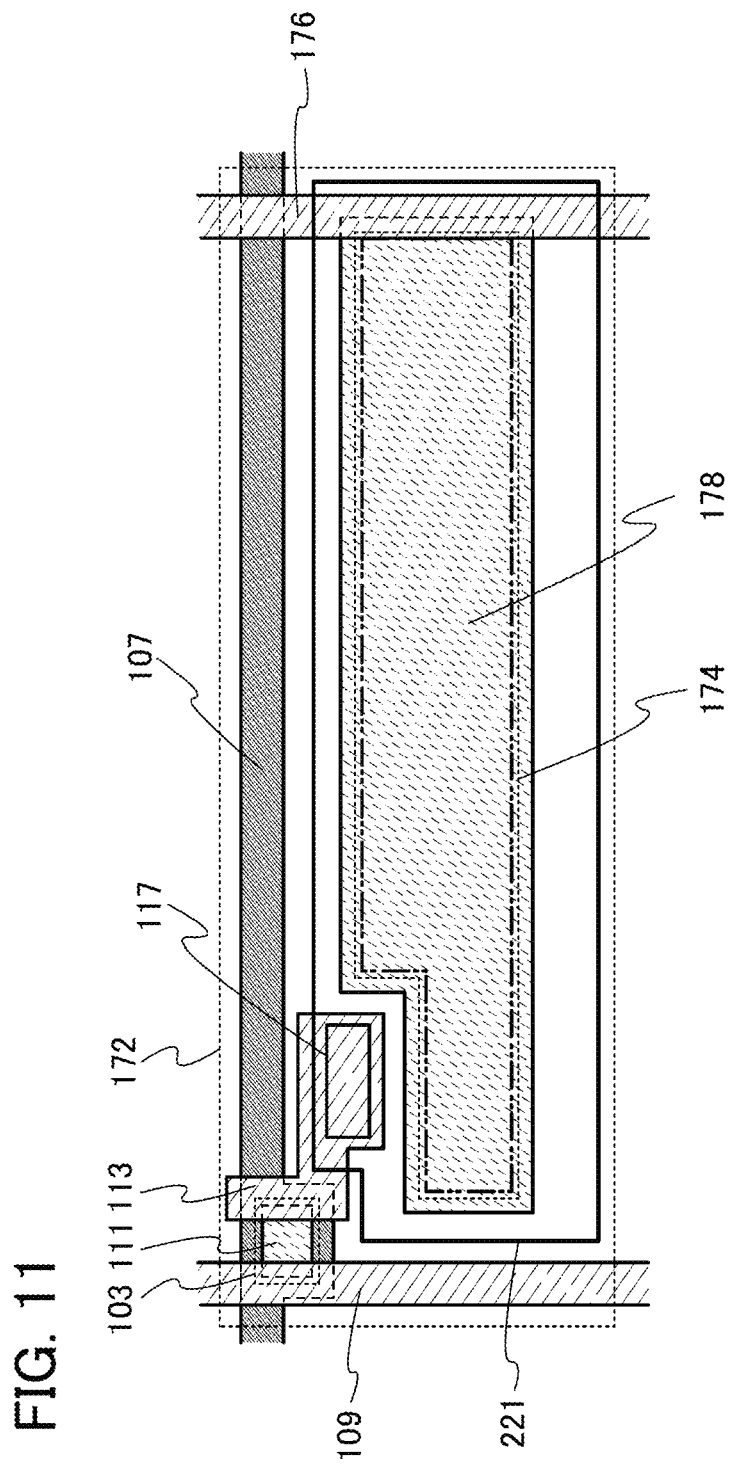
FIG. 11 is a top view illustrating a semiconductor device that is one embodiment of the present invention.

FIG. 11 is a top view of a pixel 172 where the capacitor line 176 is provided to extend in a direction parallel to the signal line 109. The signal line 109 and the capacitor line 176 are electrically connected to the signal line driver circuit 106 (see FIG. 1A).

Like in the pixel 172 illustrated in FIG. 11, a shape in which a side parallel to the scan line 107 is longer than a side parallel to the signal line 109 may be employed and the capacitor line 176 may extend in a direction parallel to the signal line 109.

A capacitor 174 is connected to the capacitor line 176 extending in the direction parallel to the signal line 109. The capacitor 174 includes a light-transmitting oxide semiconductor film 178, the light-transmitting pixel electrode 221, and, as a dielectric film, a light-transmitting insulating film (not illustrated in FIG. 11) which is provided over the transistor 103. That is, the capacitor 174 has a light-transmitting property.

The capacitor line 176 can be formed concurrently with the signal line 109 and the conductive film 113. When the capacitor line 176 is provided in contact with the light-transmitting conductive film 178, an area where the light-transmitting conductive film 178 and the capacitor line 176 are in contact with each other can be increased. Further, the pixel 172 has a shape in which a side parallel to the signal line 109 is shorter than a side parallel to the scan line 107;

thus, an area where the pixel electrode 121 overlaps with the capacitor line 176 can be small, resulting in a higher aperture ratio.

In FIG. 3, since the capacitor line 115 and the scan line 107 are formed at the same time, it is necessary to perform a photolithography process in order to provide an opening portion in the gate insulating film 127 for connection between the capacitor line 115 and the light-transmitting conductive film 119. However, as illustrated in FIG. 11, by forming the signal line 109 and the capacitor line 176 at the same time, the light-transmitting conductive film 119 and the capacitor line 176 can be connected to each other directly. As a result, the number of photolithography processes can be reduced. That is, the transistor, the pixel electrode connected to the transistor, and the capacitor can be manufactured by six photolithography processes.

Modification Example 4

Figure 12:
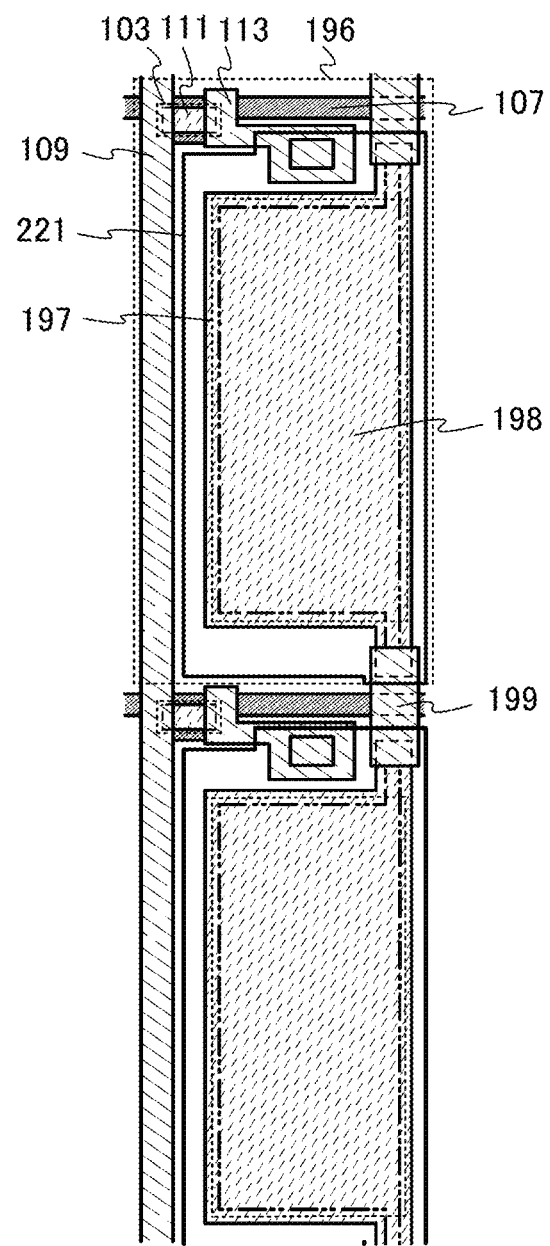
FIG. 12 is a top view illustrating a semiconductor device that is one embodiment of the present invention.

In the semiconductor device that is one embodiment of the present invention, the electrode included in the capacitor and the capacitor line can be formed using a light-transmitting conductive film. A specific example thereof is described using FIG. 12. Here, only a light-transmitting conductive film 198 which is different from the light-transmitting conductive film 119 and the capacitor line 115 described with reference to FIG. 2 is described. FIG. 12 is a top view of a pixel 196 where the light-transmitting conductive film 198 serving as one electrode of a capacitor 197 and the capacitor line is provided in the pixel 196. The light-transmitting conductive film 198 has a region which extends in a direction parallel to the signal line 109 and the region functions as the capacitor line. In the light-transmitting conductive film 198, a region which overlaps with the pixel electrode 221 functions as an electrode of the capacitor 197. Note that the light-transmitting conductive film 198 can be formed in a manner similar to that of the light-transmitting conductive film 119 illustrated in FIG. 2.

In the case where a continuous film is provided as the light-transmitting conductive film 198 for the pixels 196 in one row, the light-transmitting conductive film 198 overlaps with the scan lines 107. For this reason, the light-transmitting conductive film 198 does not function as the capacitor line and one electrode of the capacitor 197 due to an effect of a change in the potential of the scan line 107 in some cases. Thus, as illustrated in FIG. 12, the light-transmitting conductive films 198 are preferably separated from each other between the pixels 196, and the separated light-transmitting conductive films are electrically connected to each other through a conductive film 199 which can be formed by utilizing the process for forming the signal line 109 and the conductive film 113. With the above structure, a region of the light-transmitting conductive film 198 which is not connected to the conductive film 199 overlaps with the pixel electrode 221, whereby the resistance of the light-transmitting conductive film 198 in the region can be low and thus the light-transmitting conductive film 198 functions as the capacitor line and one electrode of the capacitor 197.

Although not illustrated, one light-transmitting conductive film can be provided as the light-transmitting conductive film 198 for the pixels 196 so as to overlap with the scan lines 107 in the case where a region of the light-transmitting conductive film 198 which overlaps with the scan line 107 is not influenced by a change in the potential of the scan line 107. In other words, the light-transmitting conductive film can be provided continuously in all of the pixels 196 in one row without being separated.

In FIG. 12, a region of the light-transmitting conductive film 198 which functions as the capacitor line extends in the direction parallel to the signal line 109; however, the region which functions as the capacitor line may extend in a direction parallel to the scan line 107. In the case where the region of the light-transmitting conductive film 198 which functions as the capacitor line extends in the direction parallel to the scan line 107, it is necessary that the semiconductor film 111 and the light-transmitting conductive film 198 be electrically insulated from the signal line 109 and the conductive film 113 by providing an insulating film between the semiconductor film 111 and the light-transmitting conductive film 198, and the signal line 109 and the conductive film 113, in the transistor 103 and the capacitor 197.

According to the above description, when a light-transmitting conductive film is provided for an electrode of a capacitor provided in a pixel and a capacitor line as in the pixel 196, the pixel can have a higher aperture ratio.

Modification Example 5

Figure 13:
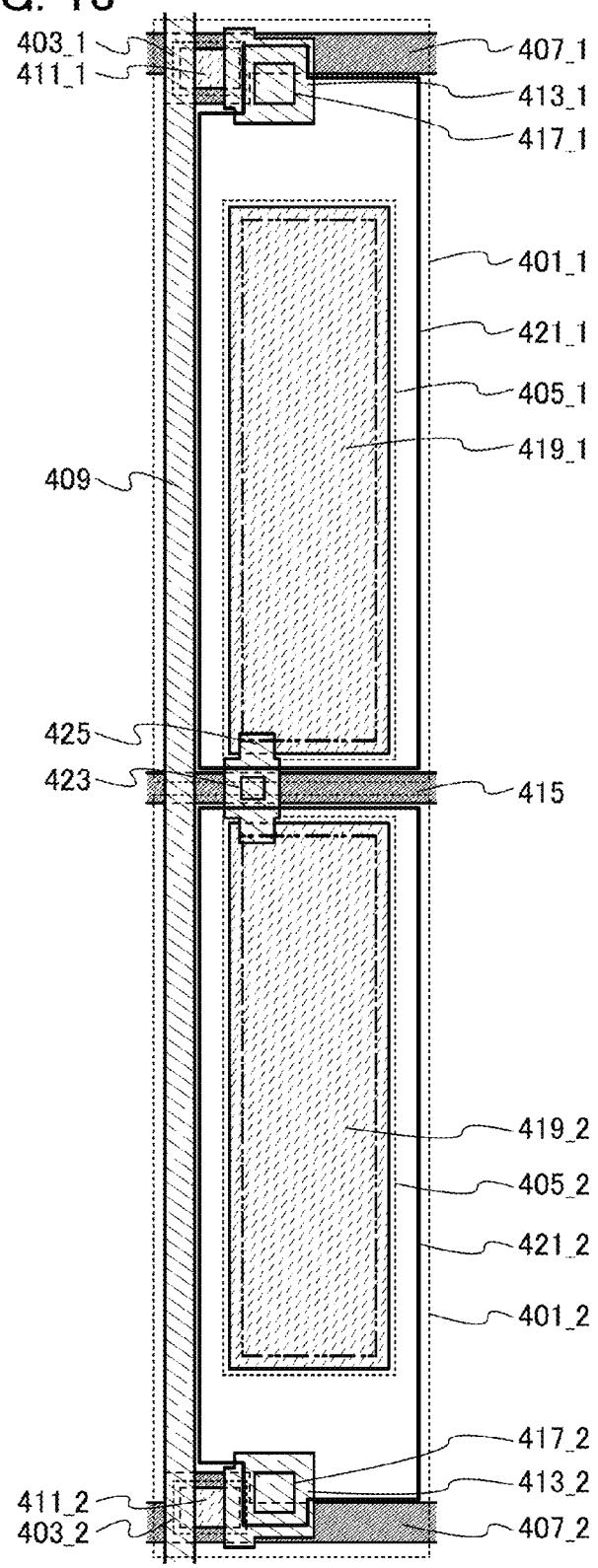
FIG. 13 is a top view illustrating a semiconductor device that is one embodiment of the present invention.

In the semiconductor device of one embodiment of the present invention, the structure of the capacitor line can be changed as appropriate. This structure is described with reference to FIG. 13. In FIG. 13, unlike the capacitor line 115 described with reference to FIG. 2, a capacitor line is located between adjacent two pixels.

FIG. 13 illustrates a structure where the capacitor line is provided between the adjacent pixels in a direction in which a signal line 409 extends. Note that a structure where the capacitor line is provided between the adjacent pixels in a direction in which a scan line 437 extends may be employed.

FIG. 13 is a top view of a pixel 401_1 and a pixel 401_2 adjacent to each other in the direction in which the signal line 409 extends.

A scan line 407_1 and a scan line 4072 are provided so as to extend in parallel to each other in the direction substantially perpendicular to the signal line 409. A capacitor line 415 is provided between the scan lines 407_1 and 4072 so as to be parallel to the scan lines 407_1 and 407_2. The capacitor line 415 is connected to a capacitor 405_1 provided in the pixel 401_1 and a capacitor 4052 provided in the pixel 401_2. Top surface shape and the positions of components of the pixel 401_1 and those of the pixel 4012 are symmetric with respect to the capacitor line 415.

The pixel 401_1 is provided with a transistor 403_1, a pixel electrode 421_1 connected to the transistor 403_1, and the capacitor 405_1.

The transistor 403_1 is provided in a region where the scan line 407_1 and the signal line 409 cross each other. The transistor 403_1 includes at least a semiconductor film 411_1 including a channel formation region, a gate electrode, a gate insulating film (not illustrated in FIG. 13), a source electrode, and a drain electrode. A region of the scan line 407_1 which overlaps with the semiconductor film 411_1 functions as the gate electrode of the transistor 403_1. A region of the signal line 409 which overlaps with the semiconductor film 411_1 functions as the source electrode of the transistor 403_1. A region of the conductive film 413_1 which overlaps with the semiconductor film 411_1 functions as the drain electrode of the transistor 403_1. The conductive film 413_2 and the pixel electrode 421_1 are connected to each other through an opening 417_1.

The capacitor 405_1 is electrically connected to the capacitor line 415 through the conductive film 425 provided in and over the opening 423. The capacitor 405_1 includes a light-transmitting conductive film 419_1, the light-transmitting pixel electrode 421_1, and, as a dielectric film, a light-transmitting insulating film (not illustrated in FIG. 13) which is provided over the transistor 403_1. That is, the capacitor 405_1 has a light-transmitting property.

The pixel 4012 is provided with a transistor 4032, a pixel electrode 421_2 connected to the transistor 4032, and a capacitor 4052.

The transistor 4032 is provided in a region where the scan line 407_2 and the signal line 409 cross each other. The transistor 4032 includes at least a semiconductor film 4112 including a channel formation region, a gate electrode, a gate insulating film (not illustrated in FIG. 13), a source electrode, and a drain electrode. A region of the scan line 4072 which overlaps with the semiconductor film 411_2 functions as the gate electrode of the transistor 4032. A region of the signal line 409 which overlaps with the semiconductor film 411_2 functions as the source electrode of the transistor 4032. A region of the conductive film 413_2 which overlaps with the semiconductor film 411_2 functions as the drain electrode of the transistor 403_2. The conductive film 413_2 and the pixel electrode 421_2 are connected to each other through an opening 417_2.

The capacitor 4052 is electrically connected to the capacitor line 415 through the conductive film 425 provided in and over the opening 423 similarly to the capacitor 405_1. The capacitor 4052 includes a light-transmitting conductive film 4192, the light-transmitting pixel electrode 4212, and, as a dielectric film, a light-transmitting insulating film (not illustrated in FIG. 13) which is included in the transistor 403_2. That is, the capacitor 4052 has a light-transmitting property.

Cross-sectional structures of the transistors 403_1 and 4032 and the capacitors 405_1 and 4052 are similar to those of the transistor 103 and the capacitor 205 illustrated in FIG. 3 and thus descriptions thereof are omitted here.

In a structure seen from above, a capacitor line is provided between adjacent two pixels so that capacitors included in the pixels and the capacitor line are connected, whereby the number of capacitor lines can be reduced. As a result, the aperture ratio of the pixel can be high as compared with the case of a structure where each pixel is provided with a capacitor line.

Modification Example 6

In the semiconductor device of one embodiment of the present invention, the shape of a transistor provided in a pixel is not limited to the shape of the transistor illustrated in FIG. 2, FIG. 4, FIG. 11, FIG. 12, and FIG. 13 and can be changed as appropriate. For example, a transistor may have a structure in which a source electrode included in the signal line 109 may have a U shape (or a C shape, a square-bracket-like shape, or a horseshoe shape) which surrounds the conductive film including a drain electrode. With such a shape, an enough channel width can be ensured even when the area of the transistor is small, and accordingly, the amount of drain current flowing at the time of conduction of the transistor (also referred to as an on-state current) can be increased.

Modification Example 7

Although the transistor where the oxide semiconductor film is provided between the signal line 109 including the gate insulating film and the source electrode and the conductive film 113 including the drain electrode is used above, instead of the transistor, a transistor in which a semiconductor film is provided between the insulating film 229, and a signal line including a source electrode and a conductive film including a drain electrode can be used.

Modification Example 8

Although a channel-etched transistor is described above, a channel-protective transistor can be used instead of the channel-etched transistor. When the channel protective film is provided, a surface of the semiconductor film 111 is not exposed to an etchant or an etching gas used in a formation process of the signal line and the conductive film, so that impurities between the semiconductor film 111 and the channel protective film can be reduced. Accordingly, a leakage current flowing between the source electrode and the drain electrode of the transistor can be reduced.

Modification Example 9

Although the transistor including one gate electrode is described above, a transistor which includes two gate electrodes that face each other with the semiconductor film 111 positioned therebetween can be used alternatively.

The transistor is the one in which a conductive film is provided over the insulating film 232 of the transistor 103 described in this embodiment. The conductive film overlaps with at least a channel formation region of the semiconductor film 111. It is preferable that the conductive film be provided in a position overlapping with the channel formation region of the semiconductor film 111 so that the potential of the conductive film is equal to the minimum potential of a video signal input to the signal line 109. In that case, a current flowing between the source electrode and the drain electrode in the surface of the semiconductor film 111 facing the conductive film can be controlled, and variations in the electrical characteristics of the transistors can be reduced. In addition, the provision of the conductive film leads to a reduction in effect of a change in ambient electric field on the semiconductor film 111; therefore, the reliability of the transistor can be improved.

The conductive film provided over the insulating film 232 can be formed as appropriate using a material and a manufacturing method similar to those of the scan line 107, the signal line 109, the pixel electrode 121, and the like.

As described above, a metal oxide having electrical characteristics of a conductor and which is obtained by providing a nitride insulating film so as to be in contact with the semiconductor film formed in the same formation process as the semiconductor film included in the transistor is used as a light-transmitting electrode of the capacitor. As a result, a semiconductor device in which the aperture ratio can be increased to, typically, 50% or higher, preferably 55% or higher, further preferably 60% or higher, and which includes the capacitor having increased charge capacity can be manufactured. Accordingly, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics and consumes less power.

Note that the structures and the like described in this embodiment can be combined as appropriate with any of the structures and the like described in the other embodiments and examples.

Modification Example 10

In the method for manufacturing the transistor, as the method for forming the light-transmitting conductive film 119, a mask which covers the semiconductor film 111 and includes an opening through which the semiconductor film 118 is exposed is formed after the step of FIG. 6B. Next, the semiconductor film 118 is exposed to a plasma generated in an atmosphere of a rare gas, a mixed gas of hydrogen and a rare gas, a mixed gas of a rare gas and ammonia, an ammonia gas, a nitrogen gas, or the like, whereby the light-transmitting conductive film 119 can be formed without the step of forming the nitride insulating film over the semiconductor film 118 as illustrated in FIG. 7B.

Alternatively, in the method for manufacturing a transistor, as the method for forming the light-transmitting conductive film 119, a mask which covers the semiconductor film 111 and includes an opening through which the semiconductor film 118 is exposed is formed after the step of FIG. 7A. Then, through the insulating film 130, the semiconductor film 118 is exposed to a plasma generated in an atmosphere of a rare gas, a mixed gas of hydrogen and a rare gas, a mixed gas of a rare gas and ammonia, an ammonia gas, a nitrogen gas, or the like, whereby the light-transmitting conductive film 119 can be formed without the step of forming the nitride insulating film over the semiconductor film 118 as illustrated in FIG. 7B.

When the oxide semiconductor film 118 is exposed to plasma, the oxide semiconductor film formed as the semiconductor film 118 is damaged and defects, typically oxygen vacancies are generated in the oxide semiconductor film. As a result, the light-transmitting conductive film 119 having reduced resistivity is formed Embodiment 2

In this embodiment, a semiconductor device of one embodiment of the present invention which has a structure different from that in the above embodiment will be described with reference to drawings. A semiconductor device of one embodiment of the present invention will be described taking a liquid crystal display device as an example in this embodiment. In the semiconductor device described in this embodiment, a light-transmitting conductive film included in a capacitor is different from that in the capacitor in the above embodiment. The above embodiment can be referred to for components in the semiconductor device in this embodiment which are similar to those of the semiconductor device in the above embodiment.

<The Structure of the Semiconductor Device>

Figure 14:
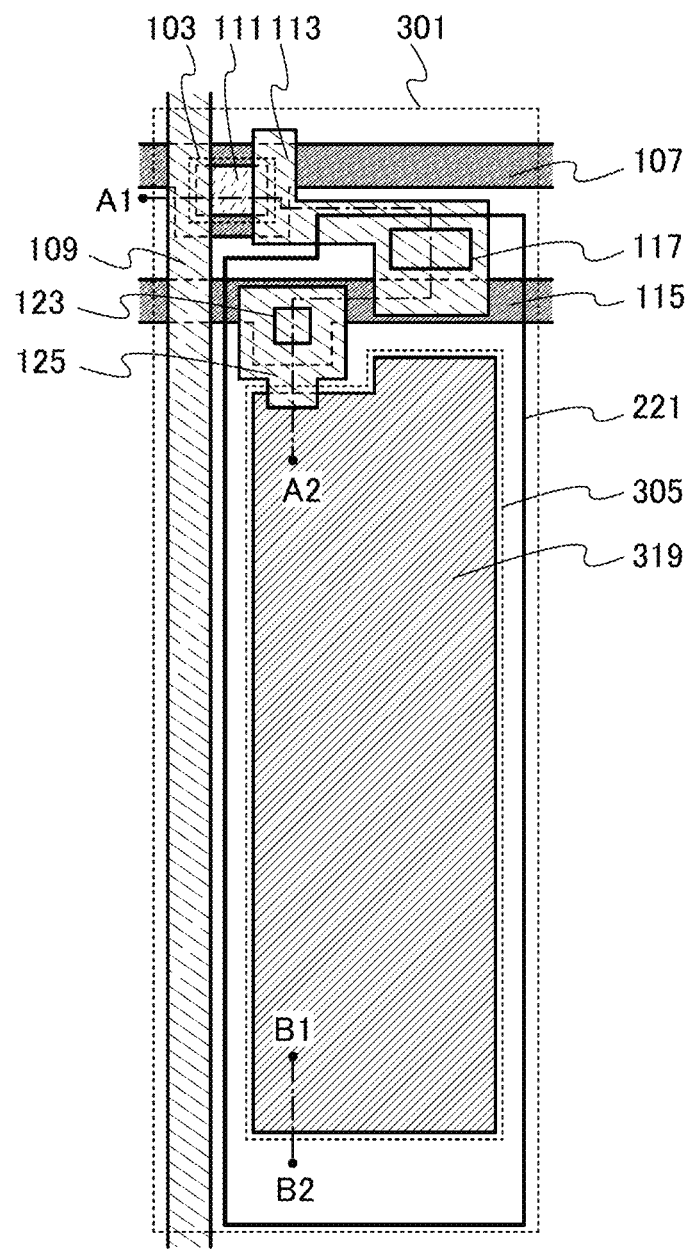
FIG. 14 is a top view illustrating a semiconductor device that is one embodiment of the present invention.

A specific example of the structure of a pixel 301 provided in a pixel portion of the liquid crystal display device described in this embodiment is described. FIG. 14 is a top view of the pixel 301. The pixel 301 illustrated in FIG. 14 includes a capacitor 305, and the capacitor 305 is provided in a region of the pixel 301 which is surrounded by the capacitor line 115 and the signal line 109. The capacitor 305 is electrically connected to the capacitor line 115 through the conductive film 125 provided in and over the opening 123. The capacitor 305 includes a light-transmitting conductive film 319, the light-transmitting pixel electrode 221, and, as a dielectric film, an insulating film (not illustrated in FIG. 14) which is provided over the transistor 103. That is, the capacitor 305 transmits light.

As an electrode of the capacitor, the light-transmitting conductive film 319 is used. That is to say, the capacitor 305 can be formed large (covers a large area) in the pixel 301.

Therefore, the semiconductor device in which the aperture ratio can be increased to, typically, 50% or higher, preferably 55% or higher, further preferably 60% or higher and includes the capacitor with increased charge capacity can be obtained.

Figure 15:
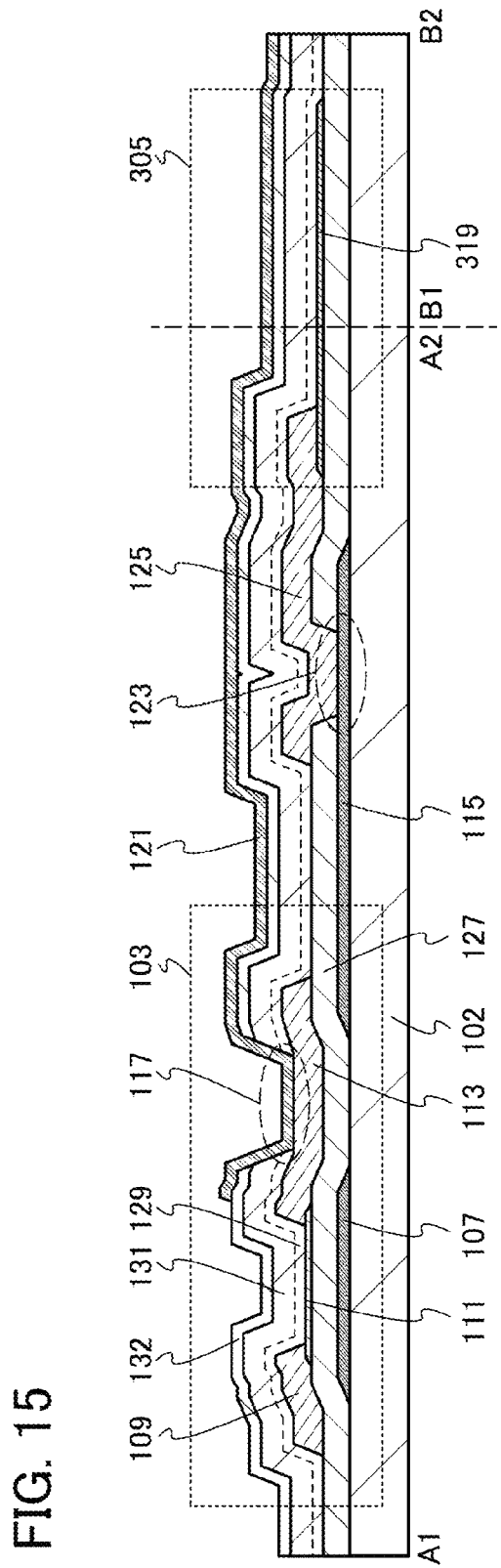
FIG. 15 is a cross-sectional view illustrating a semiconductor device that is one embodiment of the present invention.

Next, FIG. 15 is a cross-sectional view taken along dashed-dotted lines A1-A2 and B1-B2 in FIG. 14.

A cross-sectional structure of the pixel 301 of a liquid crystal display device is as follows. The scan line 107 including the gate electrode of the transistor 103 is provided over the substrate 102. The gate insulating film 127 is provided over the scan line 107. The semiconductor film 111 is provided over a region of the gate insulating film 127 which overlaps with the scan line 107, and the light-transmitting conductive film 319 is provided over the gate insulating film 127. The signal line 109 including a source electrode of the transistor 103 and the conductive film 113 including a drain electrode of the transistor 103 are provided over the semiconductor film 111 and the gate insulating film 127. The conductive film 125 which connects the light-transmitting conductive film 319 and the capacitor line 115 is provided over the gate insulating film 127. The insulating film 129, the insulating film 131, and the insulating film 132 functioning as protective insulating films of the transistor 103 are provided over the gate insulating film 127, the signal line 109, the semiconductor film 111, the conductive film 113, the conductive film 125, and the light-transmitting conductive film 319. The opening 117 reaching the conductive film 113 is formed in the insulating film 129, the insulating film 131, and the insulating film 132, and the pixel electrode 221 is provided in the opening 117 and over the insulating film 132. Note that a base insulating film may be provided between the substrate 102, and the scan line 107 and the gate insulating film 127.

In the capacitor 305 in this structure, one of a pair of electrodes is the pixel electrode 121, the other of the pair of electrodes is the light-transmitting conductive film 319, and dielectric films provided between the pair of electrodes are the insulating films 129, 131, and 132.

The light-transmitting conductive film 319 is a metal oxide film having characteristics of a conductor, which is obtained by adding an element (dopant) for increasing conductivity to a semiconductor film formed at the same time as the semiconductor film 111. That is, the light-transmitting conductive film 319 contains a metal element of an oxide semiconductor that is contained in the semiconductor film 111 and contains a dopant. The dopant is one or more selected from boron, nitrogen, fluorine, aluminum, phosphorus, arsenic, indium, tin, antimony, and a rare gas element. The concentration of the dopant contained in the light-transmitting conductive film 319 is preferably higher than or equal to $1 \times 10^{19}$ atoms/cm$^3$ and lower than or equal to $1 \times 10^{22}$ atoms/cm$^3$. Accordingly, the conductivity of the light-transmitting conductive film 319 can be greater than or equal to 10 S/cm and less than or equal to 1000 S/cm, preferably greater than or equal to 100 S/cm and less than or equal to 1000 S/cm, so that the light-transmitting conductive film 319 can sufficiently function as the electrode of the capacitor 305.

<Method for Manufacturing Semiconductor Device>

Next, a method for manufacturing the semiconductor device of this embodiment is described with reference to FIGS. 16A and 16B and FIGS. 17A and 17B.

First, the scan line 107 and the capacitor line 115 are formed over the substrate 102. The insulating film 126 which is to be processed into the gate insulating film 127 is formed over the substrate 102, the scan line 107, and the capacitor line. The semiconductor film 111 and the semiconductor film 118 are formed over the insulating film 126 (see FIG. 16A). The above steps can be performed with reference to Embodiment 1.

After that, the semiconductor film 118 is doped with a dopant to form the light-transmitting conductive film 319, the opening 123 reaching the capacitor line 115 is formed in the insulating film 126 to form the gate insulating film 127, and then the signal line 109 including the source electrode of the transistor 103, the conductive film 113 including the drain electrode of the transistor 103, and the conductive film 125 which electrically connects the light-transmitting conductive film 319 and the capacitor line 115 are formed (see FIG. 16B).

A method for doping the semiconductor film 118 with a dopant is as follows: a mask is provided in a region except the semiconductor film 118 and the semiconductor film 118 is doped with one or more dopants selected from hydrogen, boron, nitrogen, fluorine, aluminum, phosphorus, arsenic, indium, tin, antimony, and a rare gas element by an ion implantation method, an ion doping method, or the like. Alternatively, the semiconductor film 118 may be exposed to plasma containing the dopant to dope the semiconductor film 118 with the dopant, instead of employing an ion implantation method or an ion doping method. Note that heat treatment may be performed after the semiconductor film 118 is doped with the dopant. The heat treatment can be appropriately performed according to the details of heat treatment for dehydration or dehydrogenation of the semiconductor film 111 and the light-transmitting conductive film 319.

Note that the step of adding the dopant may be performed after the signal line 109, the conductive film 113, and the conductive film 125 are formed. At this time, the dopant is not added to regions of the light-transmitting conductive film 319 which are in contact with the signal line 109, the conductive film 113, and the conductive film 125.

Then, the insulating film 128 is formed over the gate insulating film 127, the signal line 109, the semiconductor film 111, the conductive film 113, the conductive film 125, and the light-transmitting conductive film 319. The insulating film 130 is formed over the insulating film 128, and an insulating film 133 is formed over the insulating film 130 (see FIG. 17A). The above steps can be performed with reference to Embodiment 1.

Then, the opening 117 reaching the conductive film 113 is formed over the insulating film 128, the insulating film 130, and the insulating film 133 to form the insulating film 129, the insulating film 131, and the insulating film 132 (see FIG. 17B). The pixel electrode 221 in contact with the conductive film 113 through the opening 117 is formed (see FIG. 15). The above steps can also be performed with reference to Embodiment 1.

Through the above steps, the semiconductor device of this embodiment can be manufactured.

As described above, a metal oxide having electrical characteristics of a conductor and which is obtained by adding a dopant to the semiconductor film formed in the same formation process as the semiconductor film included in the transistor is used as a light-transmitting electrode of the capacitor. As a result, a semiconductor device which include the capacitor whose charge capacity is increased while improving the aperture ratio can be manufactured. Accordingly, the semiconductor device can have excellent display quality.

In addition, the pair of electrodes of the capacitor 305 has conductivity, and thus sufficient charge capacity can be obtained even when the capacitor 305 has a small plane area. Note that an oxide semiconductor film transmits 80% to 90% of light; thus, when the area of the light-transmitting conductive film 319 is reduced and a region where the light-transmitting conductive film 319 is not formed is provided in the pixel 301, the transmittance with respect to light emitted from a light source such as a backlight can be increased. That is, it is possible to turn down the brightness of a light source such as a backlight, so that power consumption of the semiconductor device can be reduced.

In addition, oxygen vacancies and impurities such as hydrogen are reduced in the oxide semiconductor film that is the semiconductor film included in the transistor. As a result, the transistor can be prevented from having normally-on characteristics, so that the electrical characteristics and reliability of the semiconductor device can be improved and power consumption of the semiconductor device can be reduced.

Note that the structures and the like described in this embodiment can be combined as appropriate with any of the structures and modification examples thereof described in the other embodiments and examples.

Embodiment 3

In this embodiment, a method for forming a light-transmitting conductive film, which is different from those of Embodiments 1 and 2, is described with reference to FIGS. 6A and 6B.

In this embodiment, a metal oxide having conductivity is obtained by increasing the conductivity of an oxide semiconductor film in such a manner that the semiconductor film is irradiated with an electromagnetic wave such as visible light, ultraviolet light, X-rays, or the like. The method for forming the light-transmitting conductive film is described using FIGS. 6A and 6B.

As illustrated in FIG. 6A, as in Embodiment 1, the scan line 107 including a gate electrode and the capacitor line 115 are formed over the substrate 102. Next, the insulating film 126 is formed over the substrate 102, the scan line 107 including the gate electrode, and the capacitor line 115. Then, the semiconductor film 111 and the semiconductor film 118 are formed over the insulating film 126.

Next, the semiconductor film 118 is irradiated with an electromagnetic wave such as visible light, ultraviolet light, X-rays, or the like from the substrate 102 side. In this step, the semiconductor film 111 is shielded from light by the scan line 107 including the gate electrode, and thus is not irradiated with the electromagnetic wave, so that the conductivity thereof is not increased.

When the semiconductor film 118 is irradiated with an electromagnetic wave, a defect is generated in the semiconductor film 118. The defect serves as a carrier path, so that the conductivity of the semiconductor film 118 is increased and the semiconductor film 118 becomes a metal oxide having electrical characteristics of a conductor. The metal oxide can be used as the light-transmitting conductive film that serves as the electrode of the capacitor.

Note that unlike in Embodiment 1, a step of etching part of the insulating film 128 and part of the insulating film 130 is not needed in this embodiment. Further, unlike in Embodiment 2, a step of forming a mask for adding a dopant to the semiconductor film 118 is not needed. Accordingly, the number of photomasks can be reduced, and simplification of the manufacturing process and cost saving can be achieved.

Embodiment 4

In this embodiment, a semiconductor device of one embodiment of the present invention will be described taking, as an example, a fringe field switching (FFS) mode liquid crystal display device in which liquid crystal molecules are oriented with a lateral electric field. Note that the above embodiments can be referred to for components in the semiconductor device described in this embodiment.

<Structure of Semiconductor Device>

FIGS. 18A and 18B are top views of a pixel 501 described in this embodiment. FIG. 18A is a top view of the pixel 501 where a common electrode 521 is not provided, and FIG. 18B is a top view of the pixel 501 where the common electrode 521 is provided in FIG. 18A.

The pixel 501 in FIGS. 18A and 18B includes the transistor 103 and a capacitor 505 connected to the transistor 103. The capacitor 505 includes a light-transmitting conductive film 519, a common electrode 521 formed using a light-transmitting conductive film, and a light-transmitting insulating film (not illustrated in FIGS. 18A and 18B) provided over the transistor 103. That is to say, the capacitor 505 has a light-transmitting property. Further, the light-transmitting conductive film 519 is connected to the conductive film 113 in the transistor 103 and functions as a pixel electrode. The common electrode 521 has openings (slits). By application of an electric field between the common electrode and the pixel electrode, a region where the light-transmitting conductive film 519, the light-transmitting insulating film, and the common electrode 521 overlap one another functions as a capacitor and the liquid crystals can be controlled so as to be oriented in the direction parallel with a substrate. Thus, an FFS mode liquid crystal display device achieves a wide viewing angle and high image quality.

Figure 19:
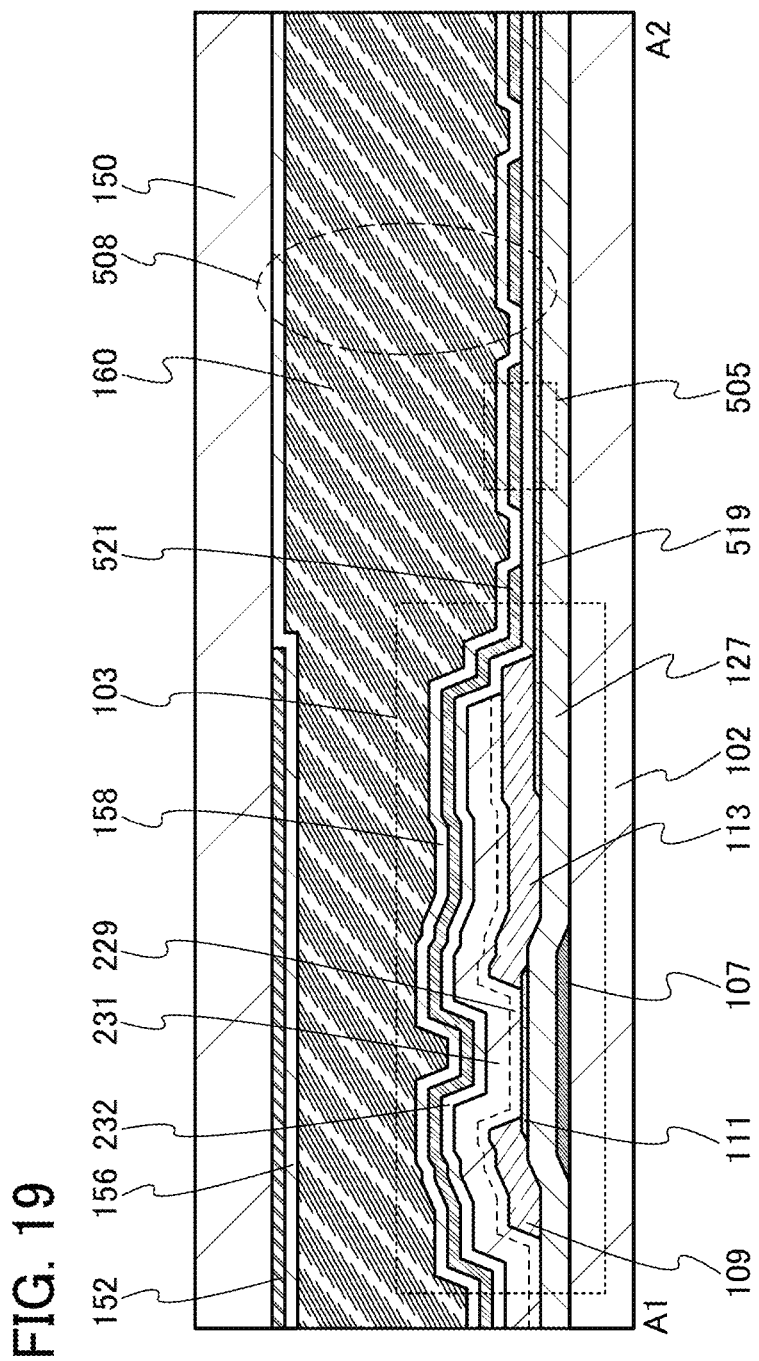
FIG. 19 is a cross-sectional view illustrating a semiconductor device that is one embodiment of the present invention.

FIG. 19 is a cross-sectional view of the substrate 102 along dashed-dotted line A1-A2 in FIG. 18B.

A cross-sectional structure of the pixel 501 of this embodiment is as follows. A scan line 107 including the gate electrode of the transistor 103 is provided over the substrate 102. The gate insulating film 127 is provided over the scan line 107. The semiconductor film 111 is provided over a region of the gate insulating film 127 which overlaps with the scan line 107, and the light-transmitting conductive film 519 is provided over the gate insulating film 127. The signal line 109 including the source electrode of the transistor 103 and the conductive film 113 including the drain electrode of the transistor 103 are provided over the semiconductor film 111 and the gate insulating film 127. The conductive film 113 including the drain electrode is connected to the light-transmitting conductive film 519, and the light-transmitting conductive film 519 functions as a pixel electrode. The insulating film 229, the insulating film 231, and the insulating film 232 functioning as protective insulating films of the transistor 103 are provided over the gate insulating film 127, the signal line 109, the semiconductor film 111, and the conductive film 113. The insulating film 232 is provided over the light-transmitting conductive film 519 and the common electrode 521 is provided the insulating film 232. The common electrode 521 is provided continuously without being separated between pixels in the pixel portion. Note that a base insulating film may be provided between the substrate 102, and the scan line 107 and the gate insulating film 127.

The light-transmitting conductive film 519 can be formed in a manner similar to that of the light-transmitting conductive described in any of Embodiments 1 to 3. The common electrode 521 can be formed using a material similar to that of the pixel electrode 221 described in Embodiment 1.

As in the capacitor 505 of this embodiment, the light-transmitting conductive film 519 is connected to the conductive film 113 of the transistor, whereby the conductive film 113 and the light-transmitting conductive film 519 can be directly connected to each other without forming an opening portion, and the planarity of the transistor 103 and the capacitor 505 can be improved. Further, a capacitor line is not provided and the common electrode 521 having a light-transmitting property is made to function as a capacitor line, so that the aperture ratio of the pixel 501 can be further increased.

Embodiment 5

In this embodiment, one embodiment which can be applied to an oxide semiconductor film, which is a semiconductor film, in the transistor and the capacitor included in the semiconductor device described in the above embodiment will be described.

The oxide semiconductor film is preferably formed using any of an amorphous oxide semiconductor, a single crystal oxide semiconductor, a polycrystalline oxide semiconductor, and an oxide semiconductor including a crystalline portion (a c-axis aligned crystalline oxide semiconductor (CAAC-OS).

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel with a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel with the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel with a normal vector of a formation surface or a normal vector of a top surface. Thus, each metal atom layer arranged in a layered manner observed in the cross-sectional TEM image corresponds to a plane parallel with the a-b plane of the crystal.

Note that the crystal part is formed concurrently with deposition of the CAAC-OS film or is formed through crystallization treatment such as heat treatment. As described above, the c-axis of the crystal is aligned with a direction parallel with a normal vector of a formation surface or a normal vector of a top surface. Thus, for example, in the case where a shape of the CAAC-OS film is changed by etching or the like, the c-axis might not be necessarily parallel with a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

There are three methods for forming a CAAC-OS film.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature in the range of 200° C. to 700° C., to form, in the oxide semiconductor film, crystal parts in which the c-axes are aligned in the direction parallel with a normal vector of a surface where the oxide semiconductor film is formed or a normal vector of a surface of the oxide semiconductor film.

The third method is to form a first oxide semiconductor film with a small thickness, then heat it at a temperature in the range of 200° C. to 700° C., and form a second oxide semiconductor film to form, in the second oxide semiconductor film, crystal parts in which the c-axes are aligned in the direction parallel with a normal vector of the surface where the second oxide semiconductor film is formed or to a normal vector of the top surface of the second oxide semiconductor film.

In a transistor using the CAAC-OS film as the oxide semiconductor film, change in electrical characteristics due to irradiation with visible light or ultraviolet light is small. Thus, the transistor using the CAAC-OS film as the oxide semiconductor film has high reliability.

Further, it is preferable that the CAAC-OS film be formed by a sputtering method using a polycrystalline oxide semiconductor sputtering target. When ions collide with the sputtering target, a crystal region included in the sputtering target may be separated from the target along an a-b plane; in other words, a flat-plate-like or pellet-like sputtered particle having a plane parallel with an a-b plane may flake off from the sputtering target. In this case, the flat-plate-like or pellet-like sputtered particle reaches a surface where the CAAC-OS film is to be deposited while maintaining its crystal state, whereby the CAAC-OS film can be deposited.

For the deposition of the CAAC-OS film, the following conditions are preferably used.

By reducing the mixing of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C. By increasing the temperature of the surface where the CAAC-OS film is formed during the deposition, when the flat-plate-like or pellet-like sputtered particle reaches the surface where the CAAC-OS film is formed, migration occurs on the surface, so that flat planes of the sputtered particles are attached to the surface.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The polycrystalline In—Ga—Zn—O compound target is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. X, Y, and Z are each a given positive number. Here, the predetermined molar ratio of InO$_X$ powder to GaO$_Y$ powder and $ZnO_z$ powder is, for example, 2:2:1, 8:4:3, 3:1:1, 1:1:1, 4:2:3, or 3:1:2. The kinds of powders and the molar ratio for mixing the powders may be determined as appropriate depending on the desired sputtering target.

Further, the oxide semiconductor film may have a structure in which a plurality of oxide semiconductor films are stacked. For example, the oxide semiconductor film may have a layered structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure where the constituent elements of the first oxide semiconductor film and the second oxide semiconductor film are the same while the atomic ratios of the constituent elements of the first oxide semiconductor film and the second oxide semiconductor film are different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

In this case, in one of the first oxide semiconductor film and the second oxide semiconductor film, which is closer to the gate electrode (the oxide semiconductor film on the channel side), the atomic ratio of In to Ga is preferably as follows: In≥Ga. In the other oxide semiconductor film, which is farther from the gate electrode (the oxide semiconductor film on the back channel side), the atomic ratio of In to Ga is preferably as follows: In <Ga. With a layered structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby a variation in threshold voltage of a transistor due to a change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

Alternatively, the oxide semiconductor film may have a three-layer structure of a first oxide semiconductor film, a second oxide semiconductor film, and a third oxide semiconductor film, in which the constituent elements thereof are the same and the atomic ratios of the constituent elements of the first oxide semiconductor film, the second oxide semiconductor film, and the third oxide semiconductor film are different. The case where the oxide semiconductor film has a three-layer structure is described with reference to FIG. 20.

Figure 20:
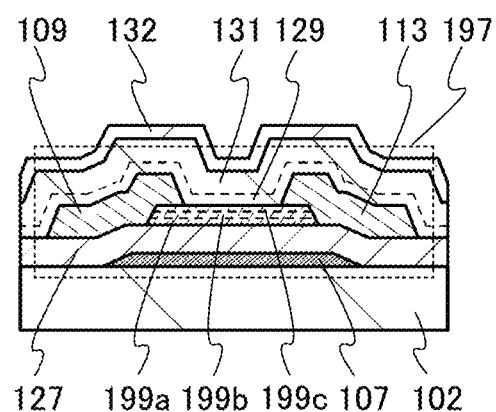
FIG. 20 is a cross-sectional view illustrating a semiconductor device that is one embodiment of the present invention.

In a transistor illustrated in FIG. 20, a first oxide semiconductor film 199a, a second oxide semiconductor film 199b, and a third oxide semiconductor film 199c are stacked in this order from the gate insulating film 127 side. As a material of the first oxide semiconductor film 199a and the third oxide semiconductor film 199c, a material represented by $InM1_xZn_yO_z$ (x≥1, y≥1, z>0, M1=Ga, Hf, or the like) is used. Note that in the case where a material of the first oxide semiconductor film 199a and the third oxide semiconductor film 199c contains Ga, a material containing a large proportion of Ga, specifically, a material which can be represented by $InM1_xZn_yO_z$ where x is larger than 10 is unsuitable because powder might be generated in deposition.

As a material of the second oxide semiconductor film 199b, a material which can be represented by $InM2_xZn_yO_z$ (x≥1, y≥x, z>0, M2=Ga, Sn, or the like) is used.

Materials of the first to third oxide semiconductor films 199a to 199c are appropriately selected so that a well structure is formed in which the conduction band in the second oxide semiconductor film 199b is deeper from the vacuum level than the conduction band in the first and third oxide semiconductor films 199a and 199c.

Note that silicon and carbon, which are Group 14 elements, are donor supply sources in an oxide semiconductor film, so that silicon or carbon contained in an oxide semiconductor film makes it n-type. Thus, the concentration of silicon contained in an oxide semiconductor film and the concentration of carbon contained in an oxide semiconductor film are each less than or equal to $3\times10^{18}/cm^3$, preferably less than or equal to $3\times10^{17}/cm^3$. It is particularly preferable to employ a structure where the first and third oxide semiconductor films 199a and 199c sandwich or surround the second oxide semiconductor film 199b serving as a carrier path so that a large number of Group 14 elements do not enter the second oxide semiconductor film 199b. That is to say, the first and third oxide semiconductor films 199a and 199c can also be called barrier films which prevent Group 14 elements such as silicon and carbon from entering the second oxide semiconductor film 199b For example, the atomic ratio of In to Ga and Zn in the first oxide semiconductor film 199a may be 1:3:2, the atomic ratio of In to Ga and Zn in the second oxide semiconductor film 199b may be 3:1:2, and the atomic ratio of In to Ga and Zn in the third oxide semiconductor film 199c may be 1:1:1. Note that the third oxide semiconductor film 199c can be formed by a sputtering method using an oxide target containing In, Ga, and Zn at an atomic ratio of 1:1:1.

Alternatively, a three-later structure may be employed in which the first oxide semiconductor film 199a contains In, Ga, and Zn at an atomic ratio of 1:3:2, the second oxide semiconductor film 199b contains In, Ga, and Zn at an atomic ratio of 1:1:1 or 1:3:2, and the third oxide semiconductor film 199c contains In, Ga, and Zn at an atomic ratio of 1:3:2.

Since the constituent elements of the first to third oxide semiconductor films 199a to 199c are the same, the second oxide semiconductor film 199b has few defect states (trap levels) at the interface with the first oxide semiconductor film 199a. Specifically, the defect state density (trap level density) is lower than the interface between the gate insulating film 127 and the first oxide semiconductor film 199a. For this reason, when the oxide semiconductor films are stacked in the above manner, a variation in the threshold voltage of a transistor due to a change over time or a reliability test can be reduced.

Further, when materials of the first to third oxide semiconductor films 199a to 199c are appropriately selected so that a well structure is formed in which the conduction band in the second oxide semiconductor film 199b is deeper from the vacuum level than the conduction band in the first and third oxide semiconductor films, the field-effect mobility of the transistor can be increased and a variation in the threshold voltage of the transistor due to a change over time or a reliability test can be reduced.

Further, the first to third oxide semiconductor films 199a to 199c may be formed using oxide semiconductor films having different crystallinities. That is, the first to third oxide semiconductor films may be formed using any of a single crystal oxide semiconductor film, a polycrystalline oxide semiconductor film, a microcrystalline oxide semiconductor film, an amorphous oxide semiconductor film, and a CAAC-OS film, as appropriate. When an amorphous oxide semiconductor film is used as any one of the first to third oxide semiconductor films 199a to 199c, internal stress or external stress of the oxide semiconductor film is relieved, variations in characteristics of a transistor is reduced and a variation in the threshold voltage of the transistor due to a change over time or a reliability test can be reduced.

At least the second oxide semiconductor film 199b, which can serve as a channel formation region, is preferably a CAAC-OS film. An oxide semiconductor film on the back channel side, in this embodiment, the third oxide semiconductor film 199c is preferably an amorphous oxide semiconductor film or a CAAC-OS film. With such a structure, a variation in the threshold voltage of a transistor due to a change over time or a reliability test can be reduced.

Note that the structures and the like described in this embodiment can be combined as appropriate with any of the structures and the like described in the other embodiments and examples.

Embodiment 6

A semiconductor device (also referred to as a display device) having a display function can be fabricated using a transistor and a capacitor examples of which are described in the above embodiments. Further, part or all of a driver circuit which includes a transistor can be formed over a substrate where a pixel portion is formed, whereby a system-on-panel can be formed. In this embodiment, examples of display devices using the transistor examples which are shown in the above embodiments will be described with reference to FIGS. 21A to 21C, FIGS. 22A and 22B, and FIGS. 23A to 23C. FIGS. 22A and 22B are cross-sectional views illustrating cross-sectional structures taken along dashed-dotted line M-N in FIG. 21B. Note that FIGS. 22A and 22B each illustrate only part of the structure of a pixel portion.

Figure 21A:
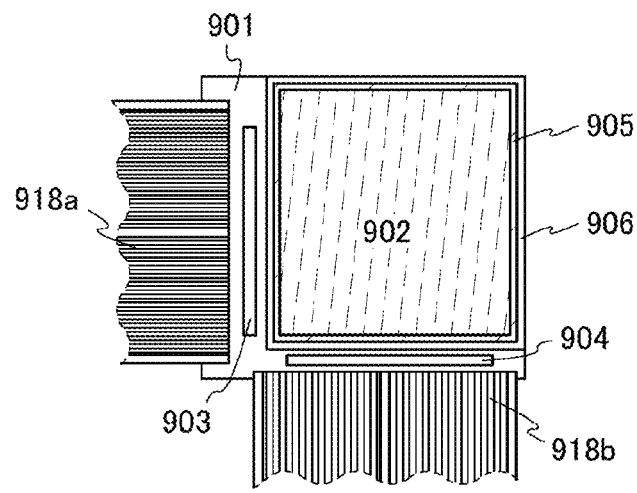
FIGS. 21A to 21C are each a top view illustrating a semiconductor device that is one embodiment of the present invention.

In FIG. 21A, a sealant 905 is provided so as to surround a pixel portion 902 provided over a first substrate 901, and the pixel portion 902 is sealed with the sealant 905 and a second substrate 906. In FIG. 21A, a signal line driver circuit 903 and a scan line driver circuit 904 each are formed using a single-crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 21B:
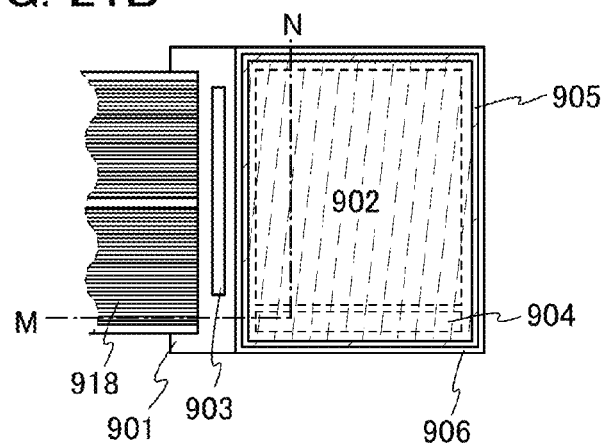
Figure 21C:
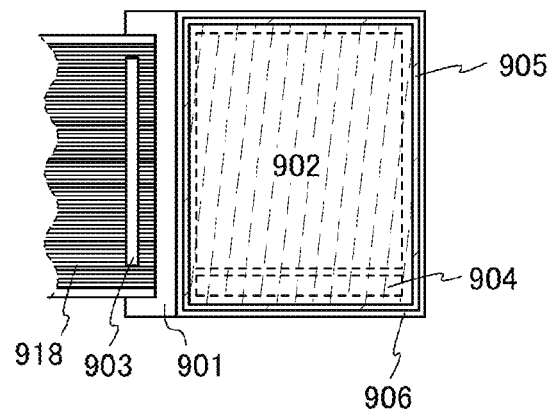

In FIGS. 21B and 21C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element, with the first substrate 901, the sealant 905, and the second substrate 906. In FIGS. 21B and 21C, a signal line driver circuit 903 formed using a single crystal semiconductor or a polycrystalline semiconductor over a substrate separately prepared is mounted in a region different from the region surrounded by the sealant 905 over the first substrate 901. In FIGS. 21B and 21C, various signals and potentials are supplied to the signal line driver circuit 903, the scan line driver circuit 904, and the pixel portion 902 from an FPC 918.

Although FIGS. 21B and 21C each illustrate an example in which the signal line driver circuit 903 is formed separately and mounted on the first substrate 901, this structure is not necessarily employed. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 21A illustrates an example in which the signal line driver circuit 903 and the scan line driver circuit 904 are mounted by a COG method. FIG. 21B illustrates an example in which the signal line driver circuit 903 is mounted by a COG method. FIG. 21C illustrates an example in which the signal line driver circuit 903 is mounted by a TAB method.

The display device includes in its category a panel in which a display element is sealed, and a module in which an IC and the like including a controller are mounted on the panel.

Note that the display device in this specification refers to an image display device or a display device. The display device may serve as a light source (including a lighting device). Furthermore, the display device also includes all the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit which are provided over the first substrate include a plurality of transistors; any of the transistors described in the above embodiments can be used therein.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element and an organic EL element. Furthermore, a display medium whose contrast is changed by an electric effect of electronic ink or the like can be used. FIGS. 22A and 22B each illustrates an example of a liquid crystal display device including a liquid crystal element as a display element.

The liquid crystal display device illustrated in FIG. 22A is a vertical electric field mode liquid crystal display device. The liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930. The terminal electrode 916 is formed using the same conductive film as source and drain electrodes of transistors 910 and 911.

Further, the pixel portion 902 and the scan line driver circuit 904 which are provided over the first substrate 901 each include a plurality of transistors, and the transistor 910 included in the pixel portion 902 and the transistor 911 included in the scan line driver circuit 904 are illustrated as an examples. An insulating film 924 corresponding to the insulating film 229 and the insulating film 231 and an insulating film 934 corresponding to the insulating film 232 in Embodiment 1 are provided over the transistor 910 and the transistor 911. Note that an insulating film 923 serves as a base film.

In this embodiment, the transistor described in the above embodiment can be used as the transistor 910. A capacitor 926 is formed using a light-transmitting conductive film 927, the insulating film 924, and the first electrode 930. The light-transmitting conductive film 927 is connected to a capacitor wiring 929 through an electrode 928. The electrode 928 is formed using the same materials and steps as the source and drain electrodes of the transistors 910 and 911. The capacitor wiring 929 is formed using the same materials and steps as gate electrodes of the transistors 910 and 911. Although the capacitor described in Embodiment 1 is illustrated as the capacitor 926 here, any of the capacitors in the other embodiments may be used as appropriate.

The transistor 910 included in the pixel portion 902 is electrically connected to a display element so that a display panel is formed. There is no particular limitation on the display element as long as display can be performed, and any of various kinds of display elements can be used.

A liquid crystal element 913 serving as a display element includes the first electrode 930, a second electrode 931, and a liquid crystal layer 908. An insulating film 932 and an insulating film 933 each serving as an alignment film are provided so that the liquid crystal layer 908 is interposed therebetween. The second electrode 931 is provided on the second substrate 906 side, and the first electrode 930 overlaps with the second electrode 931 with the liquid crystal layer 908 interposed therebetween.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using materials similar to those of the pixel electrode 221 and the counter electrode 154 in Embodiment 1 as appropriate.

A spacer 935 is a columnar spacer obtained by selectively etching an insulating film and is provided in order to control the distance (cell gap) between the first electrode 930 and the second electrode 931. Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal which exhibits a blue phase and for which an alignment film is unnecessary may be used. A blue phase is one of liquid crystal phases, which is generated just before a cholesteric phase changes into an isotropic phase while temperature of cholesteric liquid crystal is increased. The blue phase appears only in a narrow temperature range; therefore, a liquid crystal composition into which a chiral material is mixed in order to widen the temperature range is used for the liquid crystal layer. Note that the alignment film is formed using an organic resin containing hydrogen, water, or the like, which might degrade the electrical characteristics of the transistor in the semiconductor device of one embodiment of the present invention. In view of the above, the use of liquid crystal which exhibits a blue phase for the liquid crystal layer 160 enables fabrication of the semiconductor device of one embodiment of the present invention without an organic resin, so that the semiconductor device can be highly reliable.

The first substrate 901 and the second substrate 906 are fixed in place by the sealant 925. As the sealant 925, an organic resin such as a thermosetting resin or a photocurable resin can be used. The sealant 925 is in contact with the insulating film 924. The sealant 925 corresponds to the sealant 905 illustrated in FIGS. 21A to 21C.

In the liquid crystal display device, a black matrix (light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protective circuit is preferably formed using a nonlinear element.

Next, a transverse electric field mode liquid crystal display device is described with reference to FIG. 22B. FIG. 22B is an FFS mode liquid crystal display device which is one example of transverse electric field mode liquid crystal display devices. A structure different from that of the transverse electric field mode liquid crystal display device described in Embodiment 4 is described.

In the liquid crystal display device illustrated in FIG. 22B, the connection terminal electrode 915 is formed using the same material and steps as a first electrode 940, and the terminal electrode 916 is formed using the same material and steps as the source and drain electrodes of the transistors 910 and 911.

A liquid crystal element 943 includes the first electrode 940, a second electrode 941, and the liquid crystal layer 908 which are formed over the insulating film 924. Note that the liquid crystal element 943 can have a structure similar to that of the capacitor 205 of Embodiment 1. The first electrode 940 can be formed using the material of the first electrode 930 illustrated in FIG. 22A as appropriate. The planar shape of the first electrode 940 is a comb-like shape, a staircase-like shape, a ladder-like shape, or the like. The second electrode 941 functions as a common electrode and can be formed in a manner similar to that of the light-transmitting conductive film described in any of Embodiments 1 to 3. The insulating film 924 is provided between the first electrode 940 and the second electrode 941.

The second electrode 941 is connected to a common wiring 946 through an electrode 945. Note that the electrode 945 is formed using the same conductive film as the source and drain electrodes of the transistors 910 and 911. The common wiring 946 is formed using the same material and steps as the gate electrodes of the transistors 910 and 911. Although the description is made using the capacitor described in Embodiment 1 as the liquid crystal element 943 here, any of the capacitors described in the other embodiments can be used as appropriate.

Figure 23A:
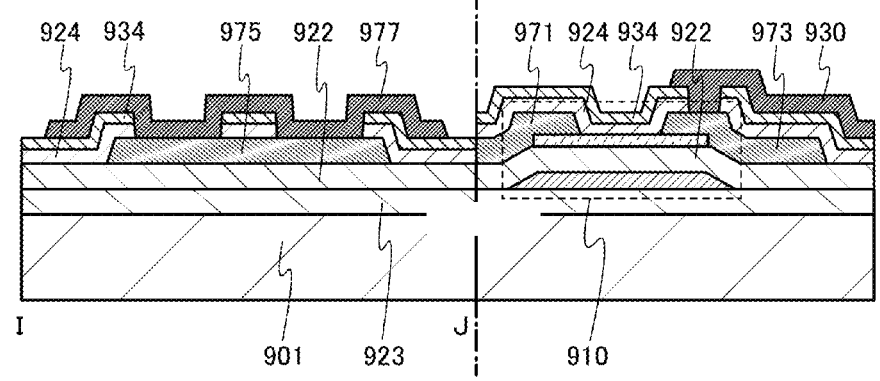
FIGS. 23A to 23C are cross-sectional views and a top view illustrating a semiconductor device that is one embodiment of the present invention.
Figure 23B:
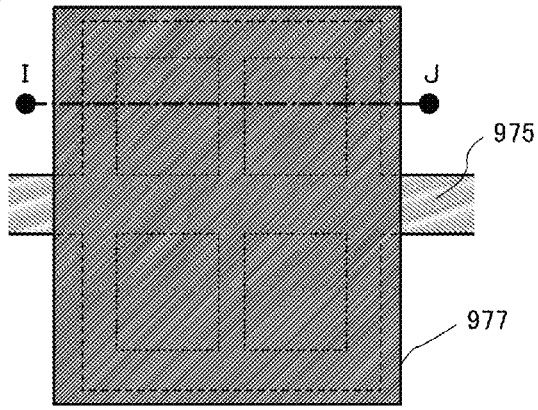
Figure 23C:
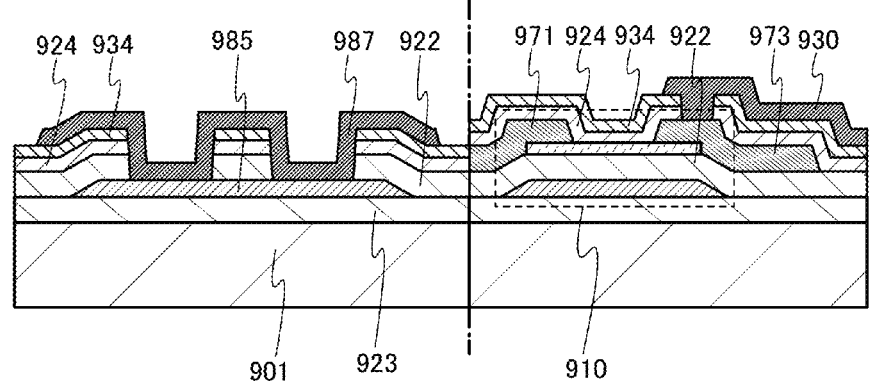

FIGS. 23A to 23C illustrate examples of the liquid crystal display device in FIG. 22A in which a common connection portion (pad portion) for being electrically connected to the second electrode 931 provided over the substrate 906 is formed over the substrate 901.

The common connection portion is provided in a position overlapping the sealant for bonding the substrate 901 and the substrate 906 and is electrically connected to the second electrode 931 through conductive particles contained in the sealant. Alternatively, the common connection portion is provided in a position which does not overlap the sealant (except for the pixel portion) and a paste containing conductive particles is provided separately from the sealant so as to overlap the common connection portion, whereby the common connection portion is electrically connected to the second electrode 931.

FIG. 23A is a cross-sectional view of the common connection portion taken along I-J in the top view in FIG. 23B.

A common potential line 975 is provided over a gate insulating film 922 and is formed using the same material and steps as source and drain electrodes 971 and 973 of the transistor 910 illustrated in FIGS. 23A to 23C.

Further, the common potential line 975 is covered with the insulating films 924 and 934, and a plurality of openings is formed in the insulating films 924 and 934 at positions overlapping the common potential line 975. These openings are formed through the same steps as a contact hole which connects the first electrode 930 and one of the source electrode 971 and the drain electrode 973 of the transistor 910.

Further, the common potential line 975 is connected to the common electrode 977 through the openings. The common electrode 977 is provided over the insulating film 934 and formed using the same material and steps as the connection terminal electrode 915 and the first electrode 930 in the pixel portion.

In this manner, the common connection portion can be formed in the same process as the switching element in the pixel portion 902.

The common electrode 977 is in contact with the conductive particles contained in the sealant and is electrically connected to the second electrode 931 of the substrate 906.

Alternatively, as illustrated in FIG. 23C, a common potential line 985 may be formed using the same material and steps as the gate electrode of the transistor 910.

In the common connection portion in FIG. 23C, the common potential line 985 is provided under the gate insulating film 922, the insulating film 924, and the insulating film 934, and a plurality of openings is formed in the gate insulating film 922, the insulating film 924, and the insulating film 934 at positions overlapping the common potential line 985. These openings are formed by etching the insulating film 924 and further selectively etching the gate insulating film 922, through the same steps as a contact hole which connects the first electrode 930 and one of the source electrode 971 and the drain electrode 973 of the transistor 910.

Further, the common potential line 985 is connected to the common electrode 987 through the openings. The common electrode 987 is provided over the insulating film 924 and formed using the same material and steps as the connection terminal electrode 915 and the first electrode 930 in the pixel portion.

As described above, the use of the transistor and capacitor described in the above embodiment allows fabrication of a semiconductor device including the capacitor whose charge capacity is increased while improving the aperture ratio. As a result, the semiconductor device can have an excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics and consumes less power.

Note that the structures and the like described in this embodiment can be combined as appropriate with any of the structures and the like described in the other embodiments and examples.

Embodiment 7

Figure 24A:
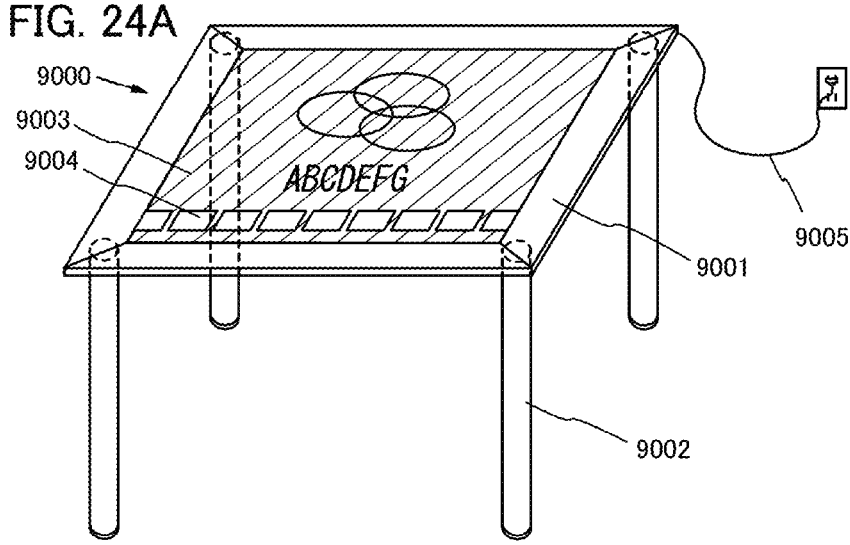
FIGS. 24A to 24C illustrate electronic appliances each including a semiconductor device that is one embodiment of the present invention.
Figure 24B:
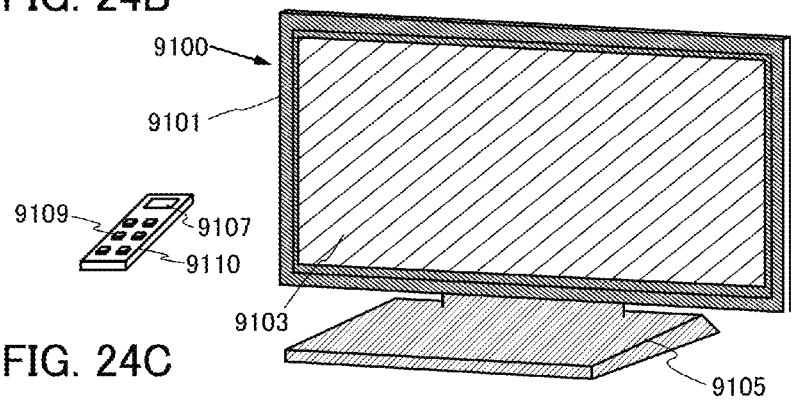
Figure 24C:
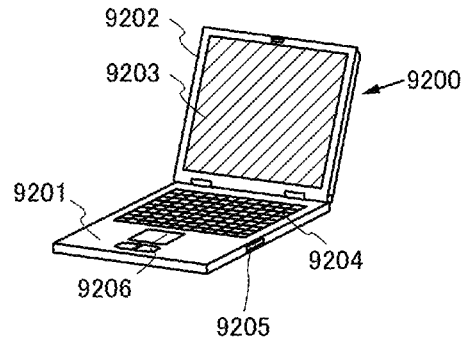

The semiconductor device of one embodiment of the present invention can be used in various electronic appliances (including game machines). Examples of electronic appliances are a television set (also referred to as a television or a television receiver), a monitor of a computer or the like, cameras such as a digital camera and a digital video camera, a digital photo frame, a mobile phone, a portable game machine, a portable information terminal, an audio reproducing device, game machines (e.g., a pachinko machine and a slot machine), and a game console. FIGS. 24A to 24C illustrate examples of these electronic appliances.

FIG. 24A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

Any of the semiconductor devices described in the above embodiments can be used for the display portion 9003. Thus, the display portion 9003 can have high display quality.

The display portion 9003 functions as a touch panel. When a user touches displayed buttons 9004 which are displayed on the display portion 9003 of the table 9000 with his/her finger or the like, the user can carry out operation on the screen and data input. Further, when the table may be made to communicate with home appliances or control the home appliances, the table 9000 may function as a control device which controls the home appliances by operation on the screen. For example, with the use of a semiconductor device having an image sensor function, the display portion 9003 can function as a touch panel.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 24B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller

9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 24B is provided with a receiver, a modem, and the like. With the use of the receiver, the television set 9100 can receive general television broadcasts. Moreover, when the television set 9100 is connected to a wired or wireless communication network via the modem, one-way (from a sender to a receiver) or two-way (between a sender and a receiver or between receivers) data communication can be performed.

Any of the semiconductor devices described in the above embodiments can be used for the display portions 9103 and 9107. Thus, the television set can have high display quality.

FIG. 24C illustrates a computer 9200 including a main body 9201, a housing 9202, a display portion 9203, a keyboard 9204, an external connection port 9205, and a pointing device 9206.

Any of the semiconductor devices described in the above embodiments can be used for the display portion 9203. Thus, the computer 9200 can have high display quality.

Figure 25A:
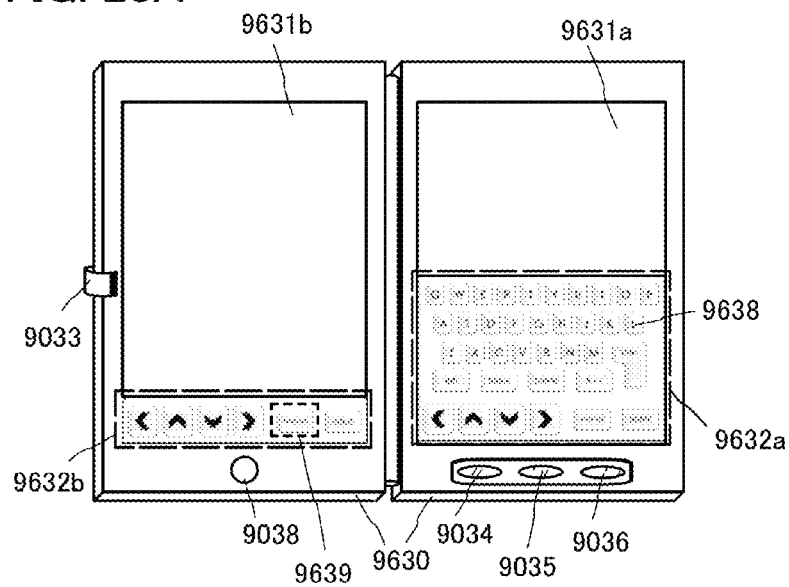
FIGS. 25A to 25C illustrate an electronic appliance including a semiconductor device that is one embodiment of the present invention.
Figure 25B:
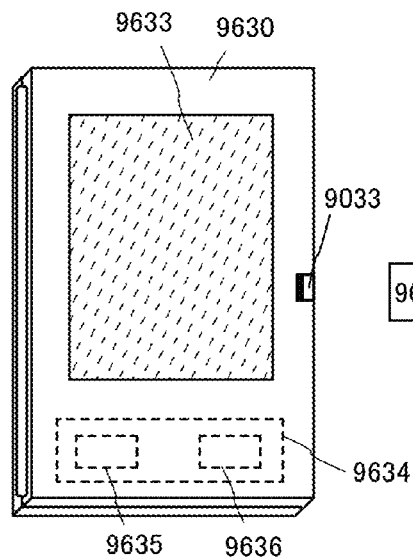

FIGS. 25A and 25B illustrate a foldable tablet terminal. FIG. 25A illustrates the tablet terminal in the state of being unfolded. The tablet terminal includes a housing 9630, a display portion 9631a, a display portion 9631b, a display-mode switching button 9034, a power button 9035, a power-saving-mode switching button 9036, a fastener 9033, and an operation button 9038.

Any of the semiconductor devices described in the above embodiments can be used for the display portion 9631a and the display portion 9631b, so that the tablet terminal can have high reliability.

A touch panel area 9632a can be provided in part of the display portion 9631a, in which area, data can be input by touching displayed operation keys 9638. Note that half of the display portion 9631a has only a display function and the other half has a touch panel function. However, the structure of the display portion 9631a is not limited to this, and all the area of the display portion 9631a may have a touch panel function. For example, a keyboard can be displayed on the whole display portion 9631a to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal In addition to the optical sensor, other detecting devices such as sensors for determining inclination, such as a gyroscope or an acceleration sensor, may be incorporated in the tablet terminal.

Although the display area of the display portion 9631a is the same as that of the display portion 9631b in FIG. 25A, one embodiment of the present invention is not particularly limited thereto. The display area of the display portion 9631a may be different from that of the display portion 9631b, and further, the display quality of the display portion 9631a may be different from that of the display portion 9631b. For example, one of the display portions 9631a and 9631b may display higher definition images than the other.

FIG. 25B illustrates the tablet terminal in the state of being closed. The tablet terminal includes the housing 9630, a solar cell 9633, and a charge and discharge control circuit 9634. FIG. 25B illustrates an example where the charge and discharge control circuit 9634 includes a battery 9635 and a DC-DC converter 9636.

Since the tablet terminal can be folded, the housing 9630 can be closed when the tablet terminal is not in use. Thus, the display portions 9631a and 9631b can be protected, which permits the tablet terminal to have high durability and improved reliability for long-term use.

The tablet terminal illustrated in FIGS. 25A and 25B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on a surface of the tablet terminal, can supply electric power to a touch panel, a display portion, an image signal processor, and the like. Note that the solar cell 9633 can be provided on one or both surfaces of the housing 9630 and thus the battery 9635 can be charged efficiently. The use of a lithium-ion battery as the battery 9635 has advantages such as a reduction in size.

Figure 25C:
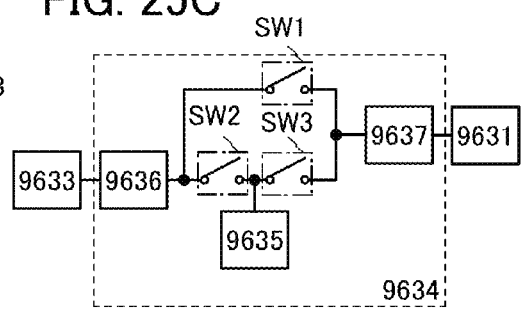

The structure and operation of the charge and discharge control circuit illustrated in FIG. 25B are described with reference to a block diagram of FIG. 25C. FIG. 25C illustrates the solar cell 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge and discharge control circuit 9634 in FIG. 25B.

First, an example of operation in the case where electric power is generated by the solar cell 9633 using external light is described. The voltage of electric power generated by the solar cell is raised or lowered by the DC-DC converter 9636 so that the electric power has a voltage for charging the battery 9635. When the display portion 9631 is operated with the electric power from the solar cell 9633, the switch SW1 is turned on and the voltage of the electric power is raised or lowered by the converter 9637 to a voltage needed for operating the display portion 9631. In addition, when display on the display portion 9631 is not performed, the switch SW1 is turned off and the switch SW2 is turned on so that the battery 9635 may be charged.

Although the solar cell 9633 is described as an example of a power generation means, there is no particular limitation on the power generation means, and the battery 9635 may be charged with any of the other means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

The structures and the like described in this embodiment can be combined as appropriate with any of the structures and the like described in the other embodiments and examples.

Example 1

In this example, the resistances of an oxide semiconductor film and a multilayer film will be described with reference to FIGS. 26A to 26D and FIG. 27.

First, the structure of a sample is described with reference to FIGS. 26A to 26D.

Figure 26A:
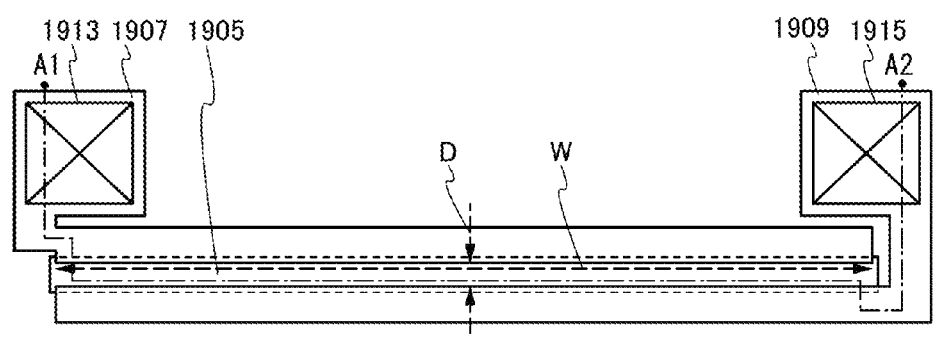
FIGS. 26A to 26D illustrate structures of samples.
Figure 26B:
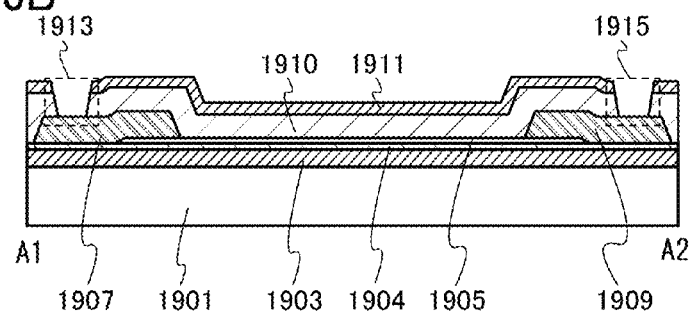
Figure 26C:
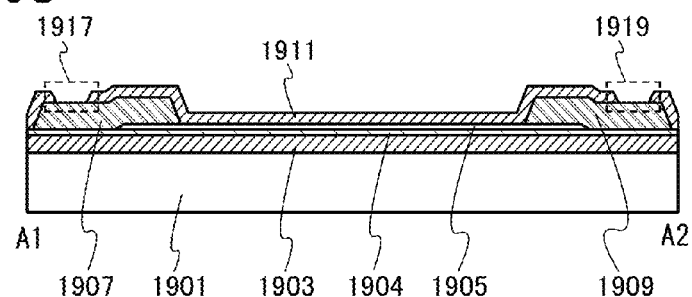
Figure 26D:
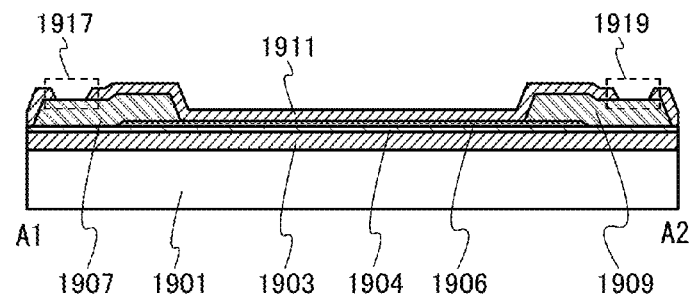

FIG. 26A is a top view of Sample 1, Sample 2, Sample 3, and Sample 4, and FIGS. 26B to 26D are cross-sectional views taken along dashed-and-dotted line A1-A2 in FIG. 26A. Note that the top views of Samples 1 to 4 are the same, and the cross-sectional views thereof are different because the stacked-layer structures of the cross sections are different. The cross-sectional views of Sample 1, Sample 2, and Samples 3 and 4 are illustrated in FIG. 26B, FIG. 26C, and FIG. 26D, respectively.

As for Sample 1, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that an opening portion 1913 and an opening portion 1915 are provided in the insulating films 1910 and 1911, and the conductive film 1907 and the conductive film 1909 are exposed through the opening portion 1913 and the opening portion 1915, respectively.

As for Sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening portion 1917 and an opening portion 1919 are provided in the insulating film 1911, and the conductive film 1907 and the conductive film 1909 are exposed through the opening portion 1917 and the opening portion 1919, respectively.

In each of Samples 3 and 4, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the opening portions 1917 and 1919 are provided in the insulating film 1911, and the conductive film 1907 and the conductive film 1909 are exposed through the opening portion 1917 and the opening portion 1919, respectively.

As described above, the structures of the insulating films in contact with the top surface of the oxide semiconductor film 1905 or the multilayer film 1906 are different in Samples 1 to 4. In Sample 1, the oxide semiconductor film 1905 and the insulating film 1910 are in contact with each other; in Sample 2, the oxide semiconductor film 1905 and the insulating film 1911 are in contact with each other; and in Samples 3 and 4, the multilayer film 1906 and the insulating film 1911 are in contact with each other.

Next, methods for forming the samples are described.

First, a method for forming Sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick In—Ga—Zn oxide film (hereinafter also referred to as an IGZO film) was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask is formed over the insulating film 1911 through a photolithography process and then etching treatment was performed on the insulating film 1911, so that the opening portions 1913 and 1915 were formed in the insulating films 1910 and 1911.

Through the above process, Sample 1 was formed.

Next, a method for forming Sample 2 is described.

Next, a 450-nm-thick silicon oxynitride film was formed as the insulating film 1910 over the insulating film 1903, the oxide semiconductor film 1905, the conductive film 1907, and the conductive film 1909 of Sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask is formed over the insulating film 1911 through a photolithography process and then etching treatment was performed on the insulating film 1911, so that the opening portions 1917 and 1919 were formed in the insulating film 1911.

Through the above process, Sample 2 was formed.

Next, a method for forming Sample 3 is described.

As for Sample 3, the multilayer film 1906 was used instead of the oxide semiconductor film 1905 of Sample 2. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, Sample 3 was formed.

Next, a method for forming Sample 4 is described.

As for Sample 4, the multilayer film 1906 was used instead of the oxide semiconductor film 1905 of Sample 2. The thickness of the IGZO film included in the multilayer film 1906 in Sample 4 is different from that in Sample 3. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the separated multilayer film 1906 was formed.

Through the above process, Sample 4 was formed.

Next, the sheet resistance of the oxide semiconductor film 1905 provided in each of Samples 1 and 2 and the sheet resistance of the multilayer film 1906 provided in each of Samples 3 and 4 were measured. In Sample 1, a probe is made contact with the opening portions 1913 and 1915 to measure the sheet resistance of the oxide semiconductor film 1905. In each of Samples 2 to 4, a probe is made contact with the opening portions 1917 and 1919 to measure the sheet resistance of the oxide semiconductor film 1905 or the multilayer film 1906. Note that in the oxide semiconductor film 1905 in each of Samples 1 and 2 and the multilayer film 1906 in each of Samples 3 and 4, the widths of the conductive films 1907 and 1909 facing each other were each 1 mm and the distance therebetween was 10 μm. Further, in each of Samples 1 to 4, the potential of the conductive film 1907 was a ground potential, and 1 V was applied to the conductive film 1909.

Figure 27:
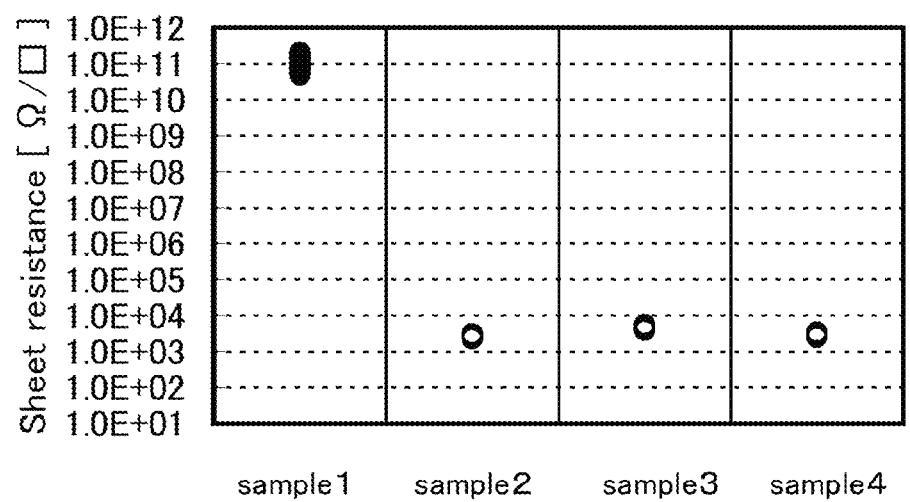
FIG. 27 is a graph showing sheet resistance.

FIG. 27 shows the sheet resistance of Samples 1 to 4.

The sheet resistance of Sample 1 was about $1 \times 10^{11}$ Ω/sq. The sheet resistance of Sample 2 was about 2620 Ω/sq. The sheet resistance of Sample 3 was about 4410 Ω/sq. The sheet resistance of Sample 4 was about 2930 Ω/sq.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of Samples 1 to 4 were converted into resistivity, the resistivities of Sample 1, Sample 2, Sample 3, and Sample 4 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In Sample 1, the silicon oxynitride film used as the insulating film 1910 was formed in contact with the top surface of the oxide semiconductor film 1905 and apart from the silicon nitride film used as the insulating film 1911. On the other hand, the silicon nitride film used as the insulating film 1911 was formed in contact with the top surface of the oxide semiconductor film 1905 in Sample 2 and was formed in contact with the top surface of the multilayer film 1906 in each of Samples 3 and 4. When the oxide semiconductor film 1905 or the multilayer film 1906 is thus provided in contact with the silicon nitride film used as the insulating film 1911, defects, typically oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in Sample 1. Further, as a light-transmitting conductive film used for an electrode of a capacitor, it is preferable to employ a structure in which a silicon nitride film is provided in contact with an oxide semiconductor film or a multilayer film as shown in the Samples 2 to 4. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

Next, the sheet resistance values of Samples 2 and 3 which were preserved under a high-temperature high-humidity environment and the sheet resistance values of Samples 2 and 3 at various temperatures were measured. The conditions of the samples used here are described below. Note that here, the conditions are partly different from those of Samples 2 and 3. Therefore, samples which have the same structure as Samples 2 and 3 and which were formed under the different formation conditions are referred to as Sample 2a and Sample 3a.

First, a method for forming Sample 2a is described.

The insulating film 1903 and the insulating film 1904 were formed over the glass substrate 1901.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process and then heat treatment was performed at 350° C. or 450° C., so that the oxide semiconductor film 1905 was formed.

Next, the conductive film 1907 and the conductive film 1909 were formed over the insulating film 1903 and the oxide semiconductor film 1905 in such a manner that a 50-nm-thick titanium film and a 400-nm-thick copper film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1904, the oxide semiconductor film 1905, the conductive film 1907, and the conductive film 1909 by a plasma CVD method. Note that the film formation temperature of the silicon nitride film was 220° C. or 350° C.

Next, a mask is formed over the insulating film 1911 through a photolithography process and then etching treatment was performed on the insulating film 1911, so that the opening portion 1913 and 1915 were formed in the insulating films 1910 and 1911.

Through the above process, Sample 2a was formed.

Next, a method for forming Sample 3a is described.

As for Sample 3a, the multilayer film 1906 was used instead of the oxide semiconductor film 1905 of Sample 2a. The multilayer film 1906 was formed over the insulating film 1904 in such a manner that a 10-nm-thick IGZO film with a metal oxide target containing In, Ga, and Zn at an atomic ratio of 1:1:1, and a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process and then heat treatment was performed at 350° C. or 450° C., so that the multilayer film 1906 was formed.

Through the above process, Sample 3a was formed.

Next, the sheet resistance of the oxide semiconductor film 1905 provided in Sample 2a and the sheet resistance of the multilayer film 1906 provided in Sample 3a were measured. In each of Samples 2a and 3a, a probe is made contact with the opening portions 1917 and 1919 to measure the sheet resistance of the oxide semiconductor film 1905 or the multilayer film 1906. Note that in the oxide semiconductor film 1905 in Sample 2a and the multilayer film 1906 in Sample 3a, in the top view, a width W in which the conductive films 1907 and 1909 face each other was 1.5 mm and a distance D therebetween was 10 p.m. Further, in each of Samples 2a and 3a, the potential of the conductive film 1907 was a ground potential, and 1 V was applied to the conductive film 1909. The sheet resistance values of Samples 2a and 3a were measured after Samples 2a and 3a were preserved at 60° C. under an atmosphere with a humidity of 95% for 60 hours and 130 hours.

Figure 31:
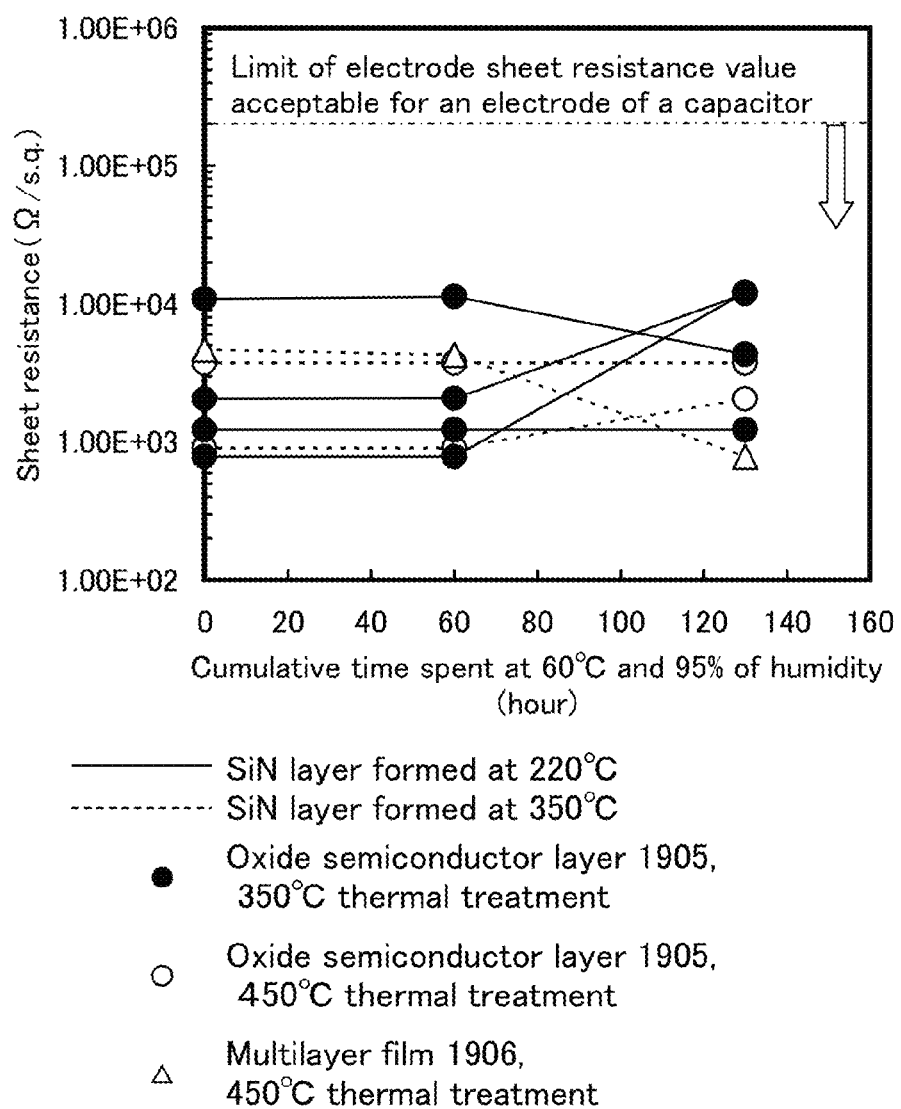
FIG. 31 is a graph showing sheet resistance.

FIG. 31 shows the sheet resistance values of Samples 2a and 3a. Note that in FIG. 31, the film formation temperature of the silicon nitride film formed as the insulating film 1911 in each sample is 220° C. (a solid line) or 350° C. (a dashed line). In addition, black circle and triangle indicate the samples each subjected to heat treatment at 350° C. after the formation of the oxide semiconductor film 1905 or the multilayer film 1906, and white circle and triangle indicate the samples each subjected to heat treatment at 450° C. after the formation of the oxide semiconductor film 1905 or the multilayer film 1906. The circles indicate the samples each including the oxide semiconductor film 1905, i.e., Sample 2a. The triangles indicate the samples each including the multilayer film 1906, i.e., Sample 3a. Still, measurements results corresponding to the multilayer film 1906 subjected to a 350° C. thermal treatment, i.e. the sample 3a, are not plotted in the graph of FIG. 29.

FIG. 31 shows that Samples 2a and 3a had low sheet resistance values and satisfied a preferable sheet resistance value for an electrode of a capacitor, which is 0.2 Ω/s.q., and that the amount of change over time in the sheet resistance values of Samples 2a and 3a was small. As described above, the amount of change in the sheet resistance value of the oxide semiconductor film or the multilayer film in contact with the silicon nitride film is small under a high-temperature high-humidity environment; therefore, the oxide semiconductor film or the multilayer film can be used as a light-transmitting conductive film which is used for an electrode of a capacitor.

Figure 32:
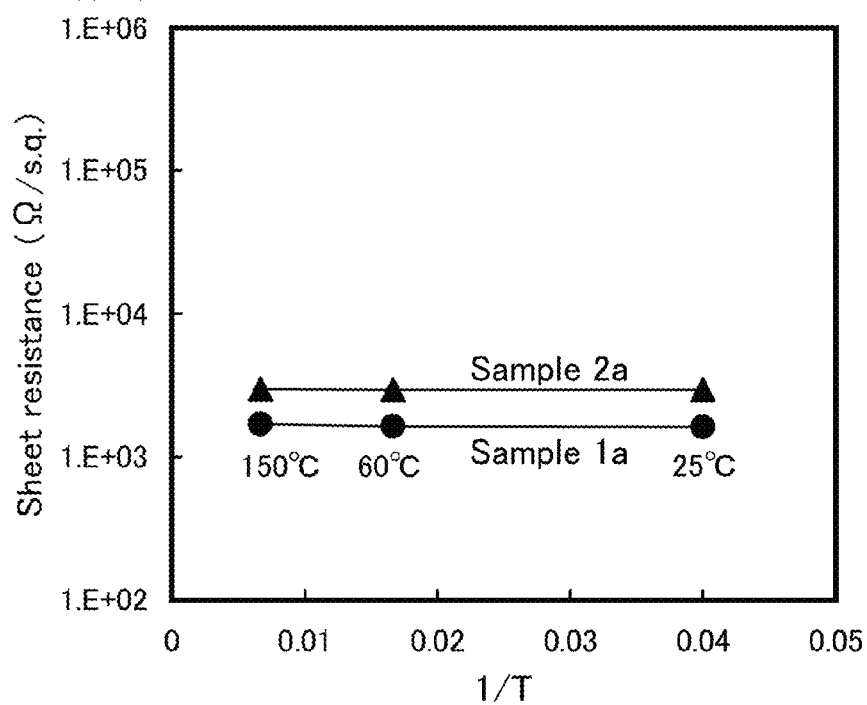
FIG. 32 is a graph showing sheet resistance.

Next, the sheet resistance values of Samples 2a and 3a when the substrate temperature was 25° C., 60° C., or 150° C. were measured, and the measurement results are shown in FIG. 32. Note that here, as each of Samples 2a and 3a, a sample which includes the silicon nitride film formed as the insulating film 1911 at 220° C. and which was subjected to heat treatment at 350° C. after the formation of the oxide semiconductor film 1905 or the multilayer film 1906 was used. The black circles indicate measurement results regarding the sample 2a while the black triangles indicate measurements results regarding the sample 3a.

FIG. 32 shows that the sheet resistance value of the oxide semiconductor film 1905 or the multilayer film 1906 was not changed even when the measurement temperature was raised. In other words, the oxide semiconductor film or the multilayer film in contact with the silicon nitride film is a degenerated semiconductor. A change in the sheet resistance value of the oxide semiconductor film or the multilayer film in contact with the silicon nitride film was small even when the temperature was changed; therefore, the oxide semiconductor film or the multilayer film can be used as a light-transmitting conductive film which is used for an electrode of a capacitor.

Note that the structure described in this example can be used as appropriate in combination with any of the structures in the other embodiments and examples.

Example 2

In this example, the resistance of an oxide semiconductor film will be described with reference to FIGS. 35A and 35B and FIGS. 36A to 36D. In this example, the resistance of the oxide semiconductor film in each of processes for forming a transistor and a capacitor was measured.

Processes for forming samples each including a transistor and a capacitor and the structures of the samples are described with reference to FIG. 35A and FIGS. 36A to 36D. Note that FIGS. 36A to 36D illustrate cross-sectional structures of the capacitors included in the respective samples.

A gate electrode was formed in a region over a glass substrate 1901 where a transistor was to be formed. Here, a 100-nm-thick tungsten film was formed as the gate electrode.

Then, a 400-nm-thick silicon nitride film was formed as an insulating film 1903 over the glass substrate 1901 and the gate electrode by a plasma CVD method.

Next, a 50-nm-thick silicon oxynitride film was formed as an insulating film 1904 over the insulating film 1903 by a plasma CVD method.

Next, a 35-nm-thick IGZO film was formed over the insulating film 1904 by a sputtering method using a metal oxide target (In:Ga:Zn=1:1:1). After that, etching treatment was performed using a mask formed through a photolithography process to form an oxide semiconductor film 1905 (Step S1 illustrated in FIG. 35A).

Next, the conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process (Step S3 in FIG. 35A).

Through the above process, Sample 5 was formed. A cross-sectional view of a capacitor included in Sample 5 is illustrated in FIG. 36A. Note that in Sample 5, an oxide semiconductor film which is provided in a region where a transistor is formed is referred to as C5 and an oxide semiconductor film which is provided in a region where a capacitor is formed is referred to as E5.

After the oxide semiconductor film 1905 was formed, heat treatment at 450° C. in a nitrogen atmosphere for one hour and then heat treatment at 450° C. in a mixed gas atmosphere of nitrogen and oxygen (the proportion of the nitrogen was 80%, and the proportion of the oxygen was 20%) for one hour were successively performed (Step S2 in FIG. 35A). Then, the conductive film 1907 and the conductive film 1909 were formed (Step S3 in FIG. 35A).

Through the above process, Sample 6 was formed. A cross-sectional view of a capacitor included in Sample 6 is illustrated in FIG. 36A. Note that in Sample 6, an oxide semiconductor film which is provided in a region where a transistor is formed is referred to as C6 and an oxide semiconductor film which is provided in a region where a capacitor is formed is referred to as E6.

After a process similar to that of Sample 6, as an insulating film to be an insulating film 1910 later, a 450-nm-thick silicon oxynitride film was formed over the insulating film 1904, the oxide semiconductor film 1905, the conductive film 1907, and the conductive film 1909 by a plasma CVD method (Step S4 in FIG. 35A).

Next, a mask was formed over the insulating film through a photolithography process and etching treatment was performed to form the insulating film 1910 having opening portions 1913 and 1915 (Step S8 in FIG. 35A).

Through the above process, Sample 7 was formed. A cross-sectional view of a capacitor included in Sample 7 is illustrated in FIG. 36B. Note that in Sample 7, an oxide semiconductor film which is provided in a region where a transistor is formed is referred to as C7 and an oxide semiconductor film which is provided in a region where a capacitor is formed is referred to as E7.

After a process similar to that of Sample 6, as an insulating film to be the insulating film 1910 later, a 450-nm-thick silicon oxynitride film was formed over the insulating film 1904, the oxide semiconductor film 1905, the conductive film 1907, and the conductive film 1909 by a plasma CVD method (Step S4 in FIG. 35A).

Then, heat treatment was performed at 350° C. in a mixed atmosphere of nitrogen and oxygen for one hour (Step S5 in FIG. 35A).

Next, an insulating film to be an insulating film 1911 later was formed over the insulating film 1910. As the insulating film, a 50-nm-thick silicon nitride film was formed by a plasma CVD method (Step S7 in FIG. 35A).

Next, a mask was formed over the insulating film through a photolithography process and etching treatment was performed to form the insulating film 1910 having the opening portions 1913 and 1915 and the insulating film 1911 (Step S8 in FIG. 35A).

Through the above process, Sample 8 was formed. A cross-sectional view of a capacitor included in Sample 8 is illustrated in FIG. 36C. Note that in Sample 8, an oxide semiconductor film which is provided in a region where a transistor is formed is referred to as C8 and an oxide semiconductor film which is provided in a region where a capacitor is formed is referred to as E8.

After the heat treatment in Step S5 of Sample 8 in FIG. 35A, the insulating film 1910 over the capacitor was etched (Step S6 in FIG. 35A). In this step, the oxide semiconductor film formed in the capacitor was exposed to plasma and defects, typically, oxygen vacancies, were formed in the oxide semiconductor film.

Then, an insulating film to be the insulating film 1911 later was formed (Step S7 in FIG. 35A).

Next, a mask was formed over the insulating film through a photolithography process and then etching treatment was performed to form the insulating films 1910 and 1911 which had the opening portions 1913 and 1915 in the region where the transistor was formed and form the insulating film 1911 having opening portions 1917 and 1919 in the region where the capacitor was formed (Step S8 in FIG. 35A).

Through the above process, Sample 9 was formed. A cross-sectional view of a capacitor included in Sample 9 is illustrated in FIG. 36D. Note that in Sample 9, an oxide semiconductor film which is provided in a region where a transistor is formed is referred to as C9 and an oxide semiconductor film which is provided in a region where a capacitor is formed is referred to as E9.

A 100-nm-thick conductive film of an indium oxide-tin oxide compound (ITO-SiO$_2$) was formed over a glass substrate by a sputtering method. Note that the composition of a target used for forming the conductive film was In$_2$O$_3$:SnO$_2$:SiO$_2$=85:10:5 [wt %]. After that, heat treatment was performed at 250° C. in a nitrogen atmosphere for one hour.

Next, over the conductive film of the indium oxide-tin oxide compound (ITO-SiO$_2$), the conductive film 1907 and the conductive film 1909 were formed in a manner similar to those of the processes of Samples 5 to 9.

Through the above process, Sample 10 was formed.

Note that in Samples 5 to 10, in the top view, the width W in which the conductive film 1907 and the conductive film 1909 face each other was 1 mm and the distance D therebetween was 10 μm.

Then, the sheet resistances of the following films were measured: the oxide semiconductor films C5 to C9 of Samples 5 to 9, which were provided in the regions where the transistors were formed; the oxide semiconductor films E5 to E9 of Samples 5 to 9, which were provided in the regions where the capacitors were formed; and the conductive film of the indium oxide-tin oxide compound (ITO-SiO$_2$) included in Sample 10.

Measurement results were shown in FIG. 35B. FIG. 35B shows that the sheet resistances of the oxide semiconductor films C7 and E7 in Sample 7 are lower than those of the oxide semiconductor films C5, E5, C6, and E6 in Samples 5 and 6. This fact indicates that the oxide semiconductor film is damaged by being exposed to plasma at the time of etching the film formed over the oxide semiconductor film, so that the sheet resistance of the oxide semiconductor film becomes low.

Further, FIG. 35B shows that the sheet resistances of the oxide semiconductor films C8 and E8 in Sample 8 are higher than those of the oxide semiconductor films C5, E5, C6, E6, C7, and E7 in Samples 5 to 7. This is because the insulating film formed over the oxide semiconductor films C8 and E8 is formed of a silicon oxide film and contains oxygen which is released by heating. Accordingly, it is found that the resistance of the oxide semiconductor film is increased by the step of forming the oxide insulating film over the oxide semiconductor film shown in Step S4 and the step of heat treatment shown in Step S5 in FIG. 35A. When such an oxide semiconductor film is used as a channel region of the transistor, the transistor can be a normally-off transistor.

Further, in Sample 9, the oxide semiconductor film E9 has a lower sheet resistance than the oxide semiconductor film C9. Further, the oxide semiconductor film E9 in Sample 9 has a sheet resistance similar to those of the oxide semiconductor films C7 and E7 in Sample 7.

The sheet resistances of the oxide semiconductor films C7 and E7 in Sample 7 and the oxide semiconductor film E9 in Sample 9 are higher than that of the conductive film of the indium oxide-tin oxide compound (ITO-SiO$_2$) by just one digit. Therefore, the oxide semiconductor films C7 and E7 in Sample 7 and the oxide semiconductor film E9 in Sample 9 can be each used as an electrode in a manner similar to that of the conductive film of the indium oxide-tin oxide compound (ITO-SiO$_2$).

In other words, like in Sample 9, in a region where a transistor is formed, an insulating film formed of an oxide insulating film is provided over an oxide semiconductor film and subjected to heat treatment, whereby the resistance of the oxide semiconductor film is increased and the oxide semiconductor film can be used as a channel formation region. Further, in a region where a capacitor is to be formed, a surface of the oxide semiconductor film is exposed to plasma and an insulating film formed of a nitride insulating film is provided over the oxide semiconductor film, whereby the resistance of the oxide semiconductor film is reduced and the oxide semiconductor film can be used as an electrode.

Example 3

In this example, analysis of impurities in an oxide semiconductor film and an insulating film formed over the oxide semiconductor film will be described with reference to FIGS. 28A and 28B.

In this example, two kinds of samples (hereinafter Sample 11 and Sample 12) were formed as samples for impurity analysis.

First, a method for forming Sample 11 is described below.

As for Sample 11, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the O$_2$ gas flow rate was 100 sccm (the proportion of the O$_2$ gas was 50%); the pressure was 0.6 Pa; the film formation power was 5000 W; and the substrate temperature was 170° C.

In addition, as for the silicon nitride film, a 100-nm-thick silicon nitride film was formed by a plasma CVD method under the following conditions: the SiH$_4$ gas flow rate was 50 sccm, the N$_2$ gas flow rate was 5000 sccm, and the NH$_3$ gas flow rate was 100 sccm; the pressure was 100 Pa; the film formation power was 1000 W; and the substrate temperature was 220° C.

Next, a method for forming Sample 12 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of Sample 11. In addition, as for the silicon oxynitride film, a 50-nm-thick silicon oxynitride film was formed by a plasma CVD method under the following conditions: the SiH$_4$ gas flow rate was 30 sccm and the N$_2$O gas flow rate was 4000 sccm; the pressure was 40 Pa; the film formation power was 150 W; and the substrate temperature was 220° C. After that, a 400-nm-thick silicon oxynitride film was formed by a plasma CVD method under the following conditions: the SiH$_4$ gas flow rate was 160 sccm and the N$_2$O gas flow rate was 4000 sccm; the pressure was 200 Pa; the film formation power was 1500 W; and the substrate temperature was 220° C.

Figure 28A:
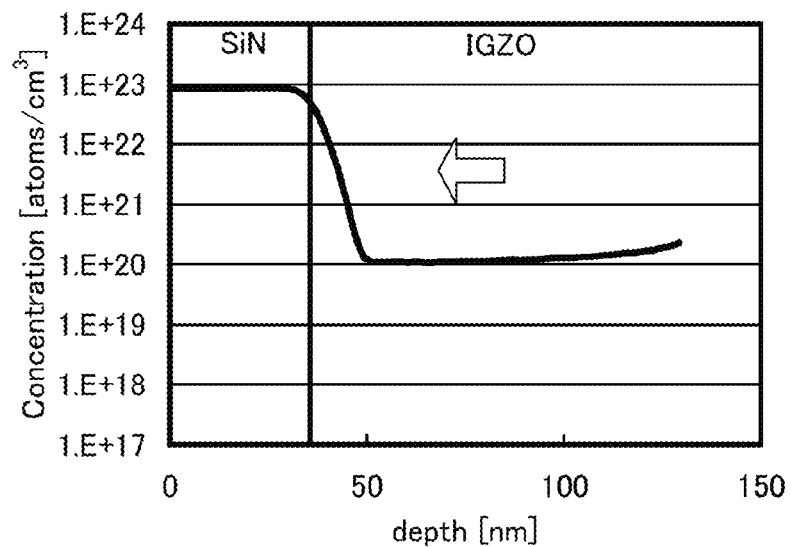
FIGS. 28A and 28B are graphs showing results of SIMS measurement.
Figure 28B:
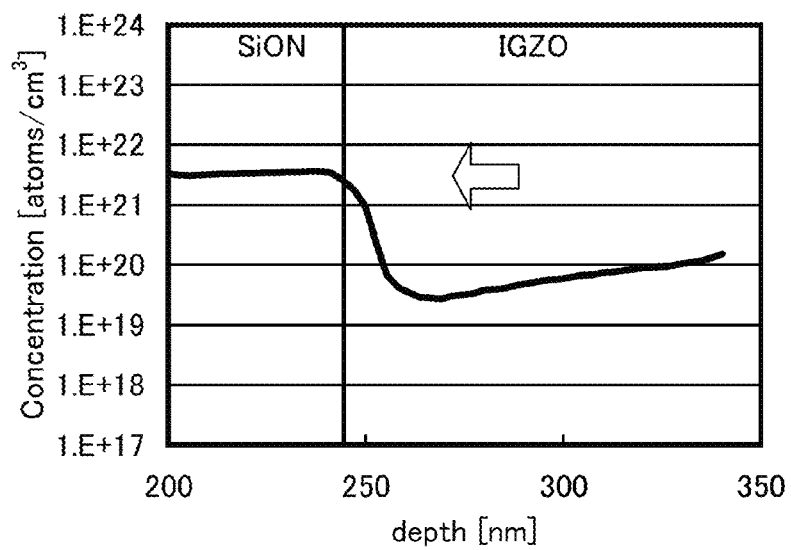

FIGS. 28A and 28B show the results of the impurity analysis of Samples 11 and 12.

Note that the impurity analysis was performed in the direction shown by the arrow in each of FIGS. 28A and 28B by secondary ion mass spectrometry (SIMS). That is, the measurement was performed from the glass substrate side.

FIG. 28A shows the concentration profile of hydrogen (H) which was obtained by measurement of Sample 11. FIG. 28B shows the concentration profile of hydrogen (H) which was obtained by measurement of Sample 12.

FIG. 28A shows that the concentration of hydrogen (H) in the IGZO film is $1.0 \times 10^{20}$ atoms/cm$^3$ and the concentration of hydrogen (H) in the silicon nitride film is $1.0 \times 10^{23}$ atoms/cm$^3$. FIG. 28B shows that the concentration of hydrogen (H) in the IGZO film is $5.0 \times 10^{19}$ atoms/cm$^3$ and the concentration of hydrogen (H) in the silicon oxynitride film is $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown Sample 12. As a light-transmitting conductive film used for an electrode of a capacitor, it is preferable to employ a structure in which a silicon nitride film is provided in contact with the IGZO film as shown in Sample 11. With such a structure, even when an IGZO film which is used for a channel formation region of a transistor and an IGZO film which is used for an electrode of a capacitor are formed through the same process, the hydrogen concentrations of the IGZO films can be made different from each other.

Example 4

In this example, the amounts of defects in an oxide semiconductor film and a multilayer film will be described with reference to FIGS. 29A to 29C and FIG. 30.

First, the structures of samples are described.

Sample 13 includes a 35-nm-thick oxide semiconductor film formed over a quartz substrate and a 100-nm-thick nitride insulating film formed over the oxide semiconductor film.

Sample 14 and Sample 15 each include a 30-nm-thick multilayer film formed over a quartz substrate and a 100-nm-thick nitride insulating film formed over the multilayer film. Note that in the multilayer film of Sample 14, a 10-nm-thick first IGZO film, a 10-nm-thick second IGZO film, and a 10-nm-thick third IGZO film are stacked in this order. In the multilayer film of Sample 15, a 20-nm-thick first IGZO film, a 15-nm-thick second IGZO film, and a 10-nm-thick third IGZO film are stacked in this order. Samples 14 and 15 are different from Sample 13 in that the multilayer film is included instead of the oxide semiconductor film.

Sample 16 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. Sample 16 is different from Samples 13 to 15 in that the oxide semiconductor film is not in contact with the nitride insulating film but in contact with the oxide insulating film.

Next, methods for forming the samples are described.

First, a method for forming Sample 13 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a plasma CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, Sample 13 was formed.

Next, a method for forming Sample 14 is described.

As for Sample 14, the multilayer film was formed instead of the oxide semiconductor film of Sample 14. As for the multilayer film, the 10-nm-thick first IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick second IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick third IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of Sample 13. Through the above process, Sample 14 was formed.

Next, a method for forming Sample 15 is described.

As for Sample 15, the multilayer film was formed instead of the oxide semiconductor film of Sample 13. As for the multilayer film, the 20-nm-thick first IGZO film was formed over the quartz substrate under the same conditions as the first IGZO film of Sample 14. Then, the 15-nm-thick second IGZO film was formed by a sputtering method under the same conditions as the second IGZO film of Sample 14. Then, the 10-nm-thick third IGZO film was formed under the same conditions as the third IGZO film of Sample 14.

Other steps are similar to those of Sample 13. Through the above process, Sample 15 was formed.

Next, a method for forming Sample 16 is described.

As for Sample 16, the 100-nm-thick oxide semiconductor film was formed over the quartz substrate under the same conditions as Sample 13.

Next, first heat treatment was performed under conditions similar to those of Sample 13.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a plasma CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, the 200-nm-thick second silicon oxynitride film was formed by a plasma CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as Sample 13.

Next, second heat treatment was performed under conditions similar to those of Sample 13.

Through the above process, Sample 16 was formed.

Next, Samples 13 to 16 were measured by ESR. In the ESR measurement performed at a predetermined temperature, a value of a magnetic field ($H_0$) where a microwave is absorbed is used for an equation $g=h\nu/\beta H_0$, so that a parameter of a g-factor can be obtained. Note that the frequency of the microwave is denoted by $\nu$, and the Planck constant and the Bohr magneton are denoted by, respectively, h and $\beta$ which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

FIG. 29A shows a first derivative curve obtained by ESR measurement of the oxide semiconductor film in Sample 13; and FIGS. 29B and 29C show first derivative curves obtained by ESR measurement of the multilayer films in Samples 14 and 15. FIG. 29A shows the measurement result of Sample 13, FIG. 29B shows the measurement result of Sample 14, and FIG. 29C shows the measurement result of Sample 15.

Figure 30:
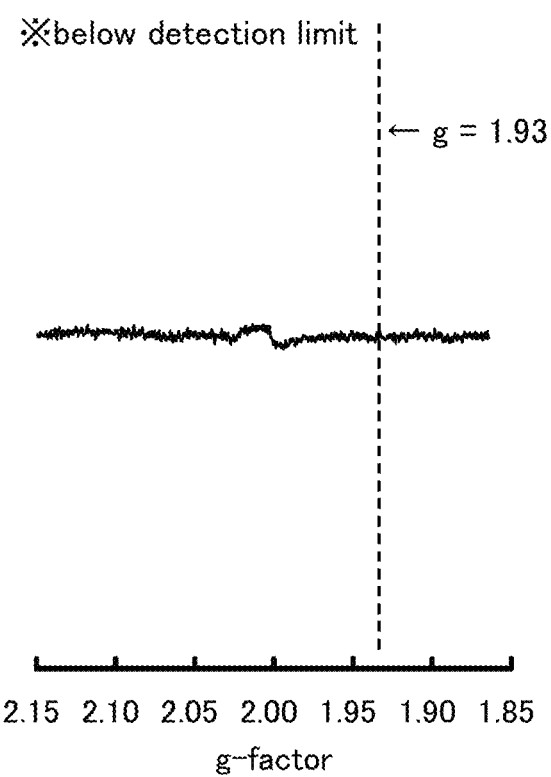
FIG. 30 is a graph showing results of ESR measurement.

FIG. 30 shows a first derivative curve obtained by ESR measurement of the oxide semiconductor film in Sample 16.

In FIGS. 29A to 29C, Sample 13 has signal symmetry due to defects having a a g-factor of 1.93 in the oxide semiconductor film. Samples 14 and 15 each have signal symmetry due to a defect having a g-factor of 1.95 in the multilayer film. As for Sample 13, the spin density corresponding to a g-factor of 1.93 was $2.5 \times 10^{19}$ spins/cm$^3$, in Sample 14, the total spin densities corresponding to g-factors of 1.93 and 1.95 were $1.6 \times 10^{19}$ spins/cm$^3$, and in Sample 15, the total spin densities corresponding to g-factors of 1.93 and 1.95 were $2.3 \times 10^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 30, the thickness of the oxide semiconductor film of Sample 16 is thicker than those of Samples 13, signal symmetry due to a defect was not detected, i.e., the number of defects was less than or equal to the lower limit of detection (here, the lower limit of detection was $3.7 \times 10^{16}$ spins/cm$^3$). Accordingly, it is found that the number of defects in the oxide semiconductor film cannot be detected.

It is found that when a nitride insulating film, here the silicon nitride film formed by a plasma CVD method is in contact with an oxide semiconductor film or a multilayer film, defects, typically oxygen vacancies are generated in the oxide semiconductor film or the multilayer film. On the other hand, when an oxide insulating film, here the silicon oxynitride film, is provided on an oxide semiconductor film, excess oxygen contained in the silicon oxynitride film, i.e., oxygen contained at a higher proportion than oxygen in the stoichiometric composition is diffused into the oxide semiconductor film and thus the number of defects in the oxide semiconductor film is not increased.

As described above, as shown in Samples 13 to 15, the oxide semiconductor film or the multilayer film which is in contact with the nitride insulating film has a number of defects, typically oxygen vacancies, and has a high conductivity and therefore can be used as an electrode of a capacitor. On the other hand, as shown in Sample 16, an oxide semiconductor film or a multilayer film which is in contact with the oxide insulating film has a small number of oxygen vacancies and low conductivity and therefore can be used as a channel formation region of a transistor.

Here, the cause of a reduction in resistivity of the oxide semiconductor film or the multilayer film which is in contact with the nitride insulating film is described below.
<Energy and Stability Between Existing Modes of Hydrogen (H)>

First, the energy and stability in a mode of H which exists in an oxide semiconductor film is described with calculated results. Here, InGaZnO$_4$ was used as the oxide semiconductor film.

The structure used for the calculation is based on an 84-atom bulk model in which twice the number of a hexagonal unit cell of the InGaZnO$_4$ is arranged along the a-axis and b-axis.

Figure 33A:
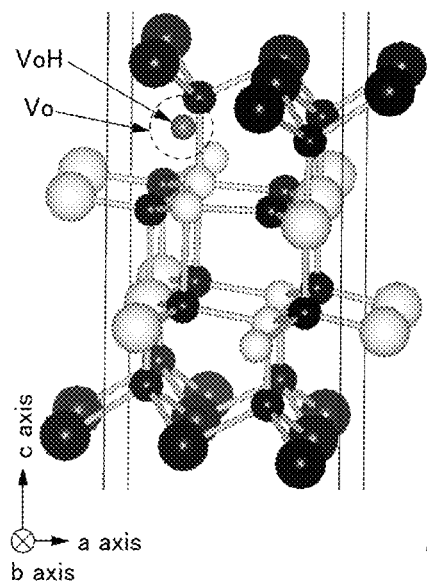
FIGS. 33A to 33D illustrate bulk models of $InGaZnO_4$ crystals.
Figure 33B:
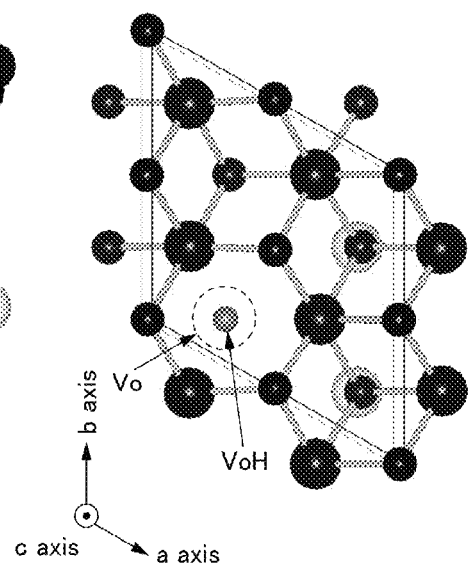

As the bulk model, a model in which one O atom bonded to three In atoms and one Zn atom is substituted with a H atom was prepared (see FIG. 33A). FIG. 33B shows a diagram in which the a-b plane of the InO layer in FIG. 33A is viewed from the c-axis direction. A region from which one O atom bonded to three In atoms and one Zn atom is removed is shown as an oxygen vacancy Vo, which is shown in a dashed line in FIGS. 33A and 33B. In addition, a H atom in the oxygen vacancy Vo is expressed as VoH.

Figure 33C:
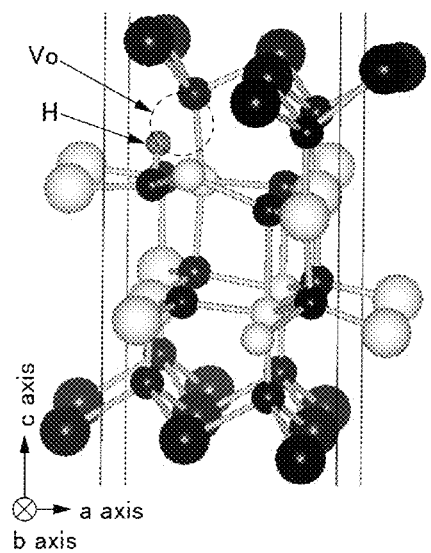
Figure 33D:
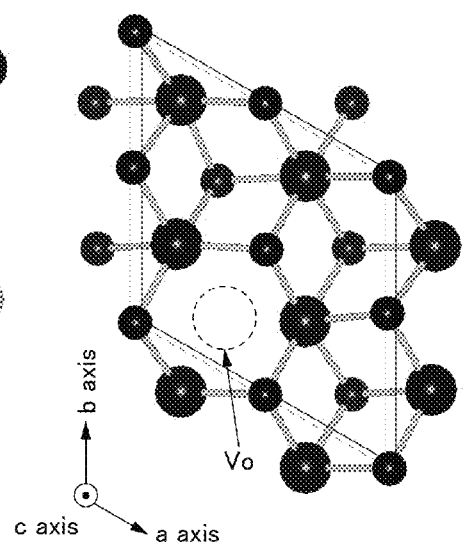

In the bulk model, one O atom bonded to three In atoms and one Zn atom is removed, whereby an oxygen vacancy Vo is formed. A model in which, in the vicinity of the oxygen vacancy Vo, a H atom is bonded to one O atom to which one Ga atom and two Zn atoms are bonded on the a-b plane was prepared (see FIG. 33C). FIG. 33D shows a diagram in which the a-b plane of the InO layer in FIG. 33C is viewed from the c-axis direction. In FIGS. 33C and 33D, an oxygen vacancy Vo is shown in a dashed line. A model in which an oxygen vacancy Vo is formed and, in the vicinity of the oxygen vacancy Vo, a H atom is bonded to one O atom to which one Ga atom and two Zn atoms are bonded on the a-b plane is expressed as Vo+H.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio Simulation Package) was used. The calculation conditions are shown in Table 1.

TABLE 1

| Software | VASP |
|---|---|
| Pseudopotential | PAW |
| Functional | CGA/PBE |
| Cut-off energy | 500 eV |
| K-point | 4 × 4 × 1 |

As pseudopotential of electronic states, a potential generated by a projector augmented wave (PAW) method was used, and as a functional, generalized-gradient-approximation/Perdew-Burke-Ernzerhof (GGA/PBE) was used.

In addition, the total energy of the two models which were obtained by the calculations is shown in Table 2.

TABLE 2

| Model | Total Energy |
|---|---|
| VoH | −456.084 eV |
| Vo + H | −455.304 eV |

According to Table 2, the total energy of VoH is lower than that of Vo+H by 0.78 eV. Thus, VoH is more stable than Vo+H. Accordingly, when a H atom comes close to an oxygen vacancy (Vo), the H atom might be easily trapped in the oxygen vacancy (Vo) than bonding with an O atom.
<Thermodynamic State of VoH>

Next, the formation energy and the charge state of VoH which is generated by a H atom trapped in an oxygen vacancy (Vo) is described with calculated results. The formation energy of VoH is different depending on the charge state and also depends on the Fermi energy. Thus, the stable charge state of VoH is different depending on the Fermi energy. Here, (VoH)$^+$ denotes a state in which one electron is discharged by VoH, (VoH)$^-$ denotes a state in which one electron is trapped by VoH, and (VoH)$^0$ denotes a state in which an electron is not transferred. The formation energies of (VoH)$^+$, (VoH)$^-$, and (VoH)$^0$ were calculated.

In the calculation, the first principles calculation software VASP was used. The calculation conditions are shown in Table 3.

TABLE 3

| Software | VASP |
|---|---|
| Pseudopotential | PAW |

TABLE 3-continued

| Functional | HSE06 |
| --- | --- |
| Cut-off energy | 800 eV |
| Number of k-point sampling | 2 × 2 × 1 (opt.) |
|  | 4 × 4 × 1 (single) |
| Spin polarization | setup |
| Shielding parameter | 0.2 |
| Fraction of the nonolcal Fock-exchange | 0.25 |
| Number of atoms | 84 |

As pseudopotential of electronic states, a potential generated by a projector augmented wave (PAW) method was used, and as a functional, Heyd-Scuseria-Ernzerhof (HSE) DFT hybrid factor (HSE06) was used.

Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the top of the valence band of a complete crystal serving as the origin of energy.

Figure 34A:
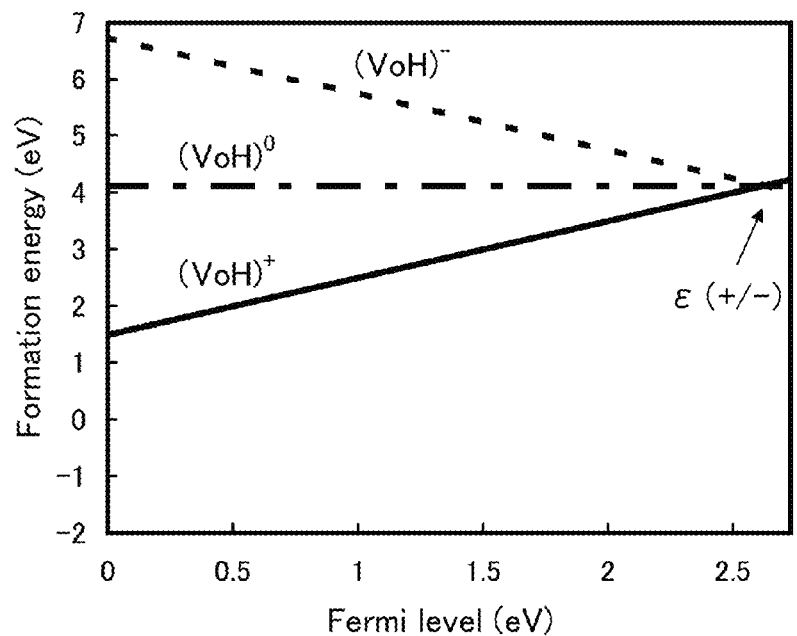
FIGS. 34A and 34B show formation energy and a thermodynamic transition level of VoH, respectively.

FIG. 34A shows the formation energies of (VoH)$^+$, (VoH)$^-$, and (VoH)$^0$. The horizontal axis represents the Fermi level, and the vertical axis represents the formation energy. The solid line represents the formation energy of (VoH)$^+$, the dashed-dotted line represents the formation energy of (VoH)$^0$, and the dashed line represents the formation energy of (VoH)$^-$. In addition, the transition level of the VoH charge from + to − through 0 is represented by ∈(+/−).

Figure 34B:
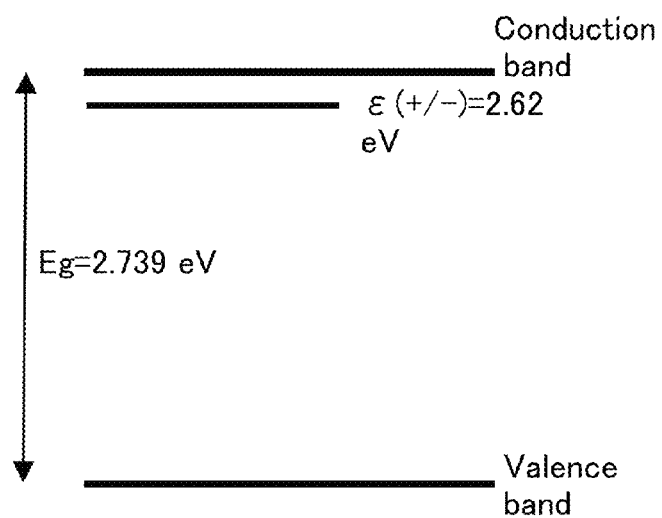

FIG. 34B shows a thermodynamic transition level of VoH. From the calculation result, the energy gap of InGaZnO$_4$ was 2.739 eV. In addition, when the energy of the valence band is 0 eV, the transfer level (∈(+/−)) is 2.62 eV, which exists just under the conduction band. This shows that InGaZnO$_4$ is n-type by trapping a H atom in an oxygen vacancy Vo.

When an oxide semiconductor film is exposed to plasma, the oxide semiconductor film is damaged and defects, typically oxygen vacancies are generated in the oxide semiconductor film. In addition, when a nitride insulating film is in contact with an oxide semiconductor film, hydrogen contained in the nitride insulating film is transferred to the oxide semiconductor film. As a result, VoH is formed in an oxide semiconductor film by entry of hydrogen into an oxygen vacancy in the oxide semiconductor film, so that the oxide semiconductor film becomes n-type film and the resistivity thereof is reduced. As described above, the oxide semiconductor film in contact with the nitride insulating film can be used as an electrode of a capacitor.

Example 5

In this example, the light transmittance of an oxide semiconductor film in contact with a nitride insulating film will be described with reference to FIGS. 37A to 37C.

Structures of samples are described.

Sample 17 was formed in such a manner that a 35-nm-thick oxide semiconductor film was formed over a glass substrate and a 100-nm-thick silicon nitride film was formed over the oxide semiconductor film.

Sample 18 was formed in such a manner that a 35-nm-thick oxide semiconductor film was formed over a glass substrate, a 100-nm-thick silicon nitride film was formed over the oxide semiconductor film, and a 100-nm-thick indium oxide-tin oxide compound (ITO-SiO$_2$) film was formed over the silicon nitride film.

Note that in each of Samples 17 and 18, as the oxide semiconductor film, an In—Ga—Zn oxide film was formed by a sputtering method using an In—Ga—Zn oxide having an atomic ratio of metal elements of In:Ga:Zn=1:1:1 (referred to as IGZO(111)) as a target.

In each of Samples 17 and 18, the silicon nitride film was formed by a plasma CVD method using silane, ammonia, and nitrogen.

In Sample 18, the indium oxide-tin oxide compound (ITO-SiO$_2$) film was formed by a sputtering method.

Sample 19 was formed in such a manner that a 100-nm-thick indium oxide-tin oxide compound (ITO-SiO$_2$) film was formed over a glass substrate. The indium oxide-tin oxide compound (ITO-SiO$_2$) film was formed by a sputtering method.

Next, the transmittance of visible light in each of Samples 17 to 19 was measured. The measured transmittances are shown in FIGS. 37A to 37C. FIG. 37A shows the measurement result of Sample 17, FIG. 37B shows the measurement result of Sample 18, and FIG. 37C shows the measurement result of Sample 19.

Figure 37A:
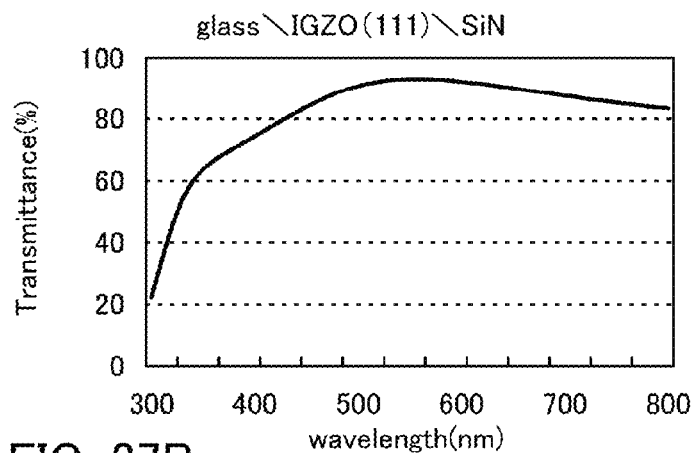
FIGS. 37A to 37C are graphs each showing the transmittance of a sample.

FIG. 37A shows that Sample 17 has a transmittance of 60% or more in wavelengths longer than or equal to 340 nm and shorter than or equal to 800 nm, a transmittance of 70% or more in wavelengths longer than or equal to 380 nm and shorter than or equal to 800 nm, and a transmittance of 80% or more in wavelengths longer than or equal to 430 nm and shorter than or equal to 800 nm.

Figure 37B:
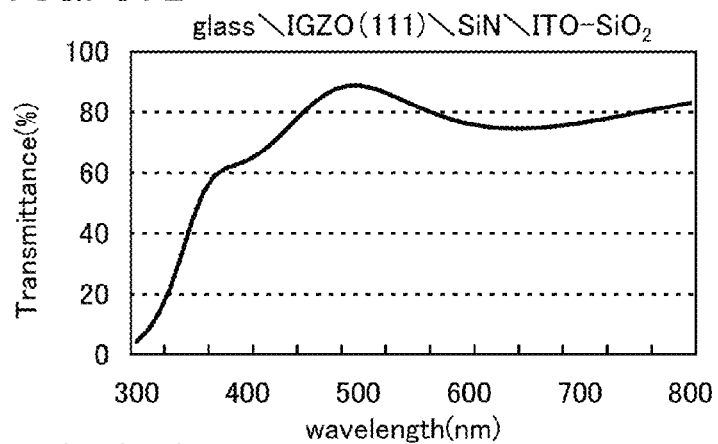

FIG. 37B shows that Sample 18 has a transmittance of 60% or more in wavelengths longer than or equal to 380 nm and shorter than or equal to 800 nm and a transmittance of 70% or more in wavelengths longer than or equal to 430 nm and shorter than or equal to 800 nm.

Figure 37C:
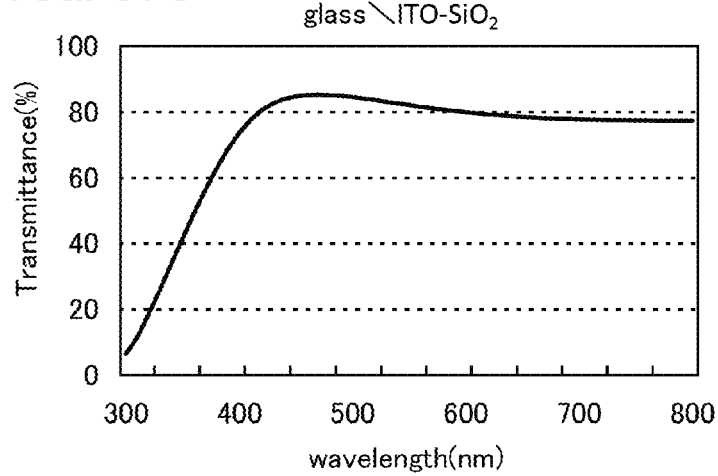

As shown in FIG. 37A, the oxide semiconductor film in contact with the silicon nitride film has a transmittance which is equal to or greater than that of the ITO-SiO$_2$ film shown in FIG. 37C. Further, as shown in FIG. 37B, the structure in which the oxide semiconductor film, the silicon nitride film, and the ITO-SiO$_2$ film are stacked also has a transmittance equal to that of the ITO-SiO$_2$ film shown in FIG. 37C. The above facts suggest that a capacitor in which an oxide semiconductor film, a silicon nitride film, and an ITO-SiO$_2$ film are stacked has a light-transmitting property. Note that even when a light-transmitting nitride insulating film is formed instead of the silicon nitride film and a light-transmitting conductive film is formed instead of the ITO-SiO$_2$ film, a light-transmitting capacitor can be manufactured.

REFERENCE NUMERALS

100: pixel portion; 102: substrate; 103: transistor; 104: scan line driver circuit; 106: signal line driver circuit; 107: scan line; 107a: gate electrode; 108: liquid crystal element; 109: signal line; 109a: source electrode; 111: semiconductor film; 113: conductive film; 113a: drain electrode; 115: capacitor line; 117: opening; 118: semiconductor film; 119: conductive film; 121: pixel electrode; 123: opening; 125: conductive film; 126: insulating film; 127: gate insulating film; 128: insulating film; 129: insulating film; 130: insulating film; 131: insulating film; 132: insulating film; 133: insulating film; 141: pixel; 143: opening; 145: capacitor; 150: substrate; 152: light-blocking film; 153: light-blocking film; 154: common electrode; 156: insulating film; 158: insulating film; 160: liquid crystal layer; 172: pixel; 174: capacitor; 176: capacitor line; 178: conductive film; 196: pixel; 197:

capacitor; 198: conductive film; 199: conductive film; 199a: oxide semiconductor film; 199b: oxide semiconductor film; 199c: oxide semiconductor film; 201: pixel; 205: capacitor; 221: pixel electrode; 225: insulating film; 226: insulating film; 227: gate insulating film; 228: insulating film; 229: insulating film; 230: insulating film; 231: insulating film; 232: insulating film; 233: insulating film; 245: capacitor; 255: capacitor; 271: pixel electrode; 279: insulating film; 281: insulating film; 282: insulating film; 301: pixel; 305: capacitor; 319: conductive film; 401_1: pixel; 401_2: pixel; 403_1: transistor; 4032: transistor; 405_1: capacitor; 405_2: capacitor; 407_1: scan line; 407_2: scan line; 409: signal line; 411_1: semiconductor film; 4112: semiconductor film; 413_1: conductive film; 4132: conductive film; 415: capacitor line; 417_1: opening; 417_2: opening; 419_1: conductive film; 419_2: conductive film; 421_1: pixel electrode; 421_2: pixel electrode; 423: opening; 425: conductive film; 437: scan line; 501: pixel; 505: capacitor; 519: conductive film; 521: common electrode; 901: substrate; 902: pixel portion; 903: signal line driver circuit; 904: scan line driver circuit; 905: sealant; 906: substrate; 908: liquid crystal layer; 910: transistor; 911: transistor; 913: liquid crystal element; 915: connection terminal electrode; 916: terminal electrode; 918: FPC; 918b: FPC; 919: anisotropic conductive agent; 922: gate insulating film; 923: insulating film; 924: insulating film; 925: sealant; 926: capacitor; 927: conductive film; 928: electrode; 929: capacitor wiring; 930: electrode; 931: electrode; 932: insulating film; 933: insulating film; 934: insulating film; 935: spacer; 940: electrode; 941: electrode; 943: liquid crystal element; 945: electrode; 946: common wiring; 971: source electrode; 973: drain electrode; 975: common potential line; 977: common electrode; 985: common potential line; 987: common electrode; 1901: glass substrate; 1903: insulating film; 1904: insulating film; 1905: oxide semiconductor film; 1906: multilayer film; 1907: conductive film; 1909: conductive film; 1910: insulating film; 1911: insulating film; 1913: opening portion; 1915: opening portion; 1917: opening portion; 1919: opening portion; 1922: insulating film; 9000: table; 9001: housing; 9002: leg portion; 9003: display portion; 9004: display button; 9005: power cord; 9033: clasp; 9034: switch; 9035: power switch; 9036: switch; 9038: operation switch; 9100: television set; 9101: housing; 9103: display portion; 9105: stand; 9107: display portion; 9109: operation key; 9110: remote controller; 9200: computer; 9201: main body; 9202: housing; 9203: display portion; 9204: keyboard; 9205: external connection port; 9206: pointing device; 9630: housing; 9631: display portion; 9631a: display portion; 9631b: display portion; 9632a: region; 9632b: region; 9633: solar cell; 9634: charge and discharge control circuit; 9635: battery; 9636: DCDC converter; 9637: converter; 9638: operation key; 9639: button.

This application is based on Japanese Patent Application serial no. 2012-202125 filed with Japan Patent Office on Sep. 13, 2012 and Japanese Patent Application serial no. 2013-053988 filed with Japan Patent Office on Mar. 15, 2013, the entire contents of which are hereby incorporated by reference.

The invention claimed is:

1. A semiconductor device comprising:
   a substrate;
   a first insulating film over the substrate;
   a metal oxide film over the first insulating film;
   a second insulating film over the first insulating film and the metal oxide film, the second insulating film comprising a first oxide insulating film and a first nitride insulating film stacked on the first oxide insulating film;
   a light-transmitting electrode over the second insulating film;
   a transistor comprising:
      a gate electrode;
      a portion of the first insulating film over the gate electrode; and
      a first portion of the metal oxide film overlapping the gate electrode and defining a metal oxide semiconductor film as a channel formation region;
   a capacitor comprising:
      a second portion of the metal oxide film defining a light-transmitting conductive film as a first capacitor electrode;
      a part of the second insulating film as a capacitor dielectric film over the light-transmitting conductive film; and
      the light-transmitting electrode as a second capacitor electrode over the part of the second insulating film,
   wherein the first oxide insulating film is on and in contact with the first portion of the metal oxide film,
   wherein the first nitride insulating film is on and in contact with the second portion of the metal oxide film, and
   wherein the second portion of the metal oxide film contains a dopant in a higher concentration than the first portion of the metal oxide film.

2. The semiconductor device according to claim 1, wherein the first insulating film comprises a second nitride insulating film in contact with the second portion of the metal oxide film.

3. The semiconductor device according to claim 1,
   wherein the first insulating film comprises a second nitride insulating film and a second oxide insulating film stacked on the second nitride insulating film,
   wherein the second nitride insulating film is in contact with the second portion of the metal oxide film, and
   wherein the second oxide insulating film is in contact with the first portion of the metal oxide film.

4. The semiconductor device according to claim 1, wherein the second portion of the metal oxide film contains a higher concentration of hydrogen than the first portion of the metal oxide film.

5. The semiconductor device according to claim 1, wherein the second portion of the metal oxide film contains a higher concentration of nitrogen than the first portion of the metal oxide film.

6. The semiconductor device according to claim 1, wherein the second portion of the metal oxide film contains the dopant at a concentration greater than $1 \times 10^{19}$ atoms/cm$^3$ and less than or equal to $1 \times 10^{22}$ atoms/cm$^3$.

7. The semiconductor device according to claim 1, further comprising a capacitor line, wherein the second portion of the metal oxide film is in direct contact with the capacitor line.

8. The semiconductor device according to claim 1,
   wherein the first portion of the metal oxide film is electrically connected to the light-transmitting electrode,
   wherein the light-transmitting electrode is a pixel electrode.

9. A display device comprising the semiconductor device according to claim 1.

10. An electronic device comprising the semiconductor device according to claim 1.

11. The semiconductor device according to claim 1, wherein the first portion of the metal oxide film and the second portion of the metal oxide film are separated from each other.

12. A semiconductor device comprising:
a substrate;
a first insulating film over the substrate;
a metal oxide film over the first insulating film;
a second insulating film over the first insulating film and the metal oxide film;
a light-transmitting electrode over the second insulating film;
a transistor comprising:
a gate electrode;
a portion of the first insulating film over the gate electrode; and
a first portion of the metal oxide film overlapping the gate electrode and defining a metal oxide semiconductor film as a channel formation region;
a capacitor comprising:
a second portion of the metal oxide film defining a light-transmitting conductive film as a first capacitor electrode;
a part of the second insulating film as a capacitor dielectric film over the light-transmitting conductive film; and
the light-transmitting electrode as a second capacitor electrode over the part of the second insulating film, and
wherein the second portion of the metal oxide film contains a dopant in a higher concentration than the first portion of the metal oxide film.

13. The semiconductor device according to claim 12, wherein the first insulating film comprises a nitride insulating film in contact with the second portion of the metal oxide film.

14. The semiconductor device according to claim 12,
wherein the first insulating film comprises a nitride insulating film and an oxide insulating film stacked on the nitride insulating film,
wherein the nitride insulating film is in contact with the second portion of the metal oxide film, and
wherein the oxide insulating film is in contact with the first portion of the metal oxide film.

15. The semiconductor device according to claim 12, wherein the second portion of the metal oxide film contains a higher concentration of hydrogen than the first portion of the metal oxide film.

16. The semiconductor device according to claim 12, wherein the second portion of the metal oxide film contains a higher concentration of nitrogen than the first portion of the metal oxide film.

17. The semiconductor device according to claim 12, wherein the second portion of the metal oxide film contains the dopant at a concentration greater than $1 \times 10^{19}$ atoms/cm$^3$ and less than or equal to $1 \times 10^{22}$ atoms/cm$^3$.

18. The semiconductor device according to claim 12, further comprising a capacitor line, wherein the second portion of the metal oxide film is in direct contact with the capacitor line.

19. The semiconductor device according to claim 12,
wherein the first portion of the metal oxide film is electrically connected to the light-transmitting electrode,
wherein the light-transmitting electrode is a pixel electrode.

20. A display device comprising the semiconductor device according to claim 12.

21. An electronic device comprising the semiconductor device according to claim 12.

22. The semiconductor device according to claim 12, wherein the first portion of the metal oxide film and the second portion of the metal oxide film are separated from each other.

23. A semiconductor device comprising:
a substrate;
a first insulating film over the substrate;
a second insulating film over the first insulating film, the second insulating film comprising a first oxide insulating film and a first nitride insulating film stacked on the first oxide insulating film;
a light-transmitting electrode over the second insulating film;
a transistor comprising:
a gate electrode;
the first insulating film over the gate electrode; and
a metal oxide semiconductor film over the first insulating film and overlapping the gate electrode;
a capacitor comprising:
a light-transmitting conductive film as a first capacitor electrode over the first insulating film;
a part of the second insulating film as a capacitor dielectric film over the light-transmitting conductive film; and
the light-transmitting electrode as a second capacitor electrode over the part of the second insulating film,
wherein the metal oxide semiconductor film and the light-transmitting conductive film are formed from a same film,
wherein the first oxide insulating film is on and in contact with the metal oxide semiconductor film,
wherein the first nitride insulating film is on and in contact with the light-transmitting conductive film and overlaps the metal oxide semiconductor film, and
wherein the light-transmitting conductive film contains a dopant in a higher concentration than the metal oxide semiconductor film.

24. The semiconductor device according to claim 23, wherein the metal oxide semiconductor film and the light-transmitting conductive film are separated from each other.

* * * * *

UNITED STATES PATENT AND TRADEMARK OFFICE
CERTIFICATE OF CORRECTION

PATENT NO. : 9,455,280 B2  
APPLICATION NO. : 14/023295  
DATED : September 27, 2016  
INVENTOR(S) : Shunpei Yamazaki et al.

Page 1 of 2

It is certified that error appears in the above-identified patent and that said Letters Patent is hereby corrected as shown below:

In the Specification

Column 28, Line 37, replace "4072" with --407_2--;

Column 28, Line 40, replace "4072" with --407_2--;

Column 28, Line 43, replace "4052" with --405_2--;

Column 28, Line 45, replace "4012" with --401_2--;

Column 29, Line 6, replace "4012" with --401_2--;

Column 29, Line 6, replace "4032" with --403_2--;

Column 29, Line 7, replace "4032" with --403_2--;

Column 29, Line 8, replace "4052" with --405_2--;

Column 29, Line 9, replace "4032" with --403_2--;

Column 29, Line 11, replace "4032" with --403_2--;

Column 29, Line 11, replace "4112" with --411_2--;

Column 29, Line 15, replace "4072" with --407_2--;

Column 29, Line 16, replace "4032" with --403_2--;

Column 29, Line 19, replace "4032" with --403_2--;

Signed and Sealed this  
Eleventh Day of April, 2017

Michelle K. Lee  
*Director of the United States Patent and Trademark Office*

CERTIFICATE OF CORRECTION (continued)
U.S. Pat. No. 9,455,280 B2

Column 29, Line 24, replace "4052" with --405_2--;

Column 29, Line 27, replace "4052" with --405_2--;

Column 29, Line 28, replace "4192" with --419_2--;

Column 29, Line 28, replace "4212" with --421_2--;

Column 29, Line 31, replace "4052" with --405_2--;

Column 29, Line 33, replace "4032" with --403_2--;

Column 29, Line 33, replace "4052" with --405_2--;

Column 37, Line 4, replace "2θ" with --2θ--;

Column 37, Line 13, replace "2θ" with --2θ--;

Column 40, Line 4, replace "y≥1," with --y > 1,--;

Column 47, Line 60, after "terminal" insert --.--;

Column 53, Line 30, replace "p.m." with --μm--;

Column 63, Line 30, replace "€" with --ε--;

Column 63, Line 34, replace "€" with --ε--;

Column 65, Line 11, replace "4032" with --403_2--; and

Column 65, Line 14, replace "4112" with --411_2--.